(12) United States Patent
Yamazaki et al.

(10) Patent No.: US 11,780,946 B2
(45) Date of Patent: Oct. 10, 2023

(54) ALTERNATING COPOLYMER, METHOD OF PRODUCING ALTERNATING COPOLYMER, METHOD OF PRODUCING POLYMERIC COMPOUND, AND METHOD OF FORMING RESIST PATTERN

(71) Applicant: TOKYO OHKA KOGYO CO., LTD., Kawasaki (JP)

(72) Inventors: Akiyoshi Yamazaki, Kawasaki (JP); Daisuke Kawana, Kawasaki (JP); Yoshitaka Komuro, Kawasaki (JP); Masatoshi Arai, Kawasaki (JP); Nobuhiro Michibayashi, Kawasaki (JP); Takatoshi Inari, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 377 days.

(21) Appl. No.: 17/152,131

(22) Filed: Jan. 19, 2021

(65) Prior Publication Data

US 2021/0230332 A1    Jul. 29, 2021

(30) Foreign Application Priority Data

Jan. 22, 2020 (JP) .................. 2020-008739
Jan. 22, 2020 (JP) .................. 2020-008755

(51) Int. Cl.
| | | |
|---|---|---|
| C08F 220/58 | (2006.01) |
| G03F 7/038 | (2006.01) |
| G03F 7/039 | (2006.01) |
| C08F 220/02 | (2006.01) |
| C08F 220/12 | (2006.01) |

(52) U.S. Cl.
CPC .......... *C08F 220/58* (2013.01); *C08F 220/12* (2013.01); *G03F 7/038* (2013.01); *G03F 7/039* (2013.01)

(58) Field of Classification Search
None
See application file for complete search history.

(56) References Cited

U.S. PATENT DOCUMENTS

2008/0057436 A1\*  3/2008  Kim .................. C08G 61/02
                                              430/327
2012/0258402 A1   10/2012  Sato et al.
2018/0022916 A1\*  1/2018  Komuro ............... C08L 67/07
                                              528/354

FOREIGN PATENT DOCUMENTS

JP   2009-114381 A    5/2009
JP   2012-220800 A   11/2012

\* cited by examiner

*Primary Examiner* — Mark F. Huff
*Assistant Examiner* — Nicholas E Brown
(74) *Attorney, Agent, or Firm* — Knobbe, Martens, Olson & Bear, LLP

(57) ABSTRACT

An alternating copolymer including a structural unit (a0-1) represented by general formula (a0-1) and a structural unit (a0-2) represented by general formula (a0-2) in which $Rp^{01}$ represents a hydrogen atom or the like; $Vp^{01}$ represents a single bond or a divalent linking group; $Rp^{02}$ and $Rp^{03}$ each independently represents a hydrocarbon group which may have a substituent, or $Rp^{02}$ and $Rp^{03}$ are mutually bonded to form a ring; $Rp^{04}$ represents a hydrogen atom, a C1-C5 alkyl group or a C1-C5 halogenated alkyl group; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4

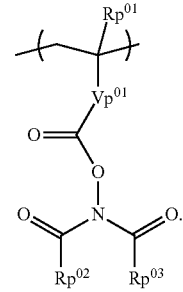

(a0-1)

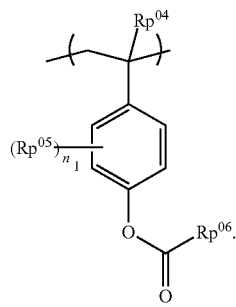

(a0-2)

10 Claims, No Drawings

ALTERNATING COPOLYMER, METHOD OF PRODUCING ALTERNATING COPOLYMER, METHOD OF PRODUCING POLYMERIC COMPOUND, AND METHOD OF FORMING RESIST PATTERN

BACKGROUND OF THE INVENTION

Technical Field

The present invention relates to an alternating copolymer, a method of producing an alternating copolymer, a method of producing a polymeric compound, and a method of forming a resist pattern.

Priority is claimed on Japanese Patent Application Nos. 2020-008739 and 2020-008755, filed Jan. 22, 2020, the contents of which are incorporated herein by reference.

Description of Related Art

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions of the resist film become insoluble in a developing solution is called a negative-type.

In recent years, in the production of semiconductor elements and liquid crystal display elements, advances in lithography techniques have led to rapid progress in the field of pattern miniaturization. Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are used in mass production. Furthermore, research is also being conducted into lithography techniques that use an exposure light source having a wavelength shorter (energy higher) than these excimer lasers, such as electron beam (EB), extreme ultraviolet radiation (EUV), and X ray.

Resist materials for use with these types of exposure light sources require lithographic properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in a developing solution under the action of acid and an acid-generator component that generates acid upon exposure.

For example, in the case where the developing solution is an alkali developing solution (alkali developing process), a chemically amplified positive resist which contains, as a base component (base resin), a resin which exhibits increased solubility in an alkali developing solution under action of acid, and an acid generator is typically used. If a resist film formed using such a resist composition is selectively exposed at the time of forming a resist pattern, in exposed areas, acid is generated from the acid generator component, and the polarity of the base resin increases by the action of the generated acid, thereby making the exposed areas of the resist film soluble in the alkali developing solution. Thus, by conducting alkali developing, the unexposed portions of the resist film remain to form a positive resist pattern.

On the other hand, when such a base resin is applied to a solvent developing process using a developing solution containing an organic solvent (organic developing solution), the solubility of the exposed portions in an organic developing solution is decreased. As a result, the unexposed portions of the resist film are dissolved and removed by the organic developing solution, and a negative resist pattern in which the exposed portions of the resist film are remaining is formed. Such a solvent developing process for forming a negative-tone resist composition is sometimes referred to as "negative-tone developing process".

In general, the base resin used for a chemically amplified resist composition contains a plurality of structural units for improving lithographic properties and the like.

For example, in the case of a resin composition which exhibits increased solubility in an alkali developing solution by the action of acid, a structural unit containing an acid decomposable group which is decomposed by the action of acid generated from an acid generator component and exhibits increased polarity. Further, a structural unit containing a lactone-containing cyclic group or a structural unit containing a polar group such as a hydroxy group is used in combination.

As the acid-generator component used in a chemically amplified resist composition, various kinds have been proposed. For example, onium salt acid generators such as iodonium salts and sulfonium salts; oxime sulfonate acid generators; diazomethane acid generators; nitrobenzylsulfonate acid generators; iminosulfonate acid generators; and disulfone acid generators are known.

As onium salt acid generators, those which have an onium ion such as triphenylsulfonium in the cation moiety are mainly used. Generally, as the anion moiety for onium salt acid generators, an alkylsulfonate ion or a fluorinated alkylsulfonate ion in which part or all of the hydrogen atoms within the aforementioned alkylsulfonate ion has been substituted with fluorine atoms is typically used.

In the formation of a resist pattern, the behavior of acid generated from the acid-generator component upon exposure is one of the factors which has large influence on the lithography properties.

In particular, when exposing EUV (extreme ultraviolet) or EB (electron beam), acid diffusion controllability becomes a problem in the resist material. Conventionally, various methods for changing the design of polymer compounds have been proposed in order to control acid diffusion.

For example, there has been disclosed a resist composition in which a polymeric compound having a specific acid dissociable, functional group has been used to enhance the reactivity to acid, and improve solubility in a developing solution (see, for example, Patent Literatures 1 and 2).

DOCUMENTS OF RELATED ART

Patent Literature

[Patent Literature 1] Japanese Unexamined Patent Application, First Publication No. 2009-114381
[Patent Document 2] Japanese Unexamined Patent Application, First Publication No. 2012-220800

SUMMARY OF THE INVENTION

As the lithography technique further progresses and the miniaturization of the resist pattern progresses more and more, for example, a target of the lithography performed by electron beams or EUV is to form fine resist patterns of several tens of nanometers. As miniaturization of pattern progress, improvement will be demanded for resist composition with respect to high sensitivity to exposure source and lithography properties such as reduced roughness.

However, in a conventional resist composition, when it is attempted to improve sensitivity to an exposure source such as EUV, it becomes difficult to obtain a resist pattern having a desired shape. Therefore, it was difficult to satisfy both the sensitivity and the pattern shape.

The present invention takes the above circumstances into consideration, with an object of providing an alternating copolymer useful for producing a polymeric compound applicable as a base material component of a resist composition, and a method of forming a resist pattern exhibiting good lithography properties.

In the formation of a resist pattern, particularly when an EUV or EB is exposed to a resist film, a polymeric compound having a structural unit containing a hydroxystyrene skeleton and a structural unit containing an acid decomposable group whose polarity is increased by decomposition by the action of an acid is effective.

However, according to the studies of the present inventors, they have found that, when a resist composition containing a polymeric compound obtained by alternately copolymerizing monomers using a conventional polymerization method is used in the formation of a resist pattern using EUV or EB as an exposure light source, lithography properties are likely to be adversely affected.

In contrast, the present inventors have found that, when a structural unit whose hydroxystyrene skeleton is protected with a protecting group that can be deprotected with an acid component and a structural unit having a specific imide structure are copolymerized, followed by hydrolyzing the structural units to obtain a polymeric compound, lithography properties may be improved by using the obtained polymeric compound. The present invention has been completed based on these findings.

Specifically, a first aspect of the present invention is an alternating copolymer including a structural unit (a0-1) represented by general formula (a0-1) shown below and a structural unit (a0-2) represented by general formula (a0-2) shown below.

[Chemical Formula 1]

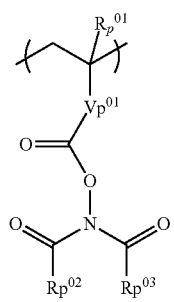

(a0-1)

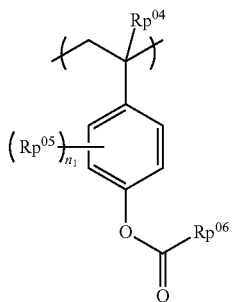

(a0-2)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4.

A second aspect of the present invention is a method of producing an alternating copolymer, including: copolymerizing a compound represented by general formula (m0-1) shown below with a compound represented by general formula (m0-2) shown below by living radical polymerization to obtain an alternating copolymer represented by general formula (p0) shown below.

[Chemical Formula 2]

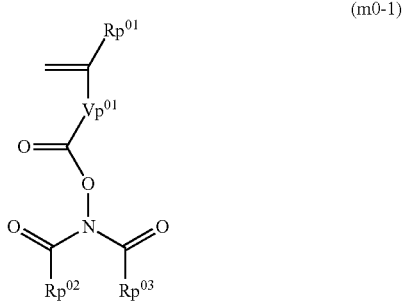

(m0-1)

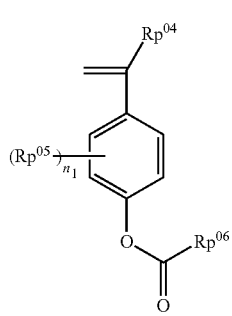

(m0-2)

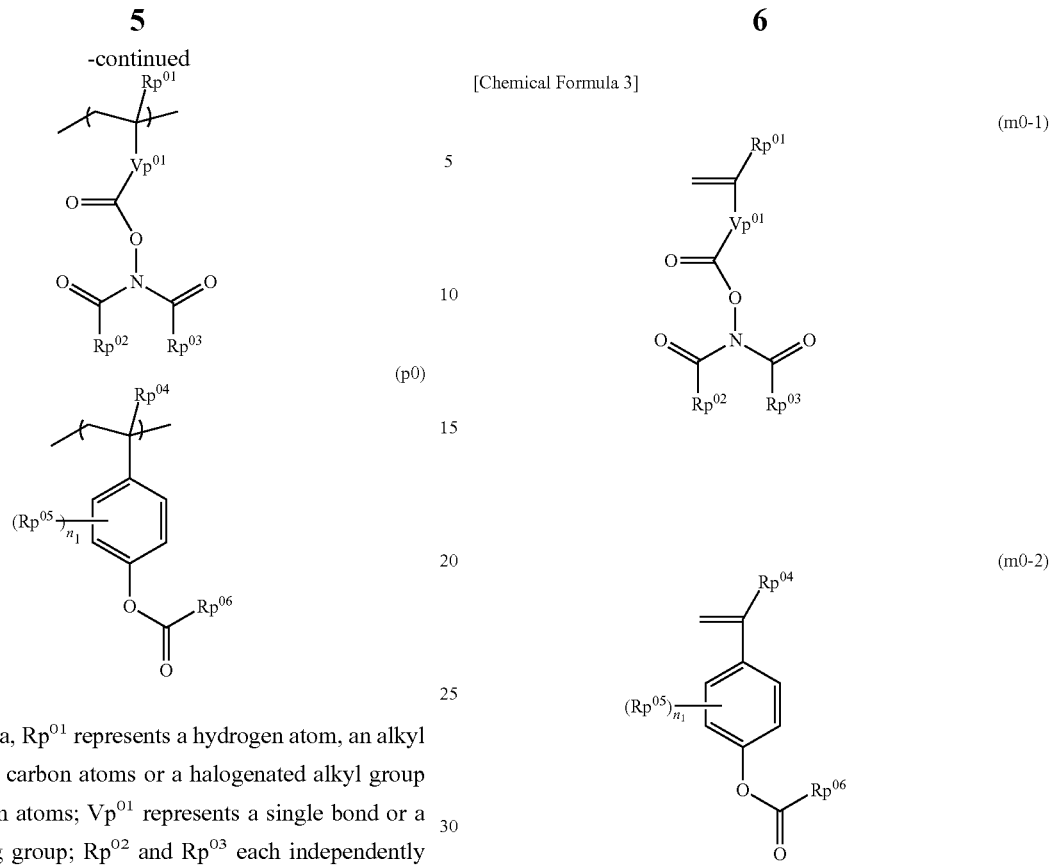

(p0)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4.

A third aspect of the present invention is a method of producing a polymeric compound, including: copolymerizing a compound represented by general formula (m0-1) shown below with a compound represented by general formula (m0-2) shown below by living radical polymerization to obtain an alternating copolymer represented by general formula (p0) shown below; subjecting the alternating copolymer to hydrolysis to obtain a first polymeric compound precursor represented by general formula (Pre-1a) shown below; reacting the first polymeric compound precursor with a compound represented by general formula (Add-1) shown below to obtain a second polymeric compound precursor represented by general formula (Pre-1b-1) shown below; and subjecting the second polymeric compound precursor to hydrolysis to obtain a polymeric compound represented by general formula (p1) shown below.

[Chemical Formula 3]

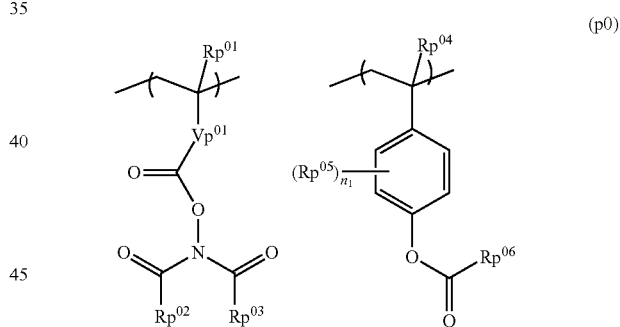

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4.

[Chemical Formula 4]

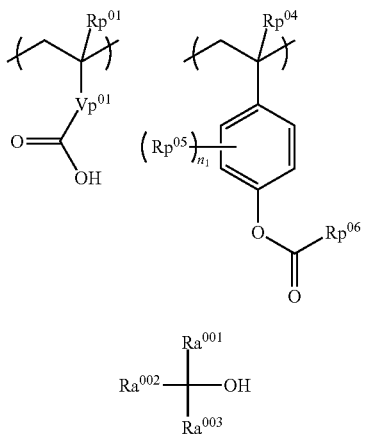

(Pre-1a)

(Add-1)

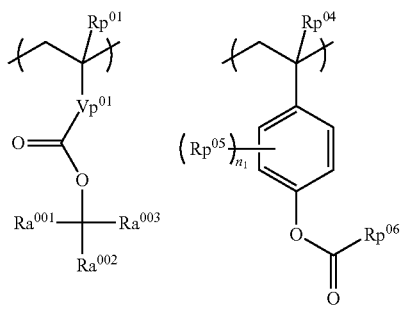

(Pre-1b-1)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; $n_1$ represents an integer of 0 to 4; $Ra^{001}$, $Ra^{002}$ and $Ra^{003}$ each independently represents a hydrocarbon group which may have a substituent; $Ra^{002}$ and $Ra^{003}$ may be mutually bonded to form a ring.

[Chemical Formula 5]

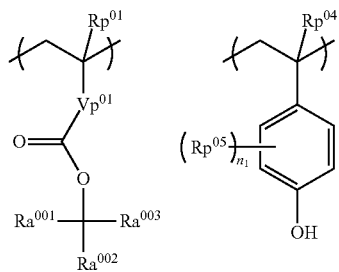

(p1)

In the formula, $Rp^{01}$ and $Rp^{04}$ each independently represents a hydrogen atom, an alkyl group of 1 to 5 carbon atoms or a halogenated alkyl group of 1 to 5 carbon atoms; $Vp^{01}$ represents a single bond or a divalent linking group; $Ra^{001}$, $Ra^{002}$ and $Ra^{003}$ each independently represents a hydrocarbon group which may have a substituent; $Ra^{002}$ and $Ra^{003}$ may be mutually bonded to form a ring; $Rp^{05}$ represents an alkyl group, an alkoxy group, a halogen atom, a halogenated alkyl group, a cyano group or a hydroxy group; and m represents an integer of 0 to 4.

A fourth aspect of the present invention is a method of producing a polymeric compound, including: copolymerizing a compound represented by general formula (m0-1) shown below with a compound represented by general formula (m0-2) shown below by living radical polymerization to obtain an alternating copolymer represented by general formula (p0) shown below; subjecting the alternating copolymer to hydrolysis to obtain a polymeric compound precursor represented by general formula (Pre-2a) shown below; and reacting the polymeric compound precursor with a compound represented by general formula (Add-1) shown below to obtain a polymeric compound represented by general formula (p1) shown below.

[Chemical Formula 6]

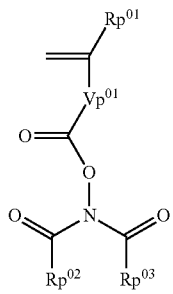

(m0-1)

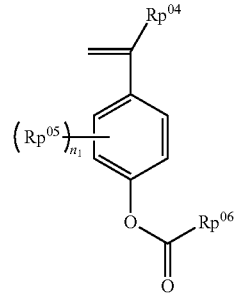

(m0-2)

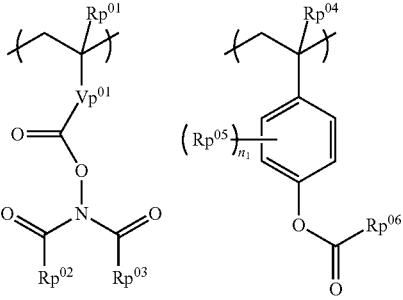

(p0)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring;

$Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4.

[Chemical Formula 7]

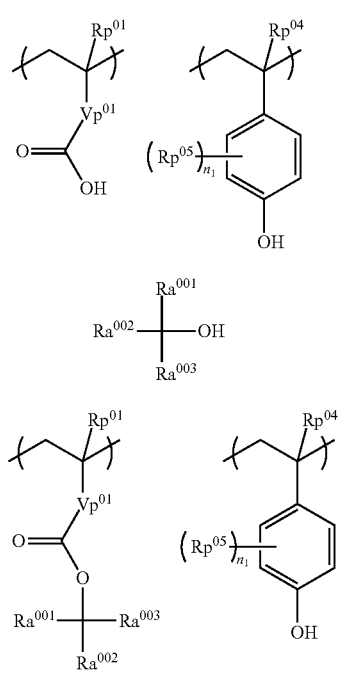

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; m represents an integer of 0 to 4; $Ra^{001}$, $Ra^{002}$ and $Ra^{003}$ each independently represents a hydrocarbon group which may have a substituent; $Ra^{002}$ and $Ra^{003}$ may be mutually bonded to form a ring.

A fifth aspect of the present invention is a method of producing a polymeric compound, including: copolymerizing a compound represented by general formula (m0-1) shown below with a compound represented by general formula (m0-2) shown below by living radical polymerization to obtain an alternating copolymer represented by general formula (p0) shown below; subjecting the alternating copolymer to hydrolysis to obtain a first polymeric compound precursor represented by general formula (Pre-1a) shown below; reacting the first polymeric compound with a compound represented by general formula (Add-2) shown below to obtain a second polymeric compound precursor represented by general formula (Pre-1b-2) shown below; and subjecting the second polymeric compound precursor to hydrolysis to obtain a polymeric compound represented by general formula (p2) shown below.

[Chemical Formula 8]

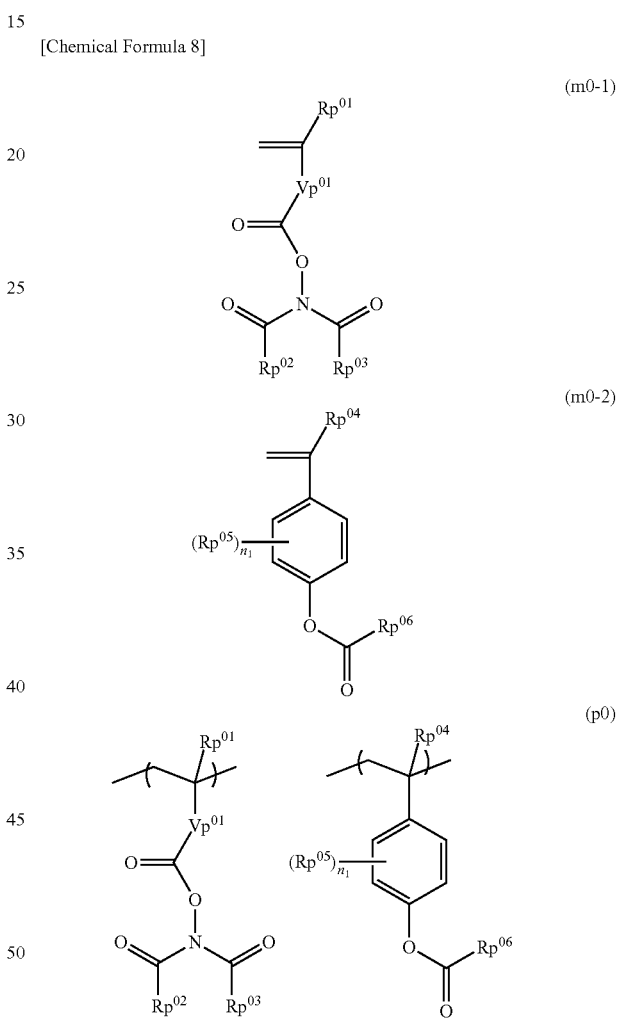

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4.

[Chemical Formula 9]

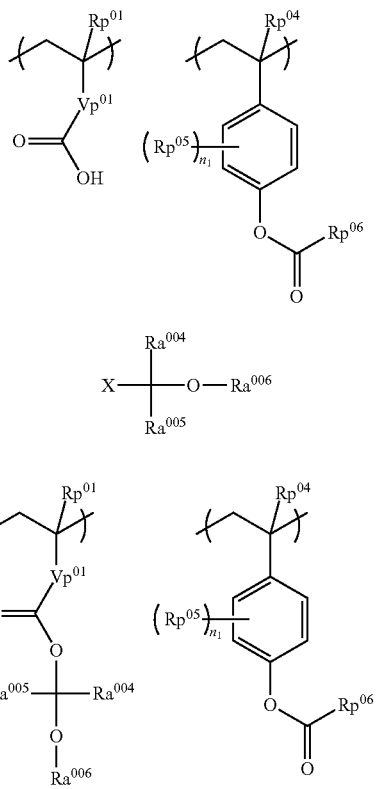

(Pre-1a)

(Add-2)

(Pre-1b-2)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; m represents an integer of 0 to 4; $Ra^{004}$ and $Ra^{005}$ each independently represents a hydrogen atom or an alkyl group; $Ra^{006}$ represents a hydrocarbon group, provided that $Ra^{006}$ may be bonded to $Ra^{004}$ or $Ra^{005}$ to form a ring; and X represents a halogen atom.

[Chemical Formula 10]

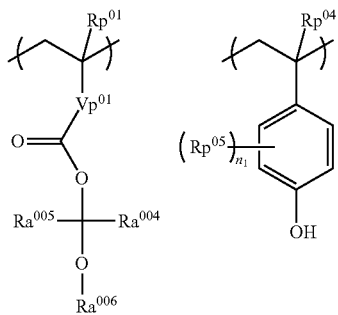

(p2)

In the formula, $Rp^{01}$ and $Rp^{04}$ each independently represents a hydrogen atom, an alkyl group of 1 to 5 carbon atoms or a halogenated alkyl group of 1 to 5 carbon atoms; $Vp^{01}$ represents a single bond or a divalent linking group; $Ra^{004}$ and $Ra^{005}$ each independently represents a hydrogen atom or an alkyl group; $Ra^{006}$ represents a hydrocarbon group, provided that $Ra^{006}$ may be bonded to $Ra^{004}$ or $Ra^{005}$ to form a ring; $Rp^{05}$ represents an alkyl group, an alkoxy group, a halogen atom, a halogenated alkyl group, a cyano group or a hydroxy group; and m represents an integer of 0 to 4.

A sixth aspect of the present invention is a method of producing a polymeric compound, including: copolymerizing a compound represented by general formula (m0-1) shown below with a compound represented by general formula (m0-2) shown below by living radical polymerization to obtain an alternating copolymer represented by general formula (p0) shown below; subjecting the alternating copolymer to hydrolysis to obtain a polymeric compound precursor represented by general formula (Pre-2a) shown below; and reacting the polymeric compound precursor with a compound represented by general formula (Add-2) shown below to obtain a polymeric compound represented by general formula (p2) shown below.

[Chemical Formula 11]

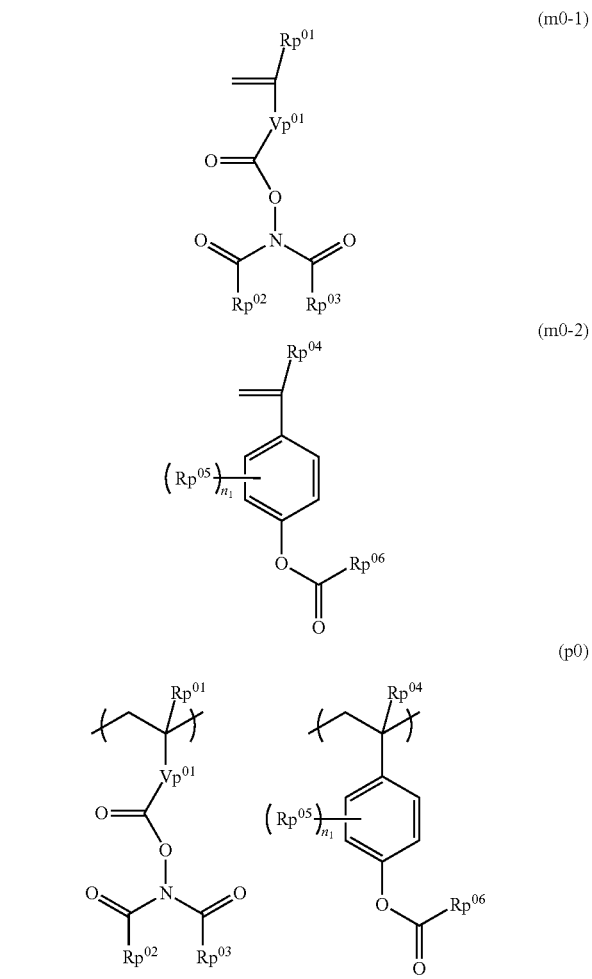

(m0-1)

(m0-2)

(p0)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4.

[Chemical Formula 12]

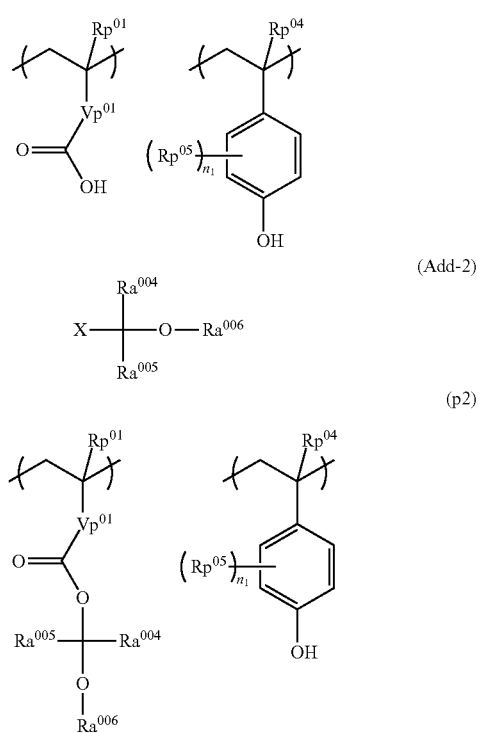

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; m represents an integer of 0 to 4; $Ra^{004}$ and $Ra^{005}$ each independently represents a hydrogen atom or an alkyl group; $Ra^{006}$ represents a hydrocarbon group, provided that $Ra^{006}$ may be bonded to $Ra^{004}$ or $Ra^{005}$ to form a ring; and X represents a halogen atom.

A seventh aspect of the present invention is a method of forming a resist pattern, including: obtaining a polymeric compound (A01) represented by the aforementioned general formula (p1) by the method of producing a polymeric compound according to the third aspect; mixing the polymeric compound (A01) with an organic solvent to prepare a resist composition; forming a resist film on a substrate using the resist composition; exposing the resist film; and developing the exposed resist film to form a resist pattern.

An eighth aspect of the present invention is a method of forming a resist pattern, including: obtaining a polymeric compound (A01) represented by the aforementioned general formula (p1) by the method of producing a polymeric compound according to the fourth aspect; mixing the polymeric compound (A01) with an organic solvent to prepare a resist composition; forming a resist film on a substrate using the resist composition; exposing the resist film; and developing the exposed resist film to form a resist pattern.

A ninth aspect of the present invention is a method of forming a resist pattern, including: obtaining a polymeric compound (A02) represented by the aforementioned general formula (p2) by the method of producing a polymeric compound according to the fifth aspect; mixing the polymeric compound (A02) with an organic solvent to prepare a resist composition; forming a resist film on a substrate using the resist composition; exposing the resist film; and developing the exposed resist film to form a resist pattern.

A tenth aspect of the present invention is a method of forming a resist pattern, including: obtaining a polymeric compound (A02) represented by the aforementioned general formula (p2) by the method of producing a polymeric compound according to the sixth aspect; mixing the polymeric compound (A02) with an organic solvent to prepare a resist composition; forming a resist film on a substrate using the resist composition; exposing the resist film; and developing the exposed resist film to form a resist pattern.

According to the present invention, there is provided an alternating copolymer useful for producing a polymeric compound applicable as a base material component of a resist composition. Further, according to the present invention, there is provided a method of a method of forming a resist pattern exhibiting good lithography properties.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group within an alkoxy group.

The term "alkylene group" includes linear, branched or cyclic, divalent saturated hydrocarbon, unless otherwise specified.

Examples of the halogen atom include a fluorine atom, a chlorine atom, a bromine atom and an iodine atom. The term "structural unit" refers to a monomer unit that contributes to the formation of a polymeric compound (resin, polymer, copolymer).

The case of describing "may have a substituent" includes both of the case where the hydrogen atom (—H) is substituted with a monovalent group and the case where a methylene group (—$CH_2$—) is substituted with a divalent group.

The term "exposure" is used as a general concept that includes irradiation with any form of radiation.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—$SO_3H$).

More specifically, as an example of an acid decomposable group, a group in which the aforementioned polar group has been protected with an acid dissociable group (such as a group in which the hydrogen atom of the OH-containing polar group has been protected with an acid dissociable group) can be given.

The "acid dissociable group" refers to both (i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes, and the solubility in an alkali developing solution is relatively increased, whereas the solubility in an organic developing solution is relatively decreased.

The term "base component" refers to an organic compound capable of forming a film. The organic compound used as the base component is broadly classified into non-polymers and polymers. In general, as a non-polymer, any of those which have a molecular weight in the range of 500 to less than 4,000 is used. Hereafter, a "low molecular weight compound" refers to a non-polymer having a molecular weight in the range of 500 to less than 4,000. As a polymer, any of those which have a molecular weight of 1,000 or more is generally used. Hereafter, a "resin" or a "polymer" refers to a polymer having a molecular weight of 1,000 or more. As the molecular weight of the polymer, the weight average molecular weight in terms of the polystyrene equivalent value determined by gel permeation chromatography (GPC) is used.

The expression "structural unit derived from" refers to a structural unit which is formed by cleavage of a multiple bond between carbon atoms, e.g., an ethylenic double bond.

The acrylate ester may have the hydrogen atom bonded to the carbon atom on the α-position substituted with a substituent. The substituent ($R^{\alpha x}$) that substitutes the hydrogen atom bonded to the carbon atom on the α-position is an atom other than hydrogen or a group. Further, an acrylate ester having the hydrogen atom bonded to the carbon atom on the α-position substituted with a substituent ($R^{\alpha x}$) in which the substituent has been substituted with a substituent containing an ester bond (e.g., an itaconic acid diester), or an acrylic acid having the hydrogen atom bonded to the carbon atom on the α-position substituted with a substituent ($R^{\alpha x}$) in which the substituent has been substituted with a hydroxy alkyl group or a group in which the hydroxy group within a hydroxyalkyl group has been modified (e.g., α-hydroxyalkyl acrylate ester) may be mentioned as an acrylate ester having the hydrogen atom bonded to the carbon atom on the α-position substituted with a substituent. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester".

The term "derivative" is a concept including a compound in which a hydrogen atom at the α-position of the subject compound has been substituted with another substituent such as an alkyl group or a halogenated alkyl group, and derivatives thereof. Examples of the derivatives include a compound in which the hydrogen atom at the α-position of the subject compound may be substituted with a substituent, and the hydrogen atom of the hydroxy group of the target compound has been substituted with an organic group; and a compound in which the hydrogen atom at the α-position of the subject compound may be substituted with a substituent, and a substituent other than a hydroxy group has been bonded to the subject compound. The α-position refers to the first carbon atom adjacent to a functional group, unless otherwise specified.

As the substituent which substitutes the hydrogen atom on the α-position of hydroxystyrene, the same substituents as those described above for $R^{\alpha x}$ may be mentioned.

In the present specification and claims, some structures represented by chemical formulae may have an asymmetric carbon, such that an enantiomer or a diastereomer may be present. In such a case, the one formula represents all isomers. The isomers may be used individually, or in the form of a mixture.

(First Aspect: Alternating Copolymer)

Specifically, a first aspect of the embodiment is an alternating copolymer including a structural unit (a0-1) represented by the aforementioned general formula (a0-1) and a structural unit (a0-2) represented by the aforementioned general formula (a0-2).

<Structural Unit (a0-1)>

The structural unit (a0-1) is a structural unit represented by general formula (a0-1) shown below.

[Chemical Formula 13]

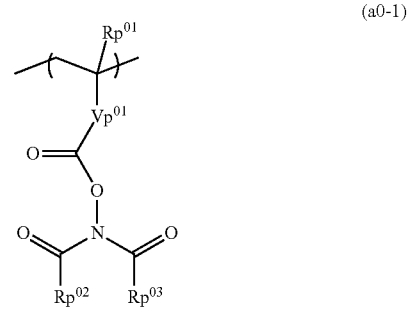

(a0-1)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring.

In formula (a0-1), $Rp^{01}$ represents a hydrogen atom, an alkyl group of 1 to 5 carbon atoms or a halogenated alkyl group of 1 to 5 carbon atoms.

The alkyl group of 1 to 5 carbon atoms for $Rp^{01}$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group.

The halogenated alkyl group of 1 to 5 carbon atoms represented by $Rp^{01}$ is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As $Rp^{01}$, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a0-1), $Vp^{01}$ represents a single bond or a divalent linking group.

As preferable examples of the divalent linking group for $Vp^{01}$, a divalent hydrocarbon group which may have a substituent, and a divalent linking group containing a hetero atom may be given.

Divalent Hydrocarbon Group which May have a Substituent:

In the case where $Vp^{01}$ is a divalent linking group which may have a substituent, the hydrocarbon group may be either an aliphatic hydrocarbon group or an aromatic hydrocarbon group.

Aliphatic Hydrocarbon Group for $Vp^{01}$

The "aliphatic hydrocarbon group" refers to a hydrocarbon group that has no aromaticity. The aliphatic hydrocarbon group may be saturated or unsaturated. In general, the aliphatic hydrocarbon group is preferably saturated. Examples of the aliphatic hydrocarbon group include a linear or branched aliphatic hydrocarbon group, and an aliphatic hydrocarbon group containing a ring in the structure thereof can be given.

Linear or Branched Aliphatic Hydrocarbon Group

The linear aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

The branched aliphatic hydrocarbon group preferably has 2 to 10 carbon atoms, more preferably 3 to 6, still more preferably 3 or 4, and most preferably 3.

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and a carbonyl group.

Aliphatic Hydrocarbon Group Containing a Ring in the Structure Thereof

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Aromatic Hydrocarbon Group for $Vp^{01}$

The aromatic hydrocarbon group is a hydrocarbon group having at least one aromatic ring.

The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Here, the number of carbon atoms within a substituent(s) is not included in the number of carbon atoms of the aromatic hydrocarbon group. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group). The alkylene group which is bonded to the aforementioned aryl group or heteroaryl group preferably has 1 to 4 carbon atoms, more preferably 1 or 2 carbon atoms, and most preferably 1 carbon atom.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

Divalent Linking Group Containing a Hetero Atom

In the case where $Vp^{01}$ is a divalent linking group containing a hetero atom, preferable examples of the linking group include —O—, —C(=O)—O—, —C(=O)—, —O—C(=O)—O—, —C(=O)—NH—, —NH—, —NH—C(=NH)— (H may be substituted with an alkyl group, an acyl group, or the like), —S—, —S(=O)$_2$—, —S(=O)$_2$—O—, and a group represented by general formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$— or —$Y^{21}$—S(=O)$_2$—O—$Y^{22}$— [in the formula, $Y^{21}$ and $Y^{22}$ each independently represents a divalent linking group which may have a substituent, O represents an oxygen atom, and m" represents an integer of 0 to 3].

In the case where the divalent linking group containing a hetero atom is —C(=O)—NH—, —C(=O)—NH—C(=O)—, —NH— or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In general formulae —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$— or —$Y^{21}$—S(=O)$_2$—O—$Y^{22}$—, $Y^{21}$ and $Y^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m''}$-$Y^{22}$—, m" represents an integer of 0 to 3, preferably an integer of 0 to 2, more preferably 0 or 1, and most preferably 1. Namely, it is particularly desirable that the group represented by the formula —[$Y^{21}$—C(=O)—O]$_{m''}$-$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In formula (a0-1), among the above examples, as $Vp^{01}$, a single bond, an ester bond [—C(=O)—O—], an ether bond (—O—), —C(=O)—NH—, a linear or branched alkylene group, or a combination thereof is preferable, and a single bond is more preferable.

In formula (a0-1), $Rp^{02}$ and $Rp^{03}$ each independently represents a hydrocarbon group which may have a substituent. The hydrocarbon group for $Rp^{02}$ and $Rp^{03}$ may be an aliphatic hydrocarbon group or an aromatic hydrocarbon group, and may be a cyclic hydrocarbon group or a chain hydrocarbon group.

Cyclic Group which May have a Substituent:

The cyclic group is preferably a cyclic hydrocarbon group, and the cyclic hydrocarbon group may be either an aromatic hydrocarbon group or an aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated. The cyclic hydrocarbon group for $Rp^{02}$ and $Rp^{03}$ may contain a hetero atom, such as a hetero ring.

The aromatic hydrocarbon group for $Rp^{02}$ and $Rp^{03}$ is a hydrocarbon group having an aromatic ring.

Examples of the aromatic ring contained in the aromatic hydrocarbon group represented by $Rp^{02}$ or $Rp^{03}$ include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group for $Rp^{02}$ and $Rp^{03}$ include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group).

Examples of the cyclic aliphatic hydrocarbon group for $Rp^{02}$ and $Rp^{03}$ include aliphatic hydrocarbon groups containing a ring in the structure thereof.

As examples of the hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given.

The alicyclic hydrocarbon group may be either a polycyclic group or a monocyclic group. Examples of the monocyclic alicyclic hydrocarbon group include a group in which one or more hydrogen atoms have been removed from a monocycloalkane. Specific examples of the monocycloalkane include cyclopentane and cyclohexane.

Examples of the polycyclic alicyclic hydrocarbon group include a group in which one or more hydrogen atoms have been removed from a polycycloalkane. Specific examples of the polycycloalkane include a poly cycloalkane having a bridged ring polycyclic skeleton, such as adamantane, norbornane, isobornane, tricyclodecane or tetracyclododecane, and a polycycloalkane having a condensed ring polycyclic skeleton, such as a cyclic group having a steroid skeleton.

Examples of the substituent for the cyclic group for $Rp^{02}$ and $Rp^{03}$ include an alkyl group, an alkoxy group, a halogen atom, a halogenated alkyl group, a hydroxy group, a nitro group and a carbonyl group.

Chain Alkyl Group which May have a Substituent:

The chain alkyl group for $Rp^{02}$ and $Rp^{03}$ may be linear or branched.

Specific examples of linear alkyl groups include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

Specific examples of the branched alkyl group include a 1-methylethyl group, a 1,1-dimethylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Chain Alkenyl Group which May have a Substituent:

The chain alkenyl group for $Rp^{02}$ and $Rp^{03}$ may be linear or branched.

Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

As the substituent for the chain alkyl group or chain alkenyl group for $Rp^{02}$ and $Rp^{03}$, an alkoxy group, a halogen atom (a fluorine atom, a chlorine atom, a bromine atom, an iodine atom or the like), a halogenated alkyl group, a hydroxyl group, a carbonyl group, a nitro group, an amino group, and the aforementioned cyclic groups.

In formula (a0-1), $Rp^{02}$ and $Rp^{03}$ may be mutually bonded to form a ring. That is, $Rp^{02}$ and $Rp^{03}$ may form a cyclic imide together with the imide bond in the formula. The cyclic imide may be monocyclic or polycyclic. In the case where the cyclic imide is polycyclic, the polycyclic group may have a bridged structure or a spiro ring.

Examples of the polycyclic imide structure include a condensed ring formed of a cyclic imide and an aromatic hydrocarbon group or a cyclic aliphatic hydrocarbon group; and a spiro ring formed of a cyclic imide and an aromatic hydrocarbon group or a cyclic aliphatic hydrocarbon group.

Specific examples of the cyclic imide include maleimide, succinimide, glutarimide, phthalimide, cyclohexa-3-ene-1, 2-dicarboxymid, cyclohexane-1,2-dicarboxymid, norbornane-1,2-dicarboxymid, 5-norbornane-2,3-dicarboxyimide, 5-norbomene-2,3-dicarboxyimide, and nadiimide.

The cyclic imide may have a substituent.

Examples of the substituent include a hydrocarbon group. The hydrocarbon group may be an aliphatic hydrocarbon group or an aromatic hydrocarbon group, and may be a cyclic hydrocarbon group or a chain hydrocarbon group.

In formula (a0-1), it is preferable that $Rp^{02}$ and $Rp^{03}$ are mutually bonded to form a ring.

In the case where $Rp^{02}$ and $Rp^{03}$ are mutually bonded to form a ring, preferable structures of the cyclic imide are shown below. * represents a bonding site at which the oxygen atom (—O—) of the carbonyloxy group (—O—C (=O)—) in formula (a0-1) is bonded.

[Chemical Formula 14]

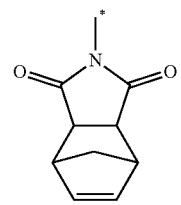

(r-a01-1)

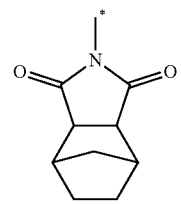

(r-a01-2)

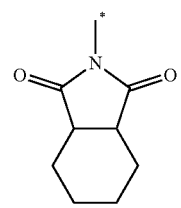

(r-a01-3)

-continued (r-a01-4)
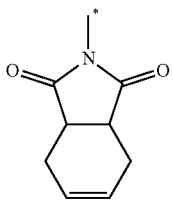

(r-a01-5)
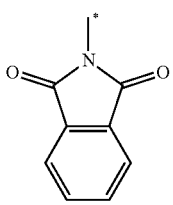

(r-a01-6)
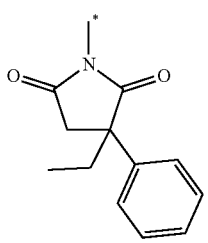

(r-a01-7)
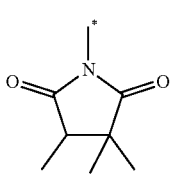

(r-a01-8)
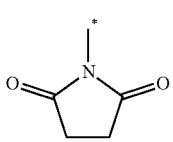

(r-a01-9)
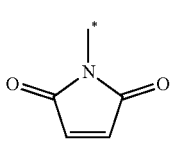

(r-a01-10)
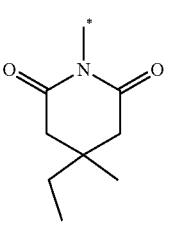

-continued (r-a01-11)
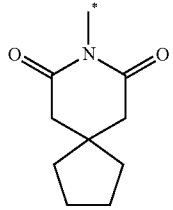

The structural unit (a0-1) is preferably a structural unit represented by general formula (a0-11) shown below.

[Chemical Formula 15]

(a0-11)
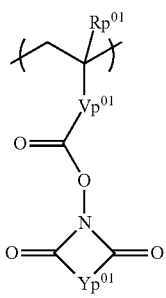

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; and $Yp^{01}$ represents an alkylene group, an alkenylene group or a divalent cyclic group.

In formula (a0-11), $Rp^{01}$ and $Vp^{01}$ are the same as defined above for formula (a0-1).

In formula (a0-11), $Yp^{01}$ represents an alkylene group, an alkenylene group or a divalent cyclic group.

Examples of the alkylene group for $Yp^{01}$ include a linear alkylene group of 1 to 8 carbon atoms which may have a substituent. Among the above examples, an ethylene group [—(CH$_2$)$_2$-] which may have a substituent or an n-propylene group [—(CH$_2$)$_3$-] which may have a substituent is preferable.

Examples of the substituent include a hydrocarbon group. The hydrocarbon group may be an aliphatic hydrocarbon group or an aromatic hydrocarbon group, and may be a cyclic hydrocarbon group or a chain hydrocarbon group. Among the above examples, specifically, a linear hydrocarbon group such as a methyl group or an ethyl group, or an aromatic hydrocarbon group such as a phenyl group is preferable.

Examples of the alkenylene group for $Yp^{01}$ include a linear alkenylene group of 2 to 6 carbon atoms which may have a substituent. Among the above examples, specifically, an ethenylene group is preferable.

The substituent is the same as defined for the substituents for the aforementioned alkylene group.

The divalent cyclic group for $Yp^{01}$ may be either a monocyclic group or a polycyclic group, and the polycyclic group may have a bridged structure. In the case where the divalent cyclic group for $Yp^{01}$ is monocyclic, it means that the compound has a monocyclic structure other than the cyclic imide in formula (a0-11). That is, in such a case, the cyclic imide has a polycyclic imide structure.

Examples of the polycyclic imide structure include a condensed ring formed of a cyclic imide and an aromatic hydrocarbon group or a cyclic aliphatic hydrocarbon group; and a spiro ring formed of a cyclic imide and an aromatic hydrocarbon group or a cyclic aliphatic hydrocarbon group.

The cyclic imide is preferably a 5-membered ring or a 6-membered ring.

The aromatic hydrocarbon group is a hydrocarbon group having at least one aromatic ring.

The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

The cyclic aliphatic hydrocarbon group may be either a polycyclic group or a monocyclic group.

As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane.

As the polycyclic aliphatic hydrocarbon group, a group in which 2 hydrogen atoms have been removed from a polycycloalkane is preferable. The polycycloalkane preferably has 7 to 12 carbon atoms, and specific examples thereof include adamantane, norbornane, norbornene, isobornane, tricyclodecane and tetracyclododecane.

In formula (a0-11), among the above examples, $Yp^{01}$ is preferably a divalent cyclic group, and more preferably a divalent cyclic aliphatic hydrocarbon group.

The structural unit (a0-1) is preferably a structural unit represented by general formula (a0-11a) or (a0-11b) shown below.

[Chemical Formula 16]

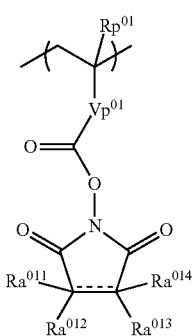

(a0-11a)

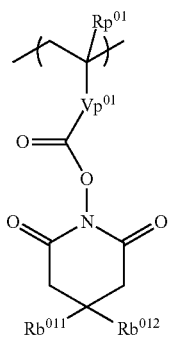

(a0-11b)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; the double line of the dashed line and the solid line indicates a single bond or a double bond; $Ra^{011}$ to $Ra^{014}$ each independently represents, where valence allows, a hydrogen atom or a hydrocarbon group which may have a substituent; $Ra^{011}$ or $Ra^{012}$ and $Ra^{013}$ or $Ra^{014}$ may be mutually bonded to form a ring; $Rb^{011}$ and $Rb^{012}$ each independently represents a hydrogen atom or a hydrocarbon group which may have a substituent; $Rb^{011}$ and $Rb^{012}$ may be mutually bonded to form a ring.

In formula (a0-11a) and formula (a0-11b), $Rp^{01}$ and $Vp^{01}$ are the same as defined above for formula (a0-1).

$Ra^{011}$ to $Ra^{014}$ in formula (a0-11a) and $Rb^{011}$ and $Rb^{012}$ in formula (a0-11b) each independently represents a hydrogen atom or a hydrocarbon group which may have a substituent. The hydrocarbon group which may have a substituent is the same as defined in formula (a0-1).

In the case where valence allows means that, when the double line of the dashed line and the solid line indicates a double bond, either one of $Ra^{011}$ and $Ra^{012}$, and either one of $Ra^{013}$ and $Ra^{014}$ do not exist.

$Ra^{011}$ or $Ra^{012}$ and $Ra^{013}$ or $Ra^{014}$ may be mutually bonded to form a ring. Examples of the ring include a condensed ring formed of a cyclic imide and an aromatic hydrocarbon group or a cyclic aliphatic hydrocarbon group.

The double line of the dashed line and the solid line indicates a single bond or a double bond. However, when the double line of the dashed line and the solid line indicates a double bond, either one of $Ra^{011}$ and $Ra^{012}$, and either one of $Ra^{013}$ and $Ra^{014}$ do not exist.

Among the above examples, it is preferable that either one of $Ra^{011}$ and $Ra^{012}$ and either one of $Ra^{013}$ and $Ra^{014}$ are mutually bonded to form a ring. Specifically, a condensed ring formed of a cyclic imide and a cyclic aliphatic hydrocarbon group is preferable, and a condensed ring formed of a cyclic imide and a bridged cyclic aliphatic hydrocarbon group is more preferable.

$Rb^{011}$ and $Rb^{012}$ may be mutually bonded to form a ring. Examples of the ring include a spiro ring formed of a cyclic imide and a cyclic aliphatic hydrocarbon group.

Specific examples of structural unit represented by formula (a0-1) are shown below. In the formulae shown below, $R^\alpha$ represents a hydrogen atom, a methyl group or a trifluoromethyl group.

[Chemical Formula 17]
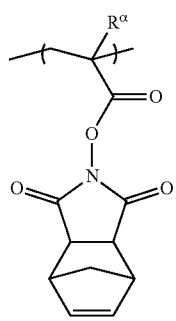 (a01-1-1)
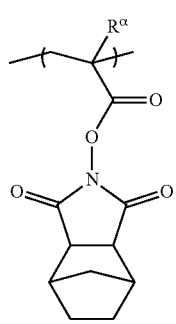 (a01-1-2)
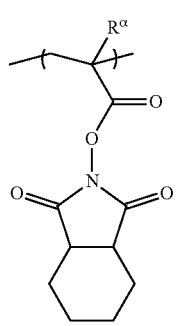 (a01-1-3)
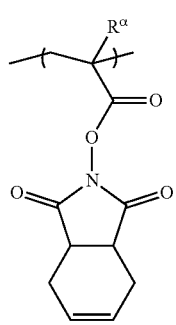 (a01-1-4)
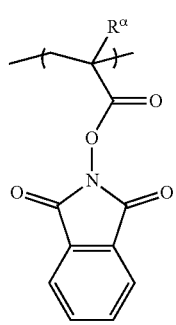 (a01-1-5)
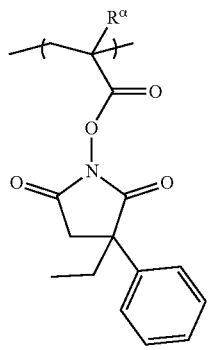 (a01-1-6)
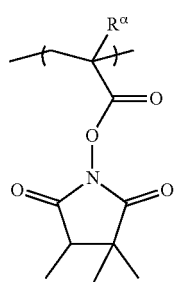 (a01-1-7)
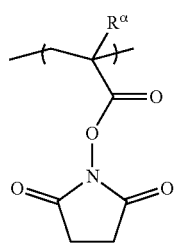 (a01-1-8)
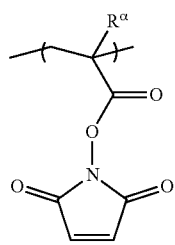 (a01-1-9)
[Chemical Formula 18]
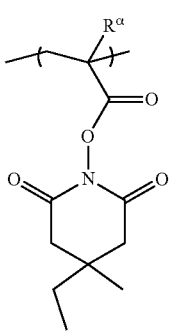 (a01-1-10)

-continued

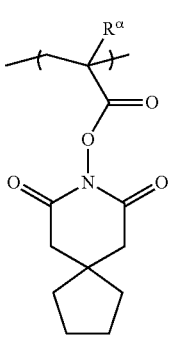

(a01-1-11)

Among the above examples, as the structural unit (a0-1), at least one member selected from the group consisting of structural units represented by any of chemical formulae (a01-1-1) to (a01-1-5) is preferable, and a structural unit represented by chemical formula (a01-1-1) is more preferable.

The alternating copolymer according to the present embodiment may include, as the structural unit (a0-1), 1 kind of structural unit, or 2 or more structural units.

In the alternating copolymer according to the present embodiment, the amount of the structural unit (a0-1) based on the combined total (100 mol %) of all structural units constituting the alternating copolymer is preferably 5 to 95 mol %, more preferably 10 to 90 mol %, and still more preferably 20 to 80 mol %.

<Structural Unit (a0-2)>

The structural unit (a0-2) is a structural unit represented by general formula (a0-2) shown below.

[Chemical Formula 19]

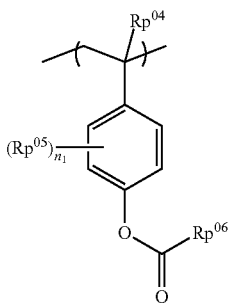

(a0-2)

$Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4.

In formula (a0-2), $Rp^{04}$ is the same as defined for $Rp^{01}$ in the aforementioned formula (a0-1).

In formula (a0-2), $Rp^{05}$ represents an alkyl group, an alkoxy group, a halogen atom, a halogenated alkyl group, a cyano group or a hydroxy group.

The alkyl group for $Rp^{05}$ is preferably an alkyl group having 1 to 5 carbon atoms, more preferably a methyl group, an ethyl group, a propyl group, an n-butyl group or a tert-butyl group, and still more preferably a methyl group.

The alkoxy group for $Rp^{05}$ is preferably an alkoxy group having 1 to 5 carbon atoms, more preferably a methoxy group, an ethoxy group, an n-propoxy group, an iso-propoxy group, an n-butoxy group or a tert-butoxy group, and still more preferably a methoxy group.

Examples of the halogen atom for $Rp^{05}$ include a fluorine atom, a chlorine atom, a bromine atom and an iodine atom, and a fluorine atom is preferable.

Examples of the halogenated alkyl group for $Rp^{05}$ include a group in which some or all hydrogen atoms in an alkyl group having 1 to 5 carbon atoms such as a methyl group, an ethyl group, a propyl group, an n-butyl group, or a tert-butyl group have been substituted with the aforementioned halogen atom(s).

In formula (a0-2), m represents an integer of 0 to 4, preferably an integer of 0 to 2.

In formula (a0-2), among the above examples, $Rp^{05}$ is preferably an alkyl group, an alkoxy group or a cyano group.

In formula (a0-2), $Rp^{06}$ represents a linear or branched aliphatic hydrocarbon group. The linear aliphatic hydrocarbon group preferably has 1 to 10 carbon atoms, more preferably 1 to 6 carbon atoms, and still more preferably 1 to 4 carbon atoms.

As the linear aliphatic hydrocarbon group, a linear alkylene group is preferable. Specific examples thereof include a methylene group [—$CH_2$—], an ethylene group [—$(CH_2)_2$—], trimethylene group [—$(CH_2)_3$—], and a tetramethylene group [—$(CH_2)_4$—].

The branched aliphatic hydrocarbon group preferably has 2 to 10 carbon atoms, more preferably 2 to 6 carbon atoms, and still more preferably 2 to 4 carbon atoms.

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, $C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—.

In formula (a0-2), among the above examples, $Rp^{06}$ is preferably a linear aliphatic hydrocarbon group, more preferably a methylene group, an ethylene group or a trimethylene group, and still more preferably a methylene group.

Specific examples of structural unit represented by formula (a0-2) are shown below.

[Chemical Formula 20]

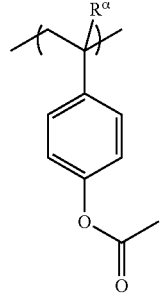

(a02-1-1)

(a02-1-2)
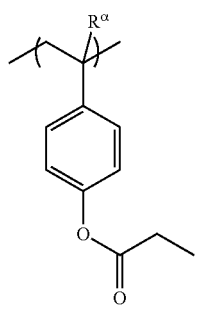

(a02-1-3)
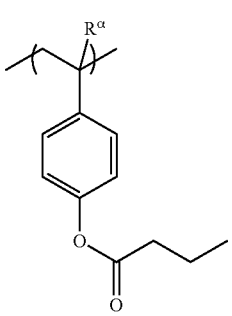

(a02-1-4)
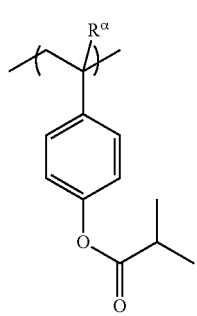

(a02-1-5)
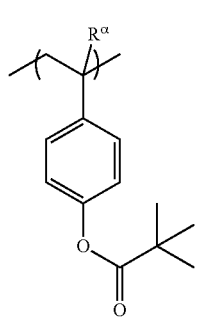

(a02-1-6)
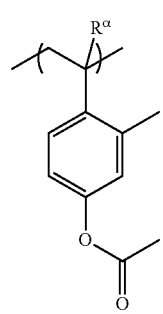

(a02-1-7)
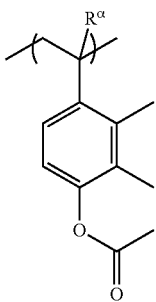

(a02-1-8)
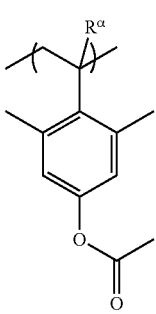

(a02-1-9)
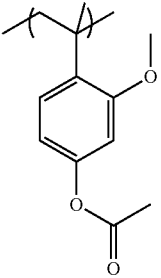

(a02-1-10)
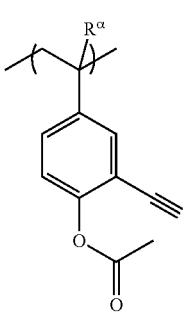

Among these, as the structural unit (a0-2), at least one member selected from the group consisting of structural units represented by chemical formulae (a02-1-1) to (a02-1-5) shown below is preferable, at least one member selected from the group consisting of structural units represented by general formulae (a02-1-1) to (a02-1-3) shown below is more preferable, and a structural unit represented by general formula (a02-1-1) is still more preferable.

The alternating copolymer according to the present embodiment may include, as the structural unit (a0-2), 1 kind of structural unit, or 2 or more structural units.

In the alternating copolymer according to the present embodiment, the amount of the structural unit (a0-2) based on the combined total (100 mol %) of all structural units constituting the alternating copolymer is preferably 5 to 95 mol %, more preferably 10 to 90 mol %, and still more preferably 20 to 80 mol %.

(Second Aspect: Method of Producing Alternating Copolymer)

A second aspect of the embodiment is a method of producing an alternating copolymer, including: copolymerizing a compound represented by general formula (m0-1) shown below with a compound represented by general formula (m0-2) shown below by living radical polymerization to obtain an alternating copolymer represented by general formula (p0) shown below.

[Chemical Formula 21]

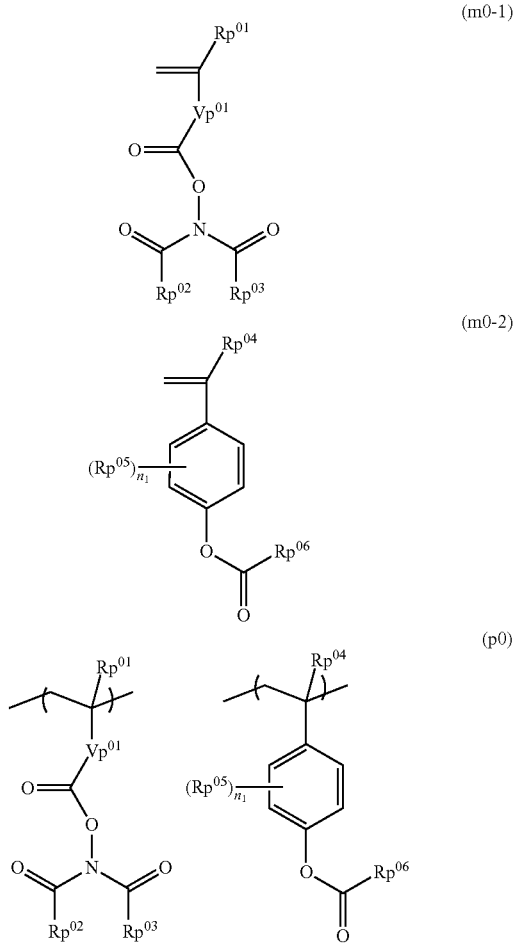

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4.

In formulae (m0-1), (m0-2) and (p0), $Rp^{01}$, $Vp^{01}$, $Rp^{02}$, $Rp^{03}$, $Rp^{04}$, $Rp^{05}$, $Rp^{06}$ and $n_1$ are the same as defined for the aforementioned formulae (a0-1) and (a0-2).

<Living Radical Polymerization>

Living radical polymerization is a polymerization reaction in which a termination reaction can be controlled to a certain extent by equilibrium between dormant species and radical growth species, and the molecular weight can be controlled by a reversible exchange reaction. When the exchange reaction is occurring at an extremely high rate as compared to the polymerization reaction, it is considered that a polymer having a narrow molecular weight distribution can be obtained.

Examples of living radical polymerization include a method using a chain transfer agent such as polysulfide, a method using a radical trapping agent such as a cobalt porphyrin complex or a nitroxide compound, and an atom transfer radical polymerization using an organic halogen compound as an initiator and using a transition metal complex as a catalyst. Among the above examples, an atom transfer radical polymerization is preferable.

Atom Transfer Radical Polymerization

As the organic halogen compound in the atom transfer radical polymerization, an α-halogenocarbonyl compound or an α-halogenocarboxylate may be used. Among the above examples, an α-halogenocarboxylate is preferable, and specific examples thereof include ethyl 2-bromo-2-methylpropionate, 2-hydroxyethyl 2-bromopropionate, dimethyl 2-chloro-2,4,4-trimethylglutarate and ethyl 2-chloro-2-phenylacetate. Among the above examples, ethyl 2-chloro-2-phenylacetate is preferable.

Preferable examples of the central metal(s) constituting the transition metal complex in the atomic transfer radical polymerization include elements of Group 7 to 11 of the Periodic Table (according to the periodic table described in "Chemical Handbook Basics I Revised 4th Edition" (1993) edited by the Chemical Society of Japan.) such as iron, copper, nickel, rhodium, ruthenium, and rhenium. Among the above examples, ruthenium and copper are more preferable.

Specific examples of the transition metal complex having ruthenium as the central metal include dichlorotris(triphenylphosphine)ruthenium, dichlorotris(tributylphosphine) ruthenium, dichloro(cyclooctadiene)ruthenium, dichlorobenzneruthenium, dichloro-p-cymeneruthenium, dichloro(norbomadiene)ruthenium, cis-dichlorobis(2,2'-bipyridine) ruthenium, dichlorotris(1,10-phenanthroline)ruthenium, carbonylchlorohydridotris(triphenylphosphine)ruthenium, chlorocyclopentadienylbis(triphenylphosphine)ruthenium, chloropentamethylcyclopentadienylbis(triphenylphosphine) ruthenium, and chloro(indenyl)bis(triphenylphosphine)ruthenium. Among the above examples, dichlorotris(triphenylphosphine)ruthenium, chloropentamethylcyclopentadienylbis(triphenylphosphine)ruthenium (RuCp* catalyst) or chloro(indenyl)bis(triphenylphosphine)ruthenium is preferable, and chloropentamethylcyclopentadienylbis(triphenylphosphine)ruthenium (RuCp* catalyst) is more preferable.

In the atom transfer radical polymerization, as a promoter, a Lewis acid or an amine may be used.

Examples of the Lewis acid include an aluminum trialkoxide, such as aluminum triisopropoxide or aluminum tri(t-butoxide); a bis(substituted aryloxy)alkylaluminum, such as bis(2,6-di-t-butylphenoxy)methylaluminum or bis (2,4,6-tri-t-butylphenoxy)methylaluminum; a tris(substituted aryloxy)aluminum, such as tris(2,6-diphenylphenoxy) aluminum; and a titanium tetraalkoxide, such as titanium tetraisopropoxide. Among the above examples, an aluminum trialkoxide is preferable, and aluminum triisopropoxide is more preferable.

Examples of the amine include an aliphatic primary amine, such as methylamine, ethylamine, propylamine, isopropylamine or butylamine; an aliphatic secondary amine, such as dimethylamine, diethylamine, dipropylamine, diisopropylamine or dibutylamine; an aliphatic tertiary amine, such as trimethylamine, triethylamine, tripropylamine, triisopropylamine or tributylamine; an aliphatic polyamine, such as N,N,N',N'-tetramethylethylenediamine, N,N,N',N'',N''-pentamethyldiethylenetriamine or 1,1,4,7,10,10-hexamethyltriethylenetetramine; an aromatic primary amine, such as aniline or toluidine; an aromatic secondary amine, such as diphenyl amine; and an aromatic tertiary amine, such as triphenylamine. Among the above examples, an aliphatic amine is preferable, and butylamine, dibutylamine or tributylamine is more preferable.

Examples of the solvent used in the atom transfer radical polymerization include esters, such as ethyl acetate, butyl acetate, ethyl lactate, propyleneglycol monomethylether, propyleneglycol monomethylether acetate, and cellosolve; alkyl lactones, such as γ-butyrolactone; ethers, such as tetrahydrofuran, dimethoxyethane, and diethoxyethane; alkyl ketones, such as 2-butanone (methyl ethyl ketone), 2-heptanone, and methyl isobutyl ketone; cycloalkyl ketones, such as cyclohexanone; alcohols, such as 2-propanol, propyleneglycol monomethylether, and isopropylalcohol; hydrocarbons, such as heptane, cyclohexane, cycloheptane, toluene and xylene; aprotic polar solvents, such as dimethylformamide (DMF), dimethylsulfoxide, dimethylacetamide, and hexamethylphosphoroamide; and nonpolar solvents, such as dichloromethane, dichloroethane, and chlororform.

As the solvent, 1 kind of compound may be used, or 2 or more kinds of compounds may be used in a mixture.

In the atom transfer radical polymerization, the reaction temperature is typically 40 to 150° C., preferably 50 to 130° C.

In the atom transfer radical polymerization, the reaction time is typically 1 to 96 hours, preferably 1 to 48 hours.

(Third Aspect: Production Method of Polymeric Compound (First Method))

The third aspect of the embodiment is a method of producing a polymeric compound, including:

(ia) a step of copolymerizing a compound represented by general formula (m0-1) shown below with a compound represented by general formula (m0-2) shown below by living radical polymerization to obtain an alternating copolymer represented by general formula (p0) shown below (hereafter, sometimes referred to as "step (ia)");

(iia) a step of subjecting the alternating copolymer to hydrolysis to obtain a first polymeric compound precursor represented by general formula (Pre-1a) shown below (hereafter, sometimes referred to as "step (iia)");

(iiia) a step of reacting the first polymeric compound precursor with a compound represented by general formula (Add-1) shown below to obtain a second polymeric compound precursor represented by general formula (Pre-1b-1) shown below (hereafter, sometimes referred to as "step (iiia)"); and (iva) a step of subjecting the second polymeric compound precursor to hydrolysis to obtain a polymeric compound represented by general formula (p1) shown below (hereafter, sometimes referred to as "step (iva)").

[Chemical Formula 22]

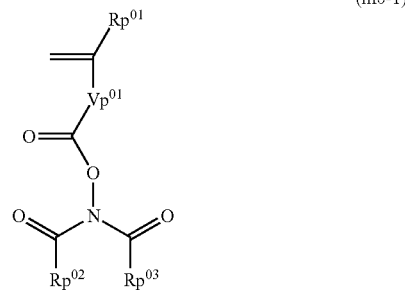

(m0-1)

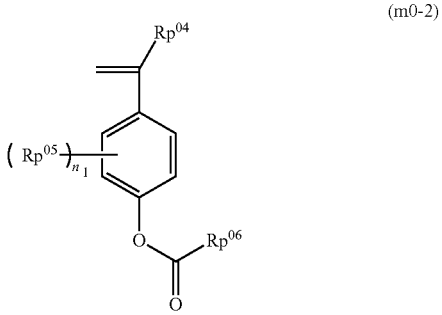

(m0-2)

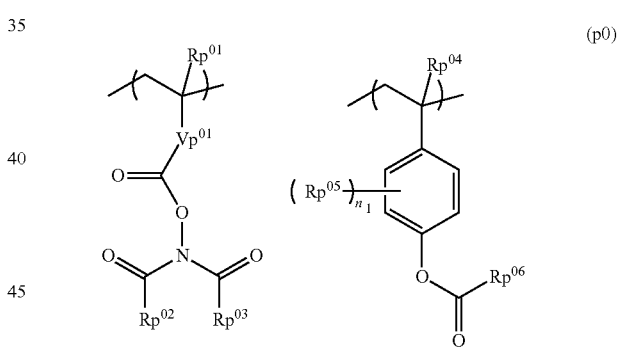

(p0)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4.

[Chemical Formula 23]

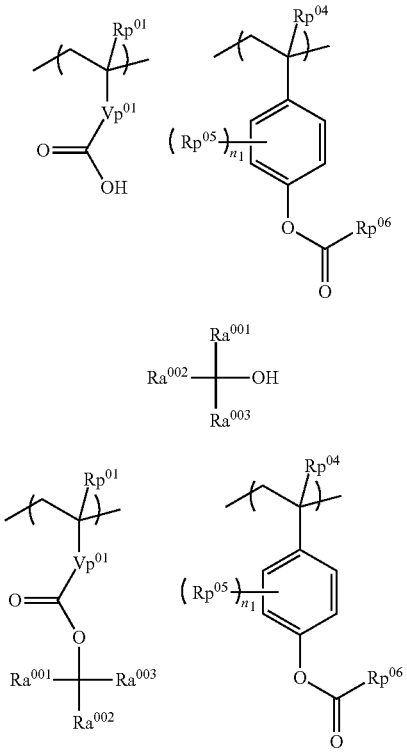

(Pre-1a)

(Add-1)

(Pre-1b-1)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; m represents an integer of 0 to 4; $Ra^{001}$, $Ra^{002}$ and $Ra^{003}$ each independently represents a hydrocarbon group which may have a substituent; $Ra^{002}$ and $Ra^{003}$ may be mutually bonded to form a ring.

[Chemical Formula 24]

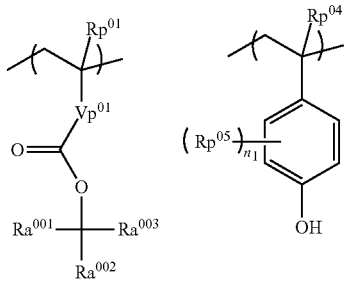

(p1)

In the formula, $Rp^{01}$ and $Rp^{04}$ each independently represents a hydrogen atom, an alkyl group of 1 to 5 carbon atoms or a halogenated alkyl group of 1 to 5 carbon atoms; $Vp^{01}$ represents a single bond or a divalent linking group; $Ra^{001}$, $Ra^{002}$ and $Ra^{003}$ each independently represents a hydrocarbon group which may have a substituent; $Ra^{002}$ and $Ra^{003}$ may be mutually bonded to form a ring; $Rp^{05}$ represents an alkyl group, an alkoxy group, a halogen atom, a halogenated alkyl group, a cyano group or a hydroxy group; and m represents an integer of 0 to 4.

<Step (ia)>

Step (ia) is a step of copolymerizing compound represented by general formula (m0-1) with a compound represented by general formula (m0-2) by living radical polymerization to obtain an alternating copolymer represented by general formula (p0), and is the same as described above for the method of producing an alternating copolymer according to the second aspect.

<Step (iia)>

Step (iia) is a step of subjecting the alternating copolymer to hydrolysis to obtain a first polymeric compound precursor represented by general formula (Pre-1a) (hereafter, sometimes referred to as "polymeric compound precursor (Pre-1a)").

In formula (Pre-1a), $Rp^{01}$, $Vp^{01}$, $Rp^{04}$, $Rp^{05}$, $Rp^{06}$ and m are the same as defined in the aforementioned formulae (a0-1) and (a0-2).

The hydrolysis of the alternating copolymer may be conducted by adding the alternating copolymer and an acid component to a solvent, followed by mixing. The solvent is the same as defined for the solvent used in the atom transfer radical polymerization.

<<Acid Component>>

The acid component is not particularly limited, and may be an inorganic acid or an organic acid.

Examples of the acid component include organic acids, such as acetic acid, oxalic acid, p-toluenesulfonic acid, methanesulfonic acid, trifluoromethanesulfonic acid and malonic acid; and inorganic acids, such as sulfuric acid, hydrochloric acid, phosphoric acid and hydrobromic acid.

In the production method according to the present embodiment, as the acid component, one kind of compound may be used, or two or more kinds of compounds may be used in combination.

The temperature conditions for reacting the alternating copolymer and the acid component is not particularly limited, and is, for example, about 0° C. to about 120° C. The time for reacting the alternating copolymer and the acid component is not particularly limited, and is, for example, about 1 hour to about 72 hours.

<Step (iiia)>

Step (iiia) is the step of reacting the first polymeric compound precursor represented by formula (Pre-1a) (polymeric compound precursor (Pre-1a)) with a compound represented by general formula (Add-1) to obtain a second polymeric compound precursor represented by general formula (Pre-1b-1) (hereafter, sometimes referred to as "polymeric compound precursor (Pre-1b-1)").

[Chemical Formula 25]

(Add-1)

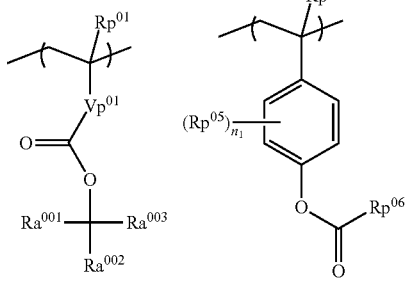

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group or a hydroxy group; $Rp^{06}$ represents a linear or branched aliphatic hydrocarbon group; m represents an integer of 0 to 4; $Ra^{001}$, $Ra^{002}$ and $Ra^{003}$ each independently represents a hydrocarbon group which may have a substituent; $Ra^{002}$ and $Ra^{003}$ may be mutually bonded to form a ring.

The reaction between the polymeric compound precursor (Pre-1a) with the compound represented by general formula (Add-1) may be conducted by a conventional esterification method. Examples of the esterification method include a method in which a condensation agent such as a carbodiimide (e.g., 1-(3-dimethylaminopropyl)-3-ethylcarbodiimide hydrochloride (EDC/HCl)) and a catalyst such as N,N-dimethyl-4-aminopyridine (DMAP) is used.

The temperature conditions for reacting the polymeric compound precursor (Pre-1a) and the compound represented by general formula (Add-1) is not particularly limited, and is, for example, about 0° C. to about 120° C. The time for reacting the polymeric compound precursor (Pre-1a) with the compound represented by general formula (Add-1) is not particularly limited, and is, for example, about 1 hour to about 72 hours.

In general formula (Add-1), examples of the hydrocarbon group for $Ra^{001}$ include a linear or branched alkyl group, chain or cyclic alkenyl group, and a cyclic hydrocarbon group.

The linear alkyl group for $Ra^{001}$ preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among the above examples, a methyl group, an ethyl group or an n-butyl group is preferable, and a methyl group or an ethyl group is more preferable.

The branched alkyl group for $Ra^{001}$ preferably has 3 to 10 carbon atoms, and more preferably 3 to 5 carbon atoms. Specific examples include an isopropyl group, an isobutyl group, a tert-butyl group, an isopentyl group, a neopentyl group a 1,1-diethylpropyl group and a 2,2-dimethylbutyl group. Among these, an isopropyl group is preferable.

In the case where $Ra^{001}$ represents a cyclic hydrocarbon group, the cyclic hydrocarbon group may be an aliphatic hydrocarbon group or an aromatic hydrocarbon group, and may be polycyclic or monocyclic.

As the monocyclic aliphatic hydrocarbon group, a group in which 1 hydrogen atom has been removed from a mono-cycloalkane is preferable. The monocycloalkane preferably has 3 to 6 carbon atoms, and specific examples thereof include cyclopentane and cyclohexane.

As the polycyclic aliphatic hydrocarbon group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

In the case where the cyclic hydrocarbon group for $Ra^{001}$ is an aromatic hydrocarbon group, the aromatic hydrocarbon group is a hydrocarbon group having at least one aromatic ring.

The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group for $Ra^{001}$ include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aforementioned aromatic hydrocarbon ring or the aromatic hetero ring preferably has 1 to 4 carbon atoms, more preferably 1 or 2 carbon atoms, and most preferably 1 carbon atom.

The cyclic hydrocarbon group for $Ra^{001}$ may have a substituent. Examples of the substituent include —$R^{P1}$, —$R^{P2}$—O—$R^{P1}$, —$R^{P2}$—CO—$R^{P1}$, —$R^{P2}$—CO—$OR^{P1}$, —$R^{P2}$—O—CO—$R^{P1}$, —$R^{P2}$—OH、 —$R^{P2}$—CN and —$R^{P2}$—COOH.

Here, $R^{P1}$ is a monovalent chain saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. $R^{P2}$ represents a single bond, monovalent saturated chain hydrocarbon group of 1 to 10 carbon atoms, a monovalent saturated aliphatic cyclic hydrocarbon group of 3 to 20 carbon atoms or a monovalent aromatic hydrocarbon group of 6 to 30 carbon atoms. However, the saturated chain hydrocarbon group, the saturated cyclic aliphatic hydrocarbon group and the aromatic hydrocarbon group for $R^{P1}$ and $R^{P2}$ may have part or all of the hydrogen atoms substituted with fluorine. The saturated aliphatic cyclic hydrocarbon group may have 1 or more substituents of 1 kind, or 1 or more substituents of a plurality of kinds.

Examples of the monovalent chain saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic aliphatic saturated hydrocarbon group such as a bicyclo[2.2.2]octanyl group, a tricyclo[5.2.1.02,6]decanyl group, a tricyclo[3.3.1.13,7]decanyl group, a tetracyclo[6.2.1.13,6.02,7]dodecanyl group, and an adamantyl group.

Examples of the monovalent aromatic hydrocarbon group having 6 to 30 carbon atoms include a group obtained by removing one hydrogen atom from the aromatic hydrocarbon ring such as benzene, biphenyl, fluorene, naphthalene, anthracene, and phenanthrene.

Examples of the monovalent chain saturated hydrocarbon group having 1 to 10 carbon atoms, monovalent aliphatic cyclic saturated hydrocarbon group having 3 to 20 carbon atoms, or monovalent aromatic hydrocarbon group having 6 to 30 carbon atoms for $R^{P2}$ include groups in which 1 hydrogen atom has been further removed from any of the aforementioned hydrocarbons.

The chain or cyclic alkenyl group for $Ra^{001}$ is preferably an alkenyl group having 2 to 10 carbon atoms.

In formula (Add-1), the hydrocarbon group for $Ra^{002}$ and $Ra^{003}$ is the same as defined for $Ra^{001}$.

In the case where $Ra^{002}$ and $Ra^{003}$ are mutually bonded to form a ring, a group represented by general formula (a1-r2-1) shown below, a group represented by general formula (a1-r2-2) shown below, and a group represented by general formula (a1-r2-3) shown below may be given as preferable examples.

On the other hand, in the case where $Ra^{002}$ and $Ra^{003}$ are not mutually bonded and independently represent a hydrocarbon group, the group represented by general formula (a1-r2-4) shown below may be given as a preferable example.

[Chemical Formula 26]

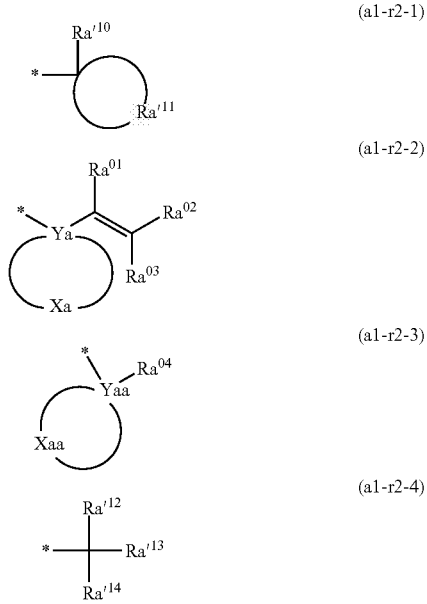

In formula (a1-r2-1), $Ra'^{10}$ represents an alkyl group of 1 to 10 carbon atoms, or a group represented by general formula (a1-r2-r1) shown below; $Ra'^{11}$ is a group which forms an aliphatic cyclic group together with a carbon atom having $Ra'^{10}$ bonded thereto. In formula (a1-r2-2), Ya represents a carbon atom; Xa represents a group which forms a cyclic hydrocarbon group together with Ya, provided that part or all of the hydrogen atoms of the cyclic hydrocarbon group may be substituted; $Ra^{01}$ to $Ra^{03}$ each independently represents a hydrogen atom, a monovalent saturated chain hydrocarbon group of 1 to 10 carbon atoms or a monovalent saturated aliphatic cyclic hydrocarbon group of 3 to 20 carbon atoms, provided that part or all of the hydrogen atoms of the saturated chain hydrocarbon or the saturated aliphatic cyclic hydrocarbon may be substituted; two or more of $Ra^{01}$ to $Ra^{03}$ may be mutually bonded to form a cyclic structure. In formula (a1-r2-3), Yaa represents a carbon atom; Xaa represents a group which forms an aliphatic cyclic group together with Yaa; $Ra^{04}$ represents an aromatic hydrocarbon group which may have a substituent. In formula (a1-r2-4), $Ra'^{12}$ and $Ra'^{13}$ each independently represents a hydrogen atom or a monovalent saturated hydrocarbon group of 1 to 10 carbon atoms, provided that part or all of the hydrogen atoms of the saturated hydrocarbon group may be substituted; $Ra'^{14}$ represents a hydrocarbon group which may have a substituent; and * represents a bonding site (the same definition hereafter).

[Chemical Formula 27]

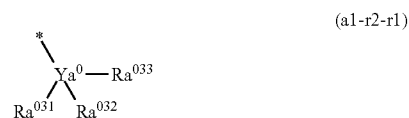

In the formula, $Ya^0$ represents a quaternary carbon atom; $Ra^{031}$, $Ra^{032}$ and $Ra^{033}$ each independently represents a hydrocarbon group which may have a substituent; provided that at least one $Ra^{031}$, $Ra^{032}$ and $Ra^{033}$ is a hydrocarbon group having a polar group.

In formula (a1-r2-1), the alkyl group of 1 to 10 carbon atoms for $Ra'^{10}$ is preferably a linear or branched alkyl group. $Ra'^{10}$ is preferably an alkyl group of 1 to 5 carbon atoms.

In formula (a1-r2-r1), $Ya^0$ represents a quaternary carbon atom. That is, the number of carbon atoms bonded to $Ya^0$ (carbon atom) is 4.

In formula (a1-r2-r1), $Ra^{031}$, $Ra^{032}$ and $Ra^{033}$ each independently represents a hydrocarbon group which may have a substituent. Examples of the hydrocarbon group for $Ra^{031}$, $Ra^{032}$ and $Ra^{033}$ include a linear or branched alkyl group, a chain or cyclic alkenyl group, and a cyclic hydrocarbon group.

The linear alkyl group for $Ra^{031}$, $Ra^{032}$ and $Ra^{033}$ preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group for $Ra^{031}$, $Ra^{032}$ and $Ra^{033}$ preferably has 3 to 10 carbon atoms, and more preferably 3 to 5 carbon atoms. Specific examples include an isopropyl group, an isobutyl group, a tert-butyl group, an isopentyl group, a neopentyl group a 1,1-diethylpropyl group and a 2,2-dimethylbutyl group. Among these, an isopropyl group is preferable.

The chain or cyclic alkenyl group for $Ra^{031}$, $Ra^{032}$ and $Ra^{033}$ is preferably an alkenyl group having 2 to 10 carbon atoms.

The cyclic hydrocarbon group for $Ra^{031}$, $Ra^{032}$ and $Ra^{033}$ may be an aliphatic hydrocarbon group or an aromatic hydrocarbon group, and may be polycyclic or monocyclic.

As the monocyclic aliphatic hydrocarbon group, a group in which 1 hydrogen atom has been removed from a monocycloalkane is preferable. The monocycloalkane preferably has 3 to 6 carbon atoms, and specific examples thereof include cyclopentane and cyclohexane.

As the polycyclic aliphatic hydrocarbon group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group for $Ra^{031}$, $Ra^{032}$ and $Ra^{033}$ is a hydrocarbon group having at least one aromatic ring. The aromatic ring is not particularly limited, as long as it is a cyclic conjugated compound having (4n+2) π electrons, and may be either monocyclic or polycyclic. The aromatic ring preferably has 5 to 30 carbon atoms, more preferably 5 to 20, still more preferably 6 to 15, and most preferably 6 to 12. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring. Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aforementioned aromatic hydrocarbon ring or the aromatic hetero ring preferably has 1 to 4 carbon atoms, more preferably 1 or 2 carbon atoms, and most preferably 1 carbon atom.

In the case where the hydrocarbon group for $Ra^{031}$, $Ra^{032}$ and $Ra^{033}$ is substituted, examples of the substituent include a hydroxy group, a carboxy group, a halogen atom (such as a fluorine atom, a chlorine atom or a chlorine atom), an alkoxy group (such as a methoxy group, an ethoxy group, a propoxy group or a butoxy group), and an alkyloxycarbonyl group.

Among these examples, as the hydrocarbon group (which may have a substituent) for $Ra^{031}$, $Ra^{032}$ and $Ra^{033}$, a linear or branched alkyl group which may have a substituent is preferable, and a linear alkyl group is more preferable.

However, at least one of $Ra^{031}$, $Ra^{032}$ and $Ra^{033}$ is a hydrocarbon group having a polar group.

The "hydrocarbon group having a polar group" includes a group in which a methylene group (—$CH_2$—) constituting the hydrocarbon group is substituted with a polar group, and a group in which at least one hydrogen atom constituting the hydrocarbon group has been substituted with a polar group.

Examples of the "hydrocarbon group having a polar group" include a functional group represented by general formula (a1-p1) shown below.

[Chemical Formula 28]

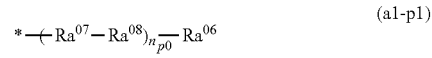

(a1-p1)

In the formula, $Ra^{07}$ represents a divalent hydrocarbon group having 2 to 12 carbon atoms; $Ra^{08}$ represents a divalent linking group containing a hetero atom; $Ra^{06}$ represents a monovalent hydrocarbon group having 1 to 12 carbon atoms; and $n_{p0}$ represents an integer of 1 to 6.

In formula (a1-p1), $Ra^{07}$ represents a divalent hydrocarbon group having 2 to 12 carbon atoms. $Ra^{07}$ has 2 to 12 carbon atoms, preferably 2 to 8 carbon atoms, more preferably 2 to 6 carbon atoms, still more preferably 2 to 4 carbon atoms, and most preferably 2 carbon atoms.

The hydrocarbon group for $Ra^{07}$ is preferably a chain or cyclic aliphatic hydrocarbon group, and more preferably a chain hydrocarbon group.

Examples of $Ra^{07}$ include a linear alkanediyl group, such as an ethylene group, a propane-1,3-diyl group, butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, and a dodecane-1,12-diyl group; a branched alkanediyl group, such as a propane-1,2-diyl group, a 1-methylbutane-1,3-diyl group, a 2-methylpropane-1,3-diyl group, a pentane-1,4-diyl group, and a 2-methylbutane-1,4-diyl group; a cycloalkanediyl group, such as a cyclobutane-1,3-diyl group, a cyclopentane-1,3-diyl group, a cyclohexane-1,4-diyl group, and a cyclooctane-1,5-diyl group; and a polycyclic divalent alicyclic hydrocarbon group, such as a norbornane-1,4-diyl group, a norbornane-2,5-diyl group, an adamantane-1,5-diyl group, and an adamantane-2,6-diyl group.

Among these examples, an alkanediyl group is preferable, and a linear alkanediyl group is more preferable.

In formula (a1-p1), $Ra^{08}$ represents a divalent linking group containing a hetero atom.

Examples of $Ra^{08}$ include —O—, —C(=O)—O—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, and —S(=O)$_2$—O—.

Among these examples, in terms of solubility in a developing solution, —O—, —C(=O)—O—, —C(=O)—, or —O—C(=O)—O— are preferable, and —O— or —C(=O)— is most preferable.

In formula (a1-p1), $Ra^{06}$ represents a monovalent hydrocarbon group having 1 to 12 carbon atoms. $Ra^{06}$ has 1 to 12 carbon atoms. In terms of solubility in a developing solution, $Ra^{06}$ preferably has 1 to 8 carbon atoms, more preferably 1 to 5 carbon atoms, still more preferably 1 to 3 carbon atoms, still more preferably 1 or 2 carbon atoms, and most preferably 1 carbon atoms.

Examples of the hydrocarbon group for $Ra^{06}$ include a chain hydrocarbon group, a cyclic hydrocarbon group, and a combination of a chain hydrocarbon group and a cyclic hydrocarbon group.

Examples of the chain hydrocarbon group include a methyl group, an ethyl group, an n-propyl group, an isopropyl group, an n-butyl group, a sec-butyl group, a tert-butyl group, an n-pentyl group, an n-hexyl group, an n-heptyl group, a 2-ethylhexyl group, an n-octyl group, an n-nonyl group, an n-decyl group, an n-undecyl group and an n-dodecyl group.

The cyclic hydrocarbon group may be an alicyclic hydrocarbon group or an aromatic hydrocarbon group.

The alicyclic hydrocarbon group may be monocyclic or polycyclic. Examples of monocyclic alicyclic hydrocarbon groups include cycloalkyl groups, such as a cyclopropyl group, a cyclobutyl group, a cyclopentyl group, a cyclohexyl group, a dimethylcyclohexyl group, a cycloheptyl group, a cyclooctyl group, a cycloheptyl group, and a cyclodecyl group. Examples of polycyclic alicyclic hydrocarbon groups include a decahydronaphthyl group, an adamantyl group, a 2-alkyladamantan-2-yl group, a 1-(adamantan-1-yl)alkan-1-yl group, a norbornyl group, a methylnorbornyl group, and an isonorbornyl group.

Examples of aromatic hydrocarbon groups include a phenyl group, a naphthyl group, an anthryl group, a p-methylphenyl group, a p-tert-butylphenyl group, a p-adamantylphenyl group, a tolyl group, a xylyl group, a cumenyl group, a mesityl group, a biphenyl group, a phenanthryl group, 2,6-diethylphenyl group, and 2-methyl-6-ethyl phenyl group.

In terms of solubility in a developing solution, $Ra^{o6}$ is preferably a chain hydrocarbon group, more preferably an alkyl group, and still more preferably a linear alkyl group.

In formula (a1-p1), $n_{p0}$ is an integer of 1 to 6, preferably an integer of 1 to 3, more preferably 1 or 2, and still more preferably 1.

Specific examples of the hydrocarbon group having a polar group are shown below.

In the following formulae, * represents a valence bond which is bonded to the quaternary carbon atom ($Ya^0$).

[Chemical Formula 29]

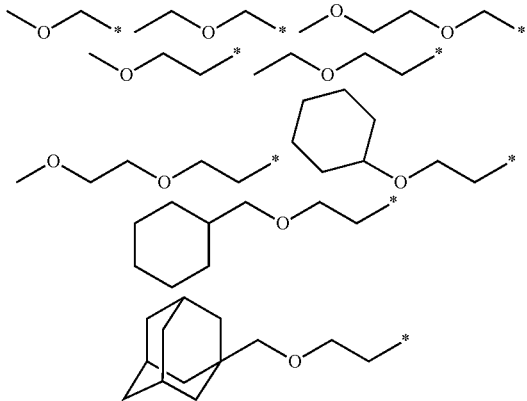

In formula (a1-r2-r1), at least one of $Ra^{031}$, $Ra^{032}$ and $Ra^{033}$ is a hydrocarbon group having a polar group. However, the number of hydrocarbon groups having a polar group may be appropriately selected depending on the solubility in the developing solution used in the formation of a resist pattern. For example, it is preferable that one or two of $Ra^{031}$, $Ra^{032}$ and $Ra^{033}$ is a hydrocarbon group having a polar group, and it is more preferable that one of $Ra^{031}$, $Ra^{032}$ and $Ra^{033}$ is hydrocarbon group having a polar group.

The hydrocarbon group having a polar group may have a substituent other than a polar group. Examples of such substituent include a halogen atom (such as a fluorine atom, a chlorine atom or a bromine atom), and a halogenated alkyl group having 1 to 5 carbon atoms.

In formula (a1-r2-1), the aliphatic cyclic group which is formed by $Ra^{'11}$ together with the carbon atom bonded to $Ra^{'10}$, the same groups as those described above for the monocyclic or polycyclic aliphatic hydrocarbon group for $Ra^{001}$ in the aforementioned general formula (Add-1) are preferable.

In formula (a1-r2-2), as the cyclic hydrocarbon group formed by Xa together with Ya, a group in which 1 or more hydrogen atoms have been removed from the monovalent cyclic hydrocarbon group (aliphatic hydrocarbon group) for $Ra^{001}$ in the aforementioned formula (Add-1) may be mentioned.

The cyclic hydrocarbon group which Xa forms with Ya may have a substituent. Examples of substituents include the same substituents as those which the cyclic hydrocarbon group for $Ra^{001}$ in the aforementioned general formula (Add-1) may have.

In formula (a1-r2-2), examples of the monovalent saturated chain hydrocarbon group of 1 to 10 carbon atoms for $Ra^{01}$ to $Ra^{03}$ include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms for $Ra^{01}$ to $Ra^{03}$ include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic aliphatic saturated hydrocarbon group such as a bicyclo[2.2.2]octanyl group, a tricyclo[5.2.1.02,6]decanyl group, a tricyclo[3.3.1.13,7]decanyl group, a tetracyclo[6.2.1.13,6.02,7]dodecanyl group, and an adamantyl group.

As the substituent for the saturated chain hydrocarbon group or saturated cyclic aliphatic hydrocarbon group represented by $Ra^{01}$ to $Ra^{03}$, for example, the same substituents as those described above for $Ra^{05}$ may be mentioned.

Examples of the group containing a carbon-carbon double bond which is generated by forming a cyclic structure in which two or more of $Ra^{01}$ to $Ra^{03}$ are bonded to each other include a cyclopentenyl group, a cyclohexenyl group, a methyl cyclopentenyl group, a methyl cyclohexenyl group, a cyclopentylideneethenyl group, and a cyclohexylideneethenyl group.

In formula (a1-r2-3), an aliphatic cyclic group which is formed of Xaa together with Yaa is preferably a group exemplified as an aliphatic hydrocarbon group which is a monocyclic group or a polycyclic group of $Ra^{001}$ in the aforementioned general formula (Add-1).

In general formula (a1-r2-3), examples of the aromatic hydrocarbon group for $Ra^{04}$ include a group obtained by removing one or more hydrogen atoms from an aromatic hydrocarbon ring having 5 to 30 carbon atoms. Among these examples, $Ra^{04}$ is preferably a group obtained by removing one or more hydrogen atoms from an aromatic hydrocarbon ring having 6 to 15 carbon atoms, a group obtained by removing one or more hydrogen atoms from benzene, naphthalene, anthracene, or phenanthrene is further preferable, a group obtained by removing one or more hydrogen atoms from benzene, naphthalene, or anthracene is still further preferable, a group obtained by removing one or more hydrogen atoms from benzene and naphthalene is particularly preferable, and a group obtained by removing one or more hydrogen atoms from benzene is most preferable.

Examples of the substituent that $Ra^{o4}$ in general formula (a1-r2-3) may have include a methyl group, an ethyl group, a propyl group, a hydroxyl group, a carboxyl group, a halogen atom (a fluorine atom, a chlorine atom, a bromine atom, or the like), an alkoxy group (a methoxy group, an ethoxy group, a propoxy group, a butoxy group, or the like), and an alkyloxycarbonyl group.

In general formula (a1-r2-4), $Ra'^{12}$ and $Ra'^{13}$ each independently represent a monovalent chain saturated hydrocarbon group having 1 to 10 carbon atoms or a hydrogen atom. With respect to $Ra'^{12}$ and $Ra'^{13}$, examples of the monovalent chain saturated hydrocarbon group having 1 to 10 carbon atoms include the same monovalent chain saturated hydrocarbon group having 1 to 10 carbon atoms as that for $Ra^{o1}$ to $Ra^{o3}$, provided that part or all of the hydrogen atoms of the saturated hydrocarbon group may be substituted;

Among these examples, as $Ra'^{12}$ and $Ra'^{13}$, a hydrogen atom and an alkyl group having 1 to 5 carbon atoms are preferable, an alkyl group having 1 to 5 carbon atoms is further preferable, a methyl group and an ethyl group are still further preferable, and a methyl group is particularly preferable.

In the case where the chain saturated hydrocarbon group represented by $Ra'^{12}$ and $Ra'^{13}$ is substituted, examples of the substituent include the same group as that of $Ra^{o5}$.

In general formula (a1-r2-4), $Ra'^{14}$ is a hydrocarbon group which may have a substituent. Examples of the hydrocarbon group for $Ra'^{14}$ include a linear or branched alkyl group and a cyclic hydrocarbon group.

The linear alkyl group for $Ra'^{14}$ preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group for $Ra'^{14}$ preferably has 3 to 10 carbon atoms, and more preferably 3 to 5 carbon atoms. Specific examples include an isopropyl group, an isobutyl group, a tert-butyl group, an isopentyl group, a neopentyl group a 1,1-diethylpropyl group and a 2,2-dimethylbutyl group. Among these, an isopropyl group is preferable.

In the case where $Ra'^{14}$ represents a cyclic hydrocarbon group, the cyclic hydrocarbon group may be an aliphatic hydrocarbon group or an aromatic hydrocarbon group, and may be polycyclic or monocyclic.

As the monocyclic aliphatic hydrocarbon group, a group in which 1 hydrogen atom has been removed from a monocycloalkane is preferable. The monocycloalkane preferably has 3 to 6 carbon atoms, and specific examples thereof include cyclopentane and cyclohexane.

As the polycyclic aliphatic hydrocarbon group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

Examples of the aromatic hydrocarbon group for $Ra'^{14}$ include the same aromatic hydrocarbon groups as those described above for $Ra^{o4}$. Among these examples, $Ra'^{14}$ is preferably a group formed by removing one or more hydrogen atoms from an aromatic hydrocarbon ring having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, still more preferably a group formed by removing one or more hydrogen atoms from naphthalene or anthracene, and most preferably a group formed by removing one or more hydrogen atoms from naphthalene.

Examples of the substituent that $Ra'^{14}$ may have include the same group as the substituent that $Ra^{o4}$ may have.

In the case where $Ra'^{14}$ in general formula (a1-r2-4) is a naphthyl group, a position which is bonded to a tertiary carbon atom in general formula (a1-r2-4) may be 1-position and 2-position of the naphthyl group.

In the case where $Ra'^{14}$ in general formula (a1-r2-4) is an anthryl group, a position which is bonded to a tertiary carbon atom in general formula (a1-r2-4) may be any one of 1-position, 2-position, and 9-position of the anthryl group.

Specific examples of the group represented by the aforementioned formula (a1-r2-1) are shown below.

[Chemical Formula 30]

 (r-pr-m1)

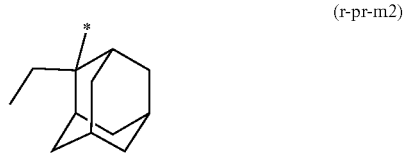 (r-pr-m2)

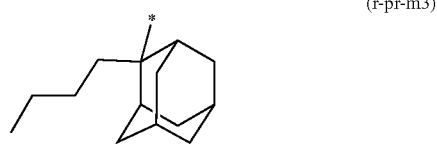 (r-pr-m3)

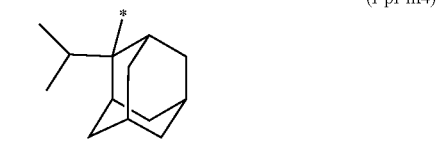 (r-pr-m4)

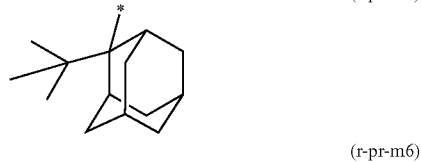 (r-pr-m5)

 (r-pr-m6)

 (r-pr-m7)

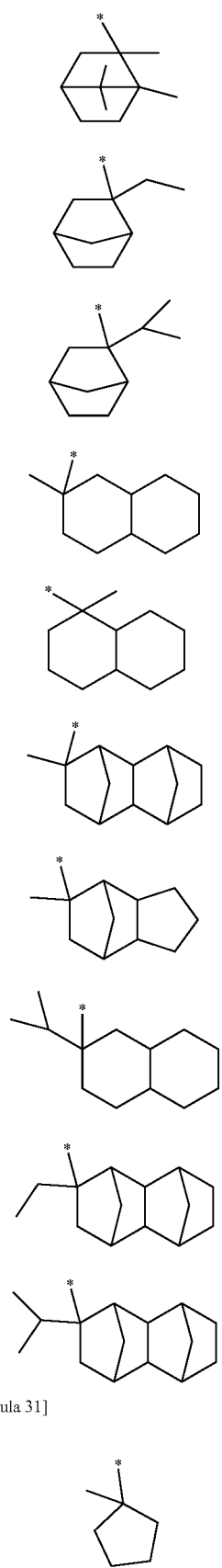

(r-pr-s12)
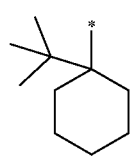
(r-pr-s13)
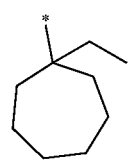
(r-pr-s14)
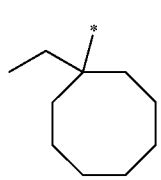
(r-pr-s15)
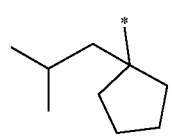
(r-pr-s16)
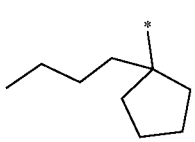
(r-pr-s17)
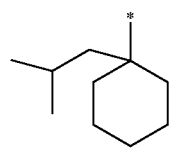
(r-pr-s18)
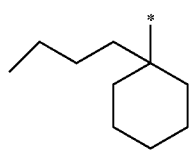
(r-pr-s19)
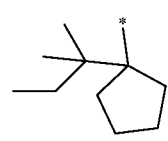
(r-pr-s20)
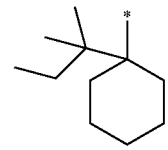
[Chemical Formula 32]
(r-pr-sp1)
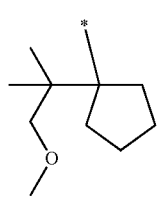
(r-pr-sp2)
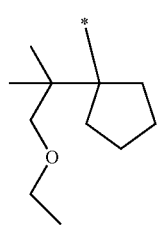
(r-pr-sp3)
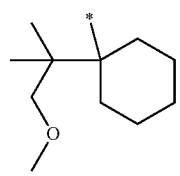
(r-pr-sp4)
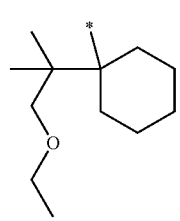
(r-pr-mp1)
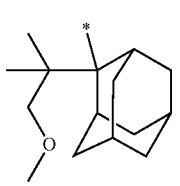
(r-pr-mp2)
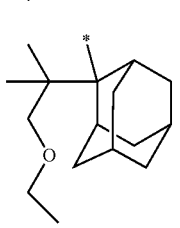
Specific examples of the group represented by the aforementioned formula (a1-r2-2) are shown below.
[Chemical Formula 33]
(r-pr-sv1)
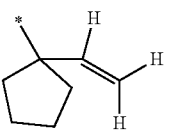
(r-pr-sv2)
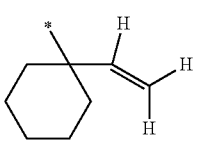
(r-pr-sv3)
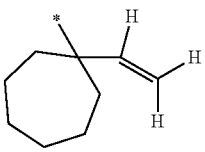

-continued (r-pr-sv4)
(r-pr-sv5)
(r-pr-sv6)
(r-pr-sv7)
(r-pr-sv8)
(r-pr-sv9)
(r-pr-sv10)
(r-pr-sv11)
(r-pr-sv12)

[Chemical Formula 34]

(r-pr-mv1)

-continued (r-pr-mv2)
(r-pr-mv3)
(r-pr-mv4)
(r-pr-mv5)
(r-pr-mv6)
(r-pr-mv7)
(r-pr-mv8)
(r-pr-mv9)

[Chemical Formula 35]

(r-pr-mv10)

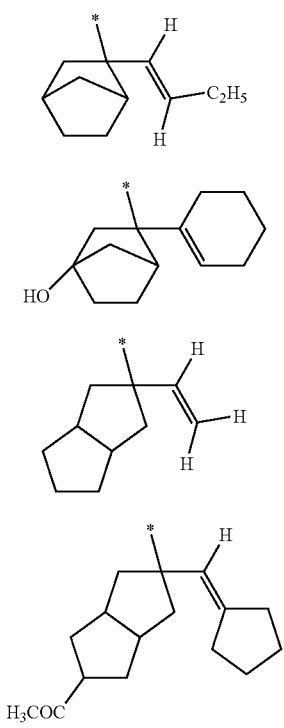
(r-pr-mv11)
(r-pr-mv12)
(r-pr-mv13)
(r-pr-mv14)
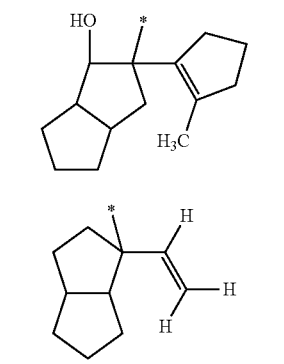
(r-pr-mv15)
(r-pr-mv16)
(r-pr-mv17)
(r-pr-mv18)
(r-pr-mv19)
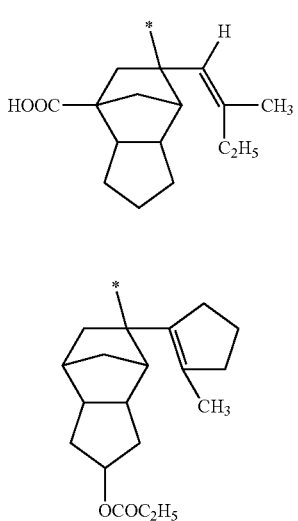
(r-pr-mv20)
(r-pr-mv21)
Specific examples of the group represented by the aforementioned formula (a1-r2-3) are shown below.
[Chemical Formula 36]
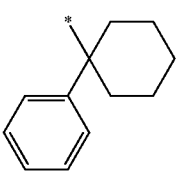
(r-pr-sa1)
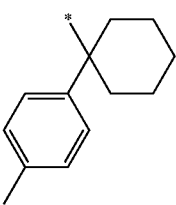
(r-pr-sa2)
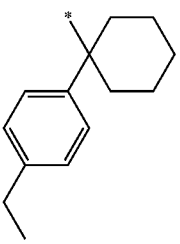
(r-pr-sa3)
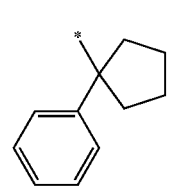
(r-pr-sa4)

-continued
(r-pr-sa5) 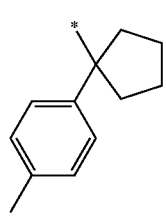
(r-pr-sa6) 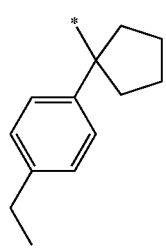
(r-pr-sa7) 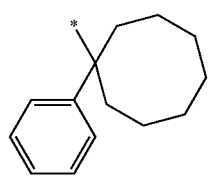
(r-pr-sa8) 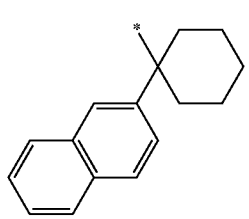
(r-pr-sa9) 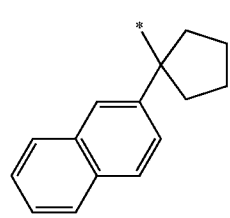
(r-pr-ma1) 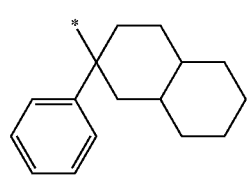
(r-pr-ma2) 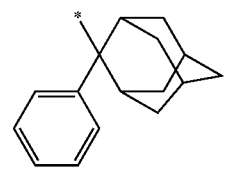
Specific examples of the group represented by the aforementioned formula (a1-r2-4) are shown below.
[Chemical Formula 37]
(r-pr-cm1) 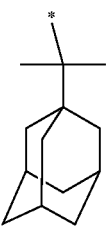
(r-pr-cm2) 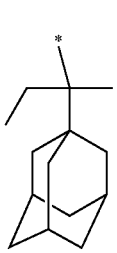
(r-pr-cm3) 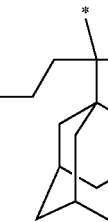
(r-pr-cm4) 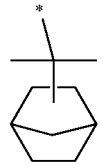
(r-pr-cm5) 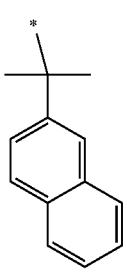
(r-pr-cm6) 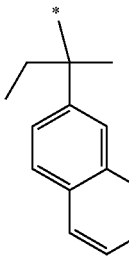

-continued (r-pr-cm7)
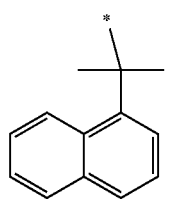

(r-pr-cm8)
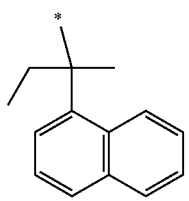

(r-pr-cs1)
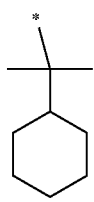

(r-pr-cs2)
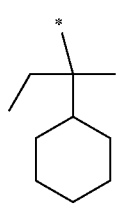

(r-pr-cs3)
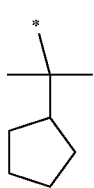

(r-pr-cs4)
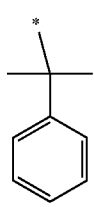

(r-pr-cs5)
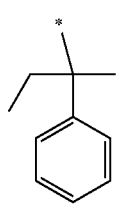

(r-pr-c1)
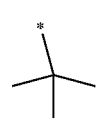

-continued (r-pr-c2), (r-pr-c3)
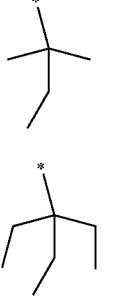

In formula (Pre-1b-1), $Rp^{01}$, $Vp^{01}$, $Rp^{04}$, $Rp^{05}$, $Rp^{06}$ and $n_1$ are the same as defined in the aforementioned formulae (a0-1) and (a0-2).

In formula (Pre-1b-1), $Ra^{001}$, $Ra^{002}$ and $Ra^{003}$ each independently represents a hydrocarbon group which may have a substituent.

In formula (Pre-1b-1), —$C(Ra^{001})(Ra^{002})(Ra^{003})$ is an acid dissociable group (tertiary alkyl ester-type acid dissociable group). The "acid dissociable group" refers to both (i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

Specifically, in formula (Pre-1b-1), the bond between the tertiary carbon atom of —$C(Ra^{001})(Ra^{002})(Ra^{003})$ and the oxygen atom adjacent to the tertiary carbon atom is cleaved, and —$C(Ra^{001})(Ra^{002})(Ra^{003})$ is dissociated to form a carboxy group which has a high polarity, thereby increasing the polarity.

In formula (Pre-1b-1), $Ra^{001}$, $Ra^{002}$ and $Ra^{003}$ are the same as defined for the hydrocarbon group in the aforementioned formula (Add-1).

<Step (iva)>

Step (iva) is a step of subjecting the polymeric compound precursor (Pre-1b-1) to hydrolysis to obtain a polymeric compound represented by general formula (p1) (hereafter, sometimes referred to as "polymeric compound (p1)").

The hydrolysis of the polymeric compound precursor (Pre-1b-1) may be conducted by a method in which the polymeric compound precursor (Pre-1b-1) and a base component is added to a solvent, followed by mixing. The solvent is the same as defined for the solvent used in the atom transfer radical polymerization.

<<Base Component>>

The base component is not particularly limited, and examples thereof include sodium hydroxide, potassium hydroxide and potassium carbonate.

In the production method according to the present embodiment, as the base component, one kind of compound may be used, or two or more kinds of compounds may be used in combination.

The temperature conditions for reacting the polymeric compound precursor (Pre-1b-1) with the base component is not particularly limited, and is, for example, about 0° C. to about 60° C.

The time for reacting the polymeric compound precursor (Pre-1b-1) with the base component is not particularly limited, and is, for example, about 1 hour to about 24 hours.

In general formula (p1), $Rp^{01}$, $Vp^{01}$, $Rp^{04}$, $Rp^{05}$ and m are the same as defined in formulae (a0-1) and (a0-2).

In formula (p1), $Ra^{001}$, $Ra^{002}$ and $Ra^{003}$ are the same as defined for the hydrocarbon group in the aforementioned formula (Add-1).

(Fourth Aspect: Production Method of Polymeric Compound (Second Method))

The fourth aspect of the present embodiment is a method of producing a polymeric compound, including:

(ib) a step of copolymerizing a compound represented by general formula (m0-1) shown below with a compound represented by general formula (m0-2) shown below by living radical polymerization to obtain an alternating copolymer represented by general formula (p0) shown below (hereafter, sometimes referred to as "step (ib)");

(iib) a step of subjecting the alternating copolymer to hydrolysis to obtain a polymeric compound precursor represented by general formula (Pre-2a) shown below (hereafter, sometimes referred to as "step (iib)"); and (iiib) a step of reacting the polymeric compound precursor with a compound represented by general formula (Add-1) shown below to obtain a polymeric compound represented by general formula (p1) shown below (hereafter, sometimes referred to as "step (iiib)").

[Chemical Formula 38]

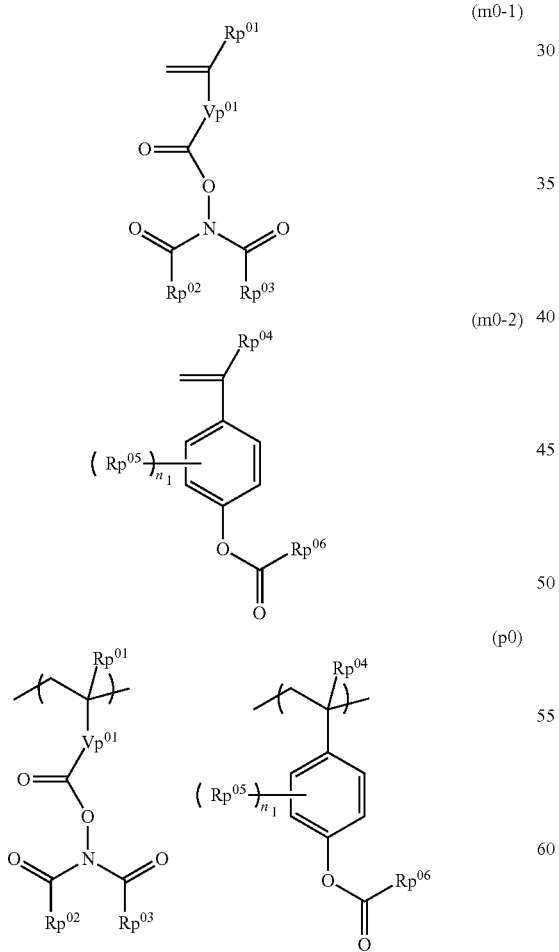

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and m represents an integer of 0 to 4.

[Chemical Formula 39]

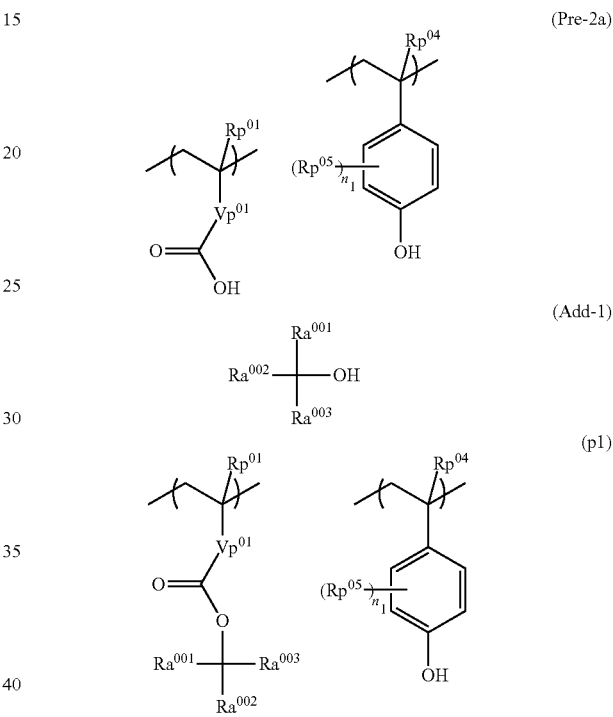

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $n_1$ represents an integer of 0 to 4; $Ra^{001}$, $Ra^{002}$ and $Ra^{003}$ each independently represents a hydrocarbon group which may have a substituent; $Ra^{002}$ and $Ra^{003}$ may be mutually bonded to form a ring.

<Step (ib)>

Step (ib) is the same as the aforementioned step (ia).

<Step (iib)>

Step (ib) is a step of subjecting the alternating copolymer to hydrolysis to obtain a polymeric compound precursor represented by general formula (Pre-2a) (hereafter, sometimes referred to as "polymeric compound precursor (Pre-2a)").

The hydrolysis of the alternating copolymer may be conducted by adding the alternating copolymer and an acid component to a solvent, followed by mixing. The solvent is the same as defined for the solvent used in the atom transfer radical polymerization.

<<Acid Component>>

The acid component is not particularly limited, and may be an inorganic acid or an organic acid.

Examples of the acid component include organic acids, such as acetic acid, oxalic acid, p-toluenesulfonic acid, methanesulfonic acid, trifluoromethanesulfonic acid and malonic acid; and inorganic acids, such as sulfuric acid, hydrochloric acid, phosphoric acid and hydrobromic acid.

In the production method according to the present embodiment, as the acid component, one kind of compound may be used, or two or more kinds of compounds may be used in combination.

The temperature conditions for reacting the alternating copolymer and the acid component is not particularly limited, and is, for example, about 0° C. to about 120° C.

The time for reacting the alternating copolymer and the acid component is not particularly limited, and is, for example, about 1 hour to about 72 hours.

<Step (iiib)>

Step (iiib) is a step of reacting the polymeric compound precursor (Pre-2a) with a compound represented by general formula (Add-1) shown below to obtain a polymeric compound represented by general formula (p1).

Reacting the polymeric compound precursor (Pre-2a) with the compound represented by general formula (Add-1) may be conducted by adding the polymeric compound precursor (Pre-2a), the compound represented by general formula (Add-1) and the acid component to a solvent, followed by mixing. The solvent is the same as defined for the solvent used in the atom transfer radical polymerization.

The temperature conditions for reacting the polymeric compound precursor (Pre-2a) with the compound represented by general formula (Add-1) is not particularly limited, and is, for example, about 0° C. to about 120° C. The time for reacting the polymeric compound precursor (Pre-2a) with the compound represented by general formula (Add-1) is not particularly limited, and is, for example, about 1 hour to about 72 hours.

The compound represented by general formula (Add-1) and the polymeric compound (p1) are the same as defined in the third aspect.

(Fifth Aspect: Production Method of Polymeric Compound (Third Method))

The fifth aspect of the present embodiment is a method of producing a polymeric compound, including:

(ic) a step of copolymerizing compound represented by general formula (m0-1) with a compound represented by general formula (m0-2) by living radical polymerization to obtain an alternating copolymer represented by general formula (p0) (hereafter, sometimes referred to as "step (ic)");

(iic) a step of subjecting the alternating copolymer to hydrolysis to obtain a first polymeric compound precursor represented by general formula (Pre-1a) (hereafter, sometimes referred to as "step (iic)");

(iiic) a step of reacting the first polymeric compound with a compound represented by general formula (Add-2) to obtain a second polymeric compound precursor represented by general formula (Pre-1b-2) (hereafter, sometimes referred to as "step (iiic)"); and (ivc) a step of subjecting the second polymeric compound precursor to hydrolysis to obtain a polymeric compound represented by general formula (p2) (hereafter, sometimes referred to as "step (ivc)").

Steps (ic) and (iic) are the same as defined for the aforementioned steps (ia) and (iia), respectively.

<Step (iiic)>

Step (iiic) is a step of reacting the first polymeric compound represented by general formula (Pre-1a) shown below with a compound represented by general formula (Add-2) shown below to obtain a second polymeric compound precursor represented by general formula (Pre-1b-2) shown below.

[Chemical Formula 40]

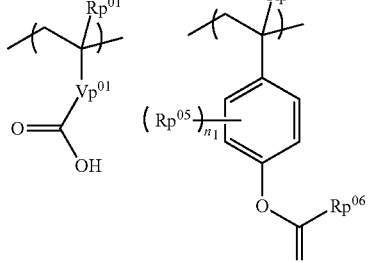

(Pre-1a)

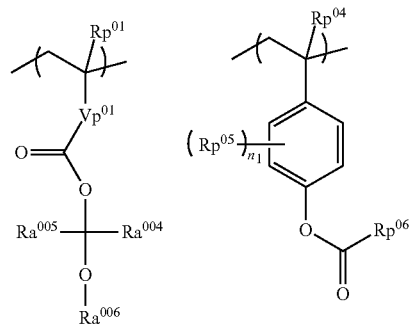

(Add-2)

(Pre-1b-2)

In the formula, $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; m represents an integer of 0 to 4; $Ra^{004}$ and $Ra^{005}$ each independently represents a hydrogen atom or an alkyl group; $Ra^{006}$ represents a hydrocarbon group, provided that $Ra^{006}$ may be bonded to $Ra^{004}$ or $Ra^{005}$ to form a ring; and X represents a halogen atom.

The polymeric compound precursor (Pre-1a) is the same as defined in the aforementioned step (iia).

In general formula (Add-2), $Ra^{004}$ and $Ra^{005}$ each independently represents a hydrogen atom or an alkyl group.

It is preferable that at least one of $Ra^{004}$ and $Ra^{005}$ represents a hydrogen atom, and it is more preferable that both of $Ra^{004}$ and $Ra^{005}$ represent a hydrogen atom.

In the case where $Ra^{004}$ or $Ra^{005}$ is an alkyl group, the alkyl group is preferably an alkyl group having 1 to 5 carbon atoms. Specific examples include linear or branched alkyl groups. Specific examples of the alkyl group include a methyl group, an ethyl group, a propyl group, an isopropyl group, an n-butyl group, an isobutyl group, a tert-butyl group, a pentyl group, an isopentyl group and a neopentyl group. Of these, a methyl group or an ethyl group is preferable, and a methyl group is more preferable.

In general formula (Add-2), examples of the hydrocarbon group for $Ra^{006}$ include a linear or branched alkyl group and a cyclic hydrocarbon group.

The linear alkyl group preferably has 1 to 5 carbon atoms, more preferably 1 to 4 carbon atoms, and still more preferably 1 or 2 carbon atoms. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5 carbon atoms. Specific examples include an isopropyl group, an isobutyl group, a tert-butyl group, an isopentyl group, a neopentyl group a 1,1-diethylpropyl group and a 2,2-dimethylbutyl group. Among these, an isopropyl group is preferable.

In the case where $Ra^{006}$ represents a cyclic hydrocarbon group, the cyclic hydrocarbon group may be an aliphatic hydrocarbon group or an aromatic hydrocarbon group, and may be polycyclic or monocyclic.

As the monocyclic aliphatic hydrocarbon group, a group in which 1 hydrogen atom has been removed from a monocycloalkane is preferable. The monocycloalkane preferably has 3 to 6 carbon atoms, and specific examples thereof include cyclopentane and cyclohexane.

As the polycyclic aliphatic hydrocarbon group, a group in which 1 hydrogen atom has been removed from a poly cycloalkane is preferable, and the polycyclic group preferably has 7 to 12 carbon atoms. Examples of the polycycloalkane include adamantane, norbornane, isobornane, tricyclodecane and tetracyclododecane.

In the case where the cyclic hydrocarbon group for $Ra^{006}$ is an aromatic hydrocarbon group, the aromatic hydrocarbon group is a hydrocarbon group having at least one aromatic ring.

The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group for $Ra^{006}$ include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group bonded to the aforementioned aromatic hydrocarbon ring or the aromatic hetero ring preferably has 1 to 4 carbon atoms, more preferably 1 or 2 carbon atoms, and most preferably 1 carbon atom.

The cyclic hydrocarbon group for $Ra^{006}$ may have a substituent. Examples of the substituent include $-R^{P1}$, $-R^{P2}-O-R^{P1}$, $-R^{P2}-CO-R^{P1}$, $-R^{P2}-CO-OR^{P1}$, $-R^{P2}-O-CO-R^{P1}$, $-R^{P2}-OH$, $-R^{P2}-CN$ or $-R^{P2}-COOH$ (hereafter, these substituents are sometimes collectively referred to as "$Ra^{05}$").

Here, $R^{P1}$ is a monovalent chain saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. Further, $R^{P2}$ is a single bond, a divalent chain saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms. However, the saturated chain hydrocarbon group, the saturated cyclic aliphatic hydrocarbon group and the aromatic hydrocarbon group for $R^{P1}$ and $R^{P2}$ may have part or all of the hydrogen atoms substituted with fluorine. The aliphatic cyclic hydrocarbon group may have 1 or more substituents of 1 kind, or 1 or more substituents of a plurality of kinds.

Examples of the monovalent chain saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic aliphatic saturated hydrocarbon group such as a bicyclo[2.2.2]octanyl group, a tricyclo[5.2.1.02,6]decanyl group, a tricyclo[3.3.1.13,7]decanyl group, a tetracyclo[6.2.1.13,6.02,7]dodecanyl group, and an adamantyl group.

Examples of the monovalent aromatic hydrocarbon group having 6 to 30 carbon atoms include a group obtained by removing one hydrogen atom from the aromatic hydrocarbon ring such as benzene, biphenyl, fluorene, naphthalene, anthracene, and phenanthrene.

In the case where $Ra^{006}$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

In general formula (Add-2), examples of the halogen atom for X include a fluorine atom, a chlorine atom, a bromine atom and an iodine atom, and a chlorine atom is preferable in terms of ease in handling.

The reaction between the polymeric compound precursor (Pre-1a) with the compound represented by general formula (Add-2) may be conducted by a conventional esterification method. For example, the reaction may be conducted by adding the polymeric compound precursor (Pre-1a), the compound represented by general formula (Add-2) and a base component (such as DBU (registered trademark)) to a solvent, followed by mixing.

The solvent is the same as defined for the solvent used in the atom transfer radical polymerization.

The temperature conditions for reacting the first polymeric compound precursor and the compound represented by general formula (Add-2) is not particularly limited, and is, for example, about 0° C. to about 120° C.

The time for reacting the first polymeric compound precursor and the compound represented by general formula (Add-2) is not particularly limited, and is, for example, about 1 hour to about 72 hours.

In formula (Pre-1b-2), $Rp^{01}$, $Vp^{01}$, $Rp^{04}$, $Rp^{05}$, $Rp^{06}$ and m are the same as defined in the aforementioned formulae (a0-1) and (a0-2).

In formula (Pre-1b-2), $Ra^{004}$, $Ra^{005}$ and $Ra^{006}$ are the same as defined for $Ra^{004}$, $Ra^{005}$ and $Ra^{006}$ in the aforementioned formula (Add-2), respectively.

in formula (Pre-1b-2), —C($Ra^{004}$)($Ra^{005}$)—O—($Ra^{006}$) is an acid dissociable group (acetal-type acid dissociable group). By the action of acid, —C($Ra^{004}$)($Ra^{005}$)—O—($Ra^{006}$) is dissociated to form a carboxy group which has a high polarity, thereby increasing the polarity.

<Step (ivc)>

Step (ivc) is a step of subjecting the polymeric compound precursor (Pre-1b-2) to hydrolysis to obtain a polymeric compound represented by general formula (p2) (hereafter, sometimes referred to as "polymeric compound (p2)").

The hydrolysis of the polymeric compound precursor (Pre-1b-2) may be conducted by adding the polymeric compound precursor (Pre-1b-2) and the base component to a solvent, followed by mixing. The solvent is the same as defined for the solvent used in the atom transfer radical polymerization.

The kind of base component, the amount of the base component used, the reaction time and the like are the same as defined in the aforementioned <step (iva)>.

In general formula (p2), $Rp^{01}$, $Vp^{01}$, $Rp^{04}$, $Rp^{05}$ and m are the same as defined in formulae (a0-1) and (a0-2).

In formula (p2), $Ra^{004}$, $Ra^{005}$ and $Ra^{006}$ are the same as defined for $Ra^{004}$, $Ra^{005}$ and $Ra^{006}$ in the aforementioned formula (Add-2), respectively.

(Sixth Aspect: Production Method of Polymeric Compound (Fourth Method))

The sixth aspect of the embodiment is a method of producing a polymeric compound, including:

(id) a step of copolymerizing compound represented by general formula (m0-1) with a compound represented by general formula (m0-2) by living radical polymerization to obtain an alternating copolymer represented by general formula (p0) (hereafter, sometimes referred to as "step (id)");

(iid) a step of subjecting the alternating copolymer to hydrolysis to obtain a polymeric compound precursor represented by general formula (Pre-2a) (hereafter, sometimes referred to as "step (iid)"); and (iiid) a step of reacting the polymeric compound precursor with a compound represented by general formula (Add-2) to obtain a polymeric compound represented by general formula (p2) (hereafter, sometimes referred to as "step (iiid)").

Steps (id) and (iid) are the same as defined for the aforementioned steps (ib) and (iib).

<Step (iiid)>

Step (iiid) is a step of reacting the first polymeric compound precursor represented by general formula (Pre-2a) with a compound represented by general formula (Add-2) to obtain a polymeric compound represented by general formula (p2) (polymeric compound (p2)).

The reaction between the polymeric compound precursor (Pre-2a) with the compound represented by general formula (Add-2) may be conducted by a conventional esterification method.

The temperature conditions for reacting the first polymeric compound precursor (Pre-2a) and the compound represented by general formula (Add-2) is not particularly limited, and is, for example, about 0° C. to about 120° C. The time for reacting the first polymeric compound precursor (Pre-2a) and the compound represented by general formula (Add-2) is not particularly limited, and is, for example, about 1 hour to about 72 hours.

The compound represented by general formula (Add-2) and the polymeric compound (p2) is the same as defined in the fifth aspect.

The alternating copolymer according to the present embodiment described above is useful for producing a polymeric compound usable as a base material component of a resist composition. It is presumed that, by copolymerizing a compound (monomer) (m0-1) in which the hydroxy styrene skeleton is protected by a group that can be deprotected with an acid component and a compound (monomer) (m0-2) having a specific imide structure, the polymerization may be controlled by the electronic and chemical properties, and the variation of each structural unit of the obtained alternating copolymer may be suppressed. Therefore, by using the alternating copolymer according to the present embodiment to produce a polymeric compound, and using the polymeric compound as a base material component of a resist composition, lithography properties may be improved.

(Method of Forming a Resist Pattern)

(Seventh Aspect)

A seventh aspect of the present embodiment is a method of forming a resist pattern, including:

(ia) a step of copolymerizing a compound represented by general formula (m0-1) with a compound represented by general formula (m0-2) by living radical polymerization to obtain an alternating copolymer represented by general formula (p0) (hereafter, sometimes referred to as "step (ia)");

(iia) a step of subjecting the alternating copolymer to hydrolysis to obtain a first polymeric compound precursor represented by general formula (Pre-1a) shown below (hereafter, sometimes referred to as "step (iia)");

(iiia) a step of reacting the first polymeric compound precursor with a compound represented by general formula (Add-1) to obtain a second polymeric compound precursor represented by general formula (Pre-1b-1) (hereafter, sometimes referred to as "step (ma)");

(iva) a step of subjecting the second polymeric compound precursor to hydrolysis to obtain a polymeric compound (A01) represented by general formula (p1) shown below (hereafter, sometimes referred to as "step (iva)");

(va) a step of mixing the polymeric compound (A01) with an organic solvent to prepare a resist composition (hereafter, sometimes referred to as "step (va)");

(via) a step of forming a resist film on a substrate using the resist composition (hereafter, sometimes referred to as "step (via)"); and (viia) a step of exposing the resist film, and developing the exposed resist film to form a resist pattern (hereafter, sometimes referred to as "step (viia)")

<Steps (ia) to (iva)>

In the seventh aspect, steps (ia) to (iva) are the same as defined for steps (ia) to (iva) in the method of producing a polymeric compound according to the third aspect.

<Step (va)>

Step (va) is a step of mixing the polymeric compound (A01) with an organic solvent to prepare a resist composition.

[Resist Composition]

The resist composition used in the present embodiment is a resist composition which generates acid upon exposure and exhibits changed solubility in a developing solution under action of acid, and which includes a base component (A) which exhibits changed solubility in a developing solution under action of acid (hereafter, also referred to as "component (A)"). The polymeric compound (A01) is contained in the component (A). The component (A) may contain a polymeric compound (A1) (hereafter, sometimes referred to as "component (A1)") other than the polymeric compound (A01).

When a resist film is formed using the resist composition according to the present embodiment and the formed resist film is subjected to a selective exposure, acid is generated at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions of the resist film are dissolved and removed to form a positive-tone resist pattern in the case of a positive resist, whereas the unexposed portions of the resist film are dissolved and removed to form a negative-tone resist pattern in the case of a negative resist.

In the present specification, a resist composition which forms a positive resist pattern by dissolving and removing the exposed portions of the resist film is called a positive resist composition, and a resist composition which forms a negative resist pattern by dissolving and removing the unexposed portions of the resist film is called a negative resist composition.

The resist composition used in the present embodiment may be either a positive resist composition or a negative resist composition.

Further, in the present embodiment, the resist composition may be applied to an alkali developing process using an alkali developing solution in the developing treatment, or a solvent developing process using a developing solution containing an organic solvent (organic developing solution) in the developing treatment.

Therefore, in the present embodiment, the resist composition is a "positive resist composition for alkali developing process" which forms a positive-tone resist pattern in an alkali developing process, and is a "negative resist composition for solvent developing process" which forms a negative-tone resist pattern in a solvent developing process.

In the present embodiment, the resist composition is capable of generating acid upon exposure. The acid may be generated from the component (A) upon exposure, or the acid may be generated from an additive component other than the component (A) upon exposure.

Specifically, the resist composition may be a resist composition (1) containing an acid generator component (B) which generates acid upon exposure (hereafter, referred to as "component (B)"; a resist composition (2) in which the component (A) is a component which generates acid upon exposure; or a resist composition (3) in which the component (A) is a component which generates acid upon exposure, and further containing an acid generator component (B).

That is, when the resist composition of the present invention is the aforementioned resist composition (2) or (3), the component (A) is a "base component which generates acid upon exposure and exhibits changed solubility in a developing solution under action of acid".

When the resist composition of the present invention is the aforementioned resist composition (2) or (3), the component (A) is a "base component which generates acid upon exposure and exhibits changed solubility in a developing solution under action of acid".

In the present embodiment, the resist composition is preferably the aforementioned resist composition (1).

In the present embodiment, examples of the resist composition include a resist composition containing a component (A), a component (B) and a component (S).

<Component (A)>

In the resist composition, the component (A) is a base component which exhibits changed solubility in a developing solution under action of acid, and contains the aforementioned component (A0). By using the component (A0), the polarity of the base component before and after exposure is changed. Therefore, a good development contrast may be achieved not only in an alkali developing process, but also in a solvent developing process.

Further, as described above, since the component (A0) is produced by the aforementioned steps, variation of each structural unit is suppressed, and a resist pattern exhibiting good lithography properties may be formed.

in the case of applying an alkali developing process, the component (A0) is hardly soluble in an alkali developing solution prior to exposure, but when acid is generated from the component (B) upon exposure, the action of this acid causes an increase in the polarity of the base component, thereby increasing the solubility of the component (A0) in an alkali developing solution. Therefore, in the formation of a resist pattern, by conducting selective exposure of a resist film formed by applying the resist composition to a substrate, the exposed portions of the resist film change from an insoluble state to a soluble state in an alkali developing solution, whereas the unexposed portions of the resist film remain insoluble in an alkali developing solution, and hence, a positive-tone resist pattern is formed by alkali developing.

On the other hand, in the case of a solvent developing process, the component (A0) exhibits high solubility in an organic developing solution prior to exposure, and when acid is generated from the component (B) upon exposure, the polarity of the component (A0) is increased by the action of the generated acid, thereby decreasing the solubility of the component (A0) in an organic developing solution. Therefore, in the formation of a resist pattern, by conducting selective exposure of a resist film formed by applying the resist composition to a substrate, the exposed portions of the resist film changes from a soluble state to an insoluble state in an organic developing solution, whereas the unexposed portions of the resist film remain soluble in an organic developing solution. As a result, by conducting development using an organic developing solution, a contrast can be made between the exposed portions and unexposed portions, thereby forming a negative resist pattern.

In the resist composition of the present embodiment, as the component (A), one kind of compound may be used, or two or more kinds of compounds may be used in combination.

Component (A1)

The component (A1) is a polymeric compound which does not fall under the definition of the component (A0), and examples thereof include a polymeric compound having at least one of a structural unit (a1) containing an acid decomposable group that exhibits increased polarity by the action of acid, a structural unit (a2) containing a lactone-containing cyclic group, an —$SO_2$— containing cyclic group or a carbonate-containing cyclic group, a structural unit (a3) containing a polar group-containing aliphatic hydrocarbon group (provided that the structural units that fall under the definition of structural units (a1) and (a2) are excluded), a structural unit (a10) containing a hydroxystyrene skeleton, and a structural unit (a4) containing an acid non-dissociable, aliphatic cyclic group.

<<Structural Unit (a1)>>

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group ($-SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

The "acid dissociable group" refers to both (i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in an alkali developing solution changes, and the solubility in an alkali developing solution is relatively increased, whereas the solubility in an organic developing solution is relatively decreased.

Examples of the acid dissociable group include groups which have been proposed as acid dissociable groups for the base resin of a conventional chemically amplified resist composition.

Specific examples of acid dissociable groups for the base resin of a conventional chemically amplified resist composition include "acetal-type acid dissociable group", "tertiary alkyl ester-type acid dissociable group" and "tertiary alkyloxycarbonyl acid dissociable group" described below.

The acetal-type acid dissociable group is the same as defined for the acetal-type acid dissociable group represented by $-C(Ra^{004})(Ra^{005})-O-(Ra^{006})$ in the aforementioned formula (Pre-1b-2).

The tertiary alkyl ester-type acid dissociable group is the same as defined for the tertiary alkyl ester-type acid dissociable group represented by $-C(Ra^{001})(Ra^{002})(Ra^{003})$ in the aforementioned formula (Pre-1b-1).

Tertiary Alkyloxycarbonyl Acid Dissociable Group

Examples of the acid dissociable group for protecting a hydroxy group as a polar group include the acid dissociable group represented by general formula (a1-r-3) shown below (hereafter, for convenience, referred to as "tertiary alkyloxycarbonyl-type acid dissociable group").

[Chemical Formula 41]

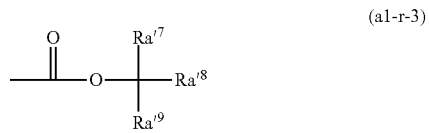

(a1-r-3)

In the formula, $Ra'^7$ to $Ra'^9$ each independently represents an alkyl group.

In formula (a1-r-3), each of $Ra'^7$ to $Ra'^9$ is preferably an alkyl group having 1 to carbon atoms, and more preferably an alkyl group having 1 to 3 carbon atoms.

Further, the total number of carbon atoms in the alkyl groups is preferably 3 to 7, more preferably 3 to 5, and still more preferably 3 or 4.

Examples of the structural unit (a1) include a structural unit derived from an acrylate ester which may have the hydrogen atom bonded to the carbon atom on the α-position substituted with a substituent; a structural unit derived from an acrylamide; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within $-C(=O)-OH$ is protected with a substituent containing an acid decomposable group.

As the structural unit (a1), a structural unit derived from an acrylate ester which may have the hydrogen atom bonded to the carbon atom on the α-position substituted with a substituent is preferable.

Specific examples of preferable structural units for the structural unit (a1) include structural units represented by general formula (a1-1) or (a1-2) shown below.

[Chemical Formula 42]

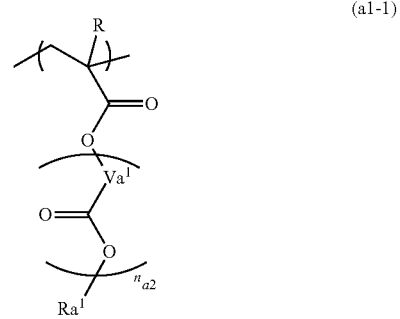

(a1-1)

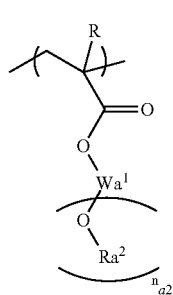
(a1-2)

In the formula, R represents a hydrogen atom, an alkyl group of 1 to 5 carbon atoms or a halogenated alkyl group of 1 to 5 carbon atoms; $Va^1$ represents a divalent hydrocarbon group optionally having an ether bond; $n_{a1}$ represents an integer of 0 to 2; $Ra^1$ is an acid dissociable group represented by the aforementioned general formula (a1-r-1), (a1-r2-1), (a1-r2-2), (a1-r2-3) or (a1-r2-4). $Wa^1$ represents a hydrocarbon group having a valency of $n_{a2}+1$; $n_{a2}$ represents an integer of 1 to 3; and $Ra^2$ represents an acid dissociable group represented by the aforementioned general formula (a1-r-1) or (a1-r-3).

In the aforementioned formula (a1-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In formula (a1-1), the divalent hydrocarbon group for $V^1$ may be either an aliphatic hydrocarbon group or an aromatic hydrocarbon group.

The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear aliphatic hydrocarbon group preferably has 1 to 10 carbon atoms, more preferably 1 to 6 carbon atoms, still more preferably 1 to 4 carbon atoms, and most preferably 1 to 3 carbon atoms. As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$-] and a pentamethylene group [—(CH$_2$)$_5$—].

The branched aliphatic hydrocarbon group preferably has 2 to 10 carbon atoms, more preferably 3 to 6, still more preferably 3 or 4, and most preferably 3. As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. The linear or branched aliphatic hydrocarbon group is the same as defined for the aforementioned linear aliphatic hydrocarbon group or the aforementioned branched aliphatic hydrocarbon group.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group as the divalent hydrocarbon group for $Va^1$ is a hydrocarbon group having an aromatic ring.

The aromatic hydrocarbon group preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group. Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In formula (a1-1), $Ra^1$ is an acid dissociable group represented by the aforementioned formula (a1-r-1), (a1-r2-1), (a1-r2-2), (a1-r2-3) or (a1-r2-4).

In the aforementioned formula (a1-2), the hydrocarbon group for $Wa^1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. The valency of $n_{a2}+1$ is preferably divalent, trivalent or tetravalent, and divalent or trivalent is more preferable.

In formula (a1-2), $Ra^2$ represents an acid dissociable group represented by the aforementioned formula (a1-r-1) or (a1-r-3).

Specific examples of structural unit represented by formula (a1-1) are shown below. In the formulae shown below, R" represents a hydrogen atom, a methyl group or a trifluoromethyl group.

[Chemical Formula 43]

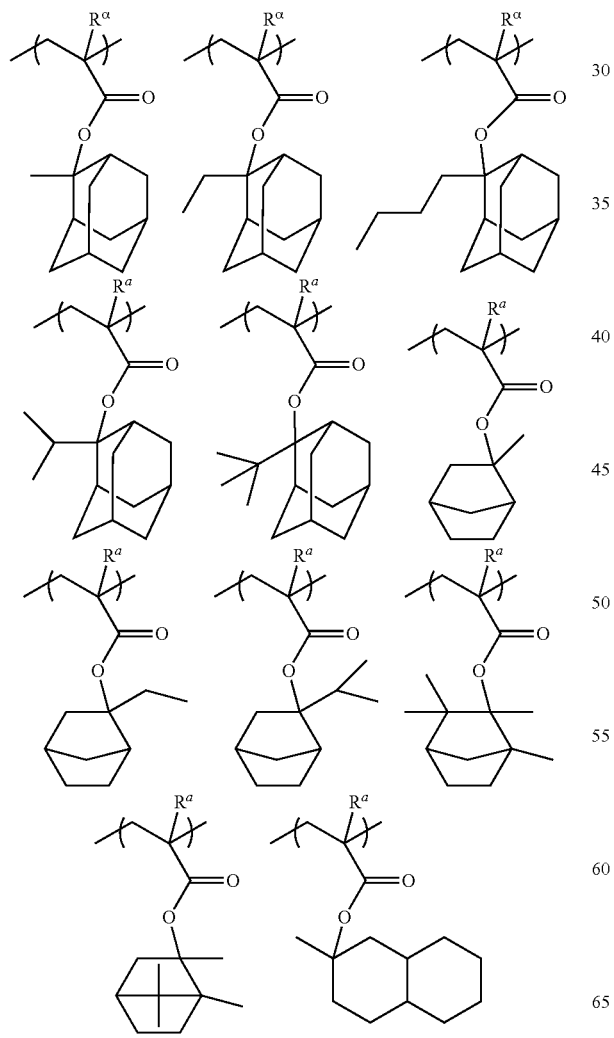

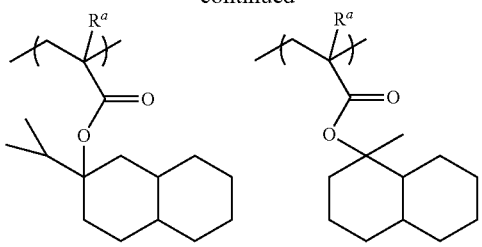

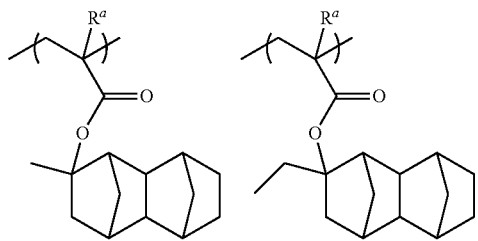

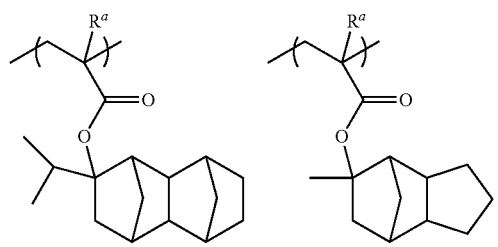

-continued

[Chemical Formula 44]

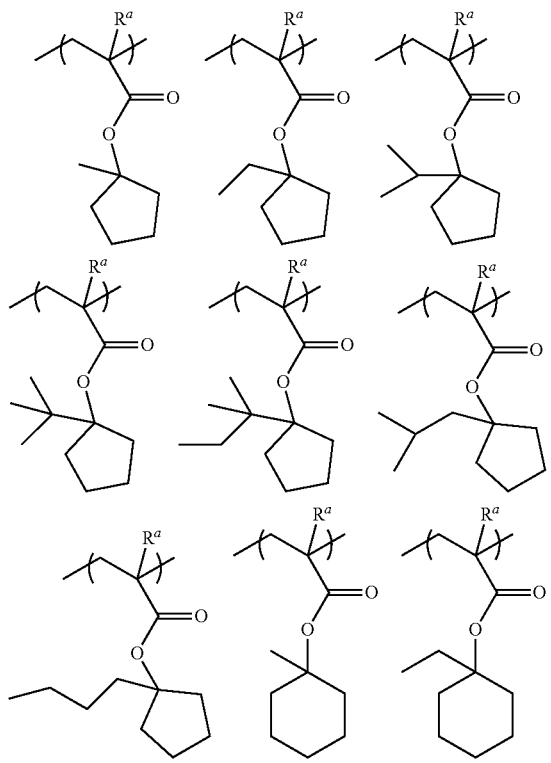

[Chemical Formula 45]
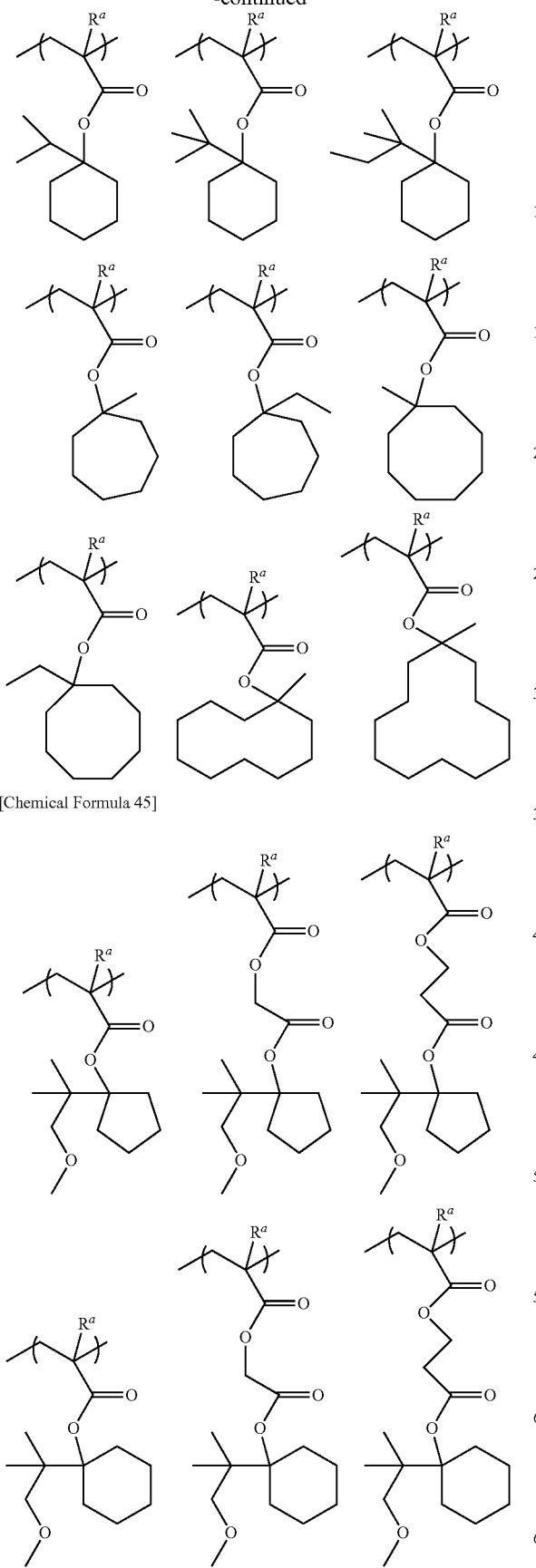
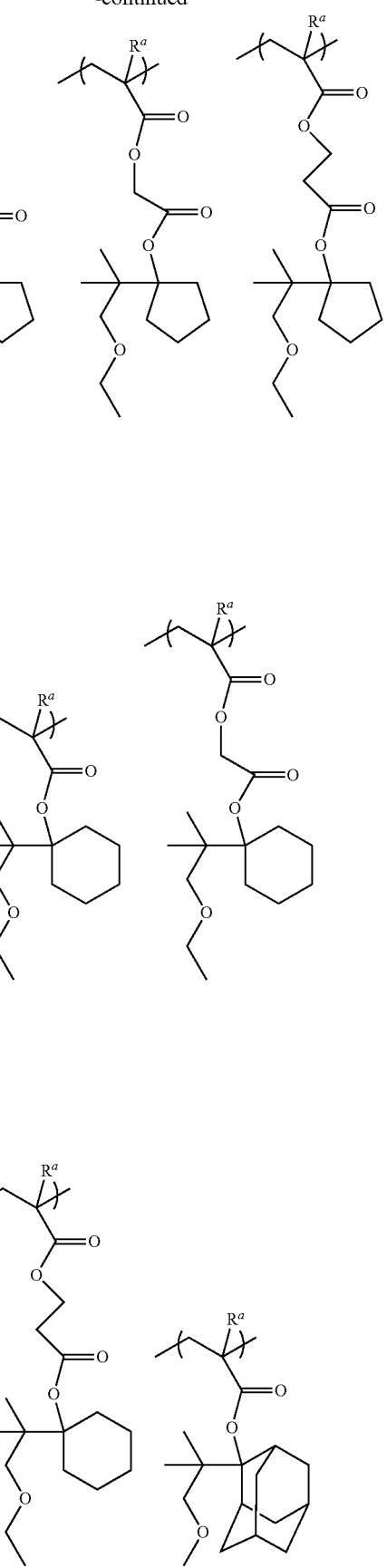

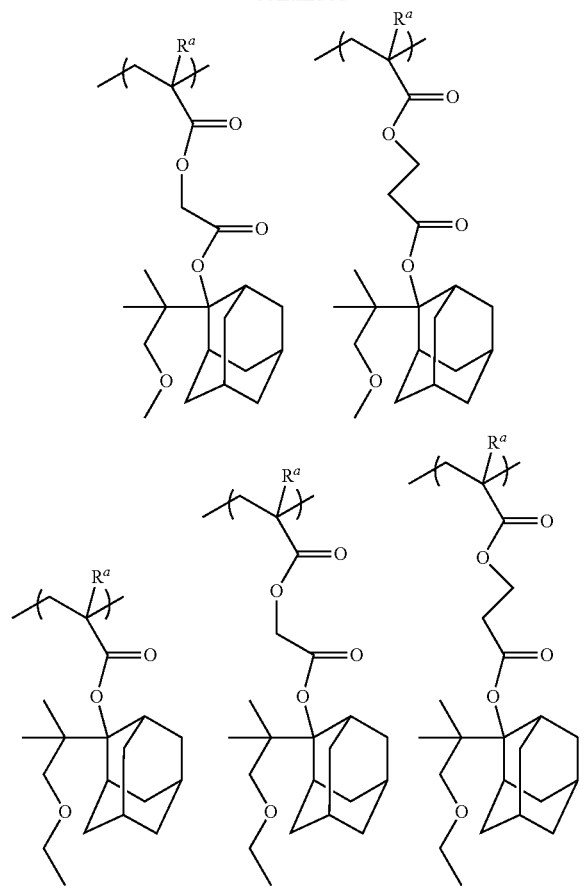
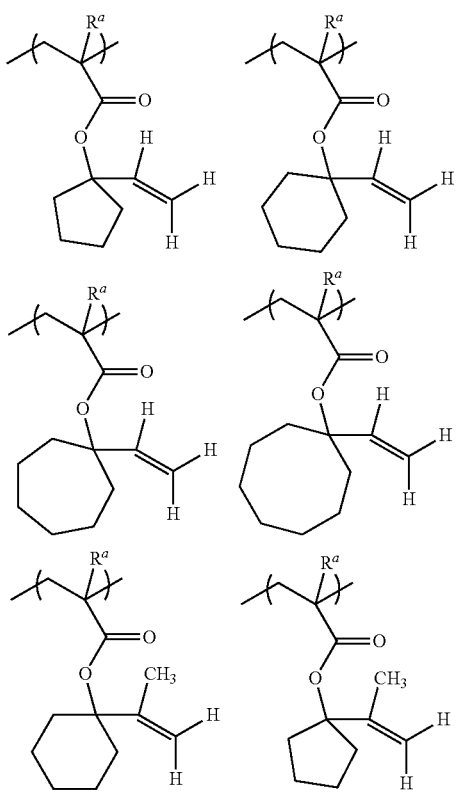
[Chemical Formula 46]
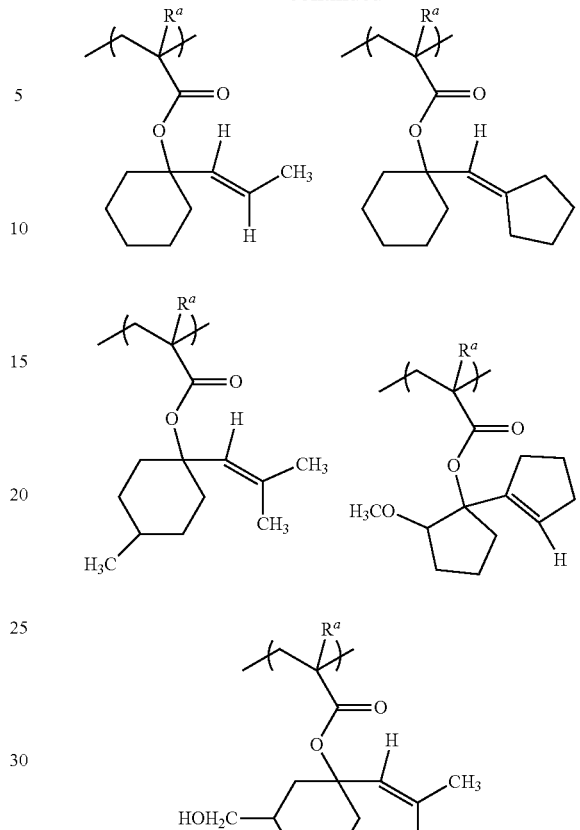
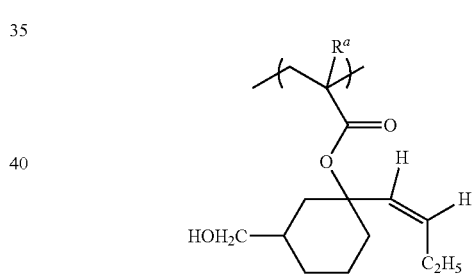
[Chemical Formula 47]
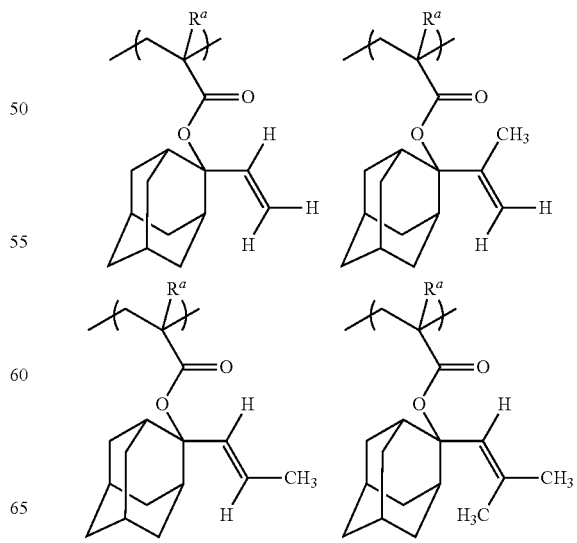

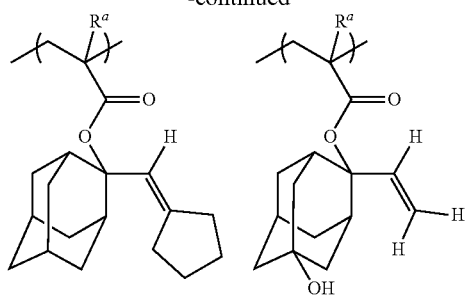
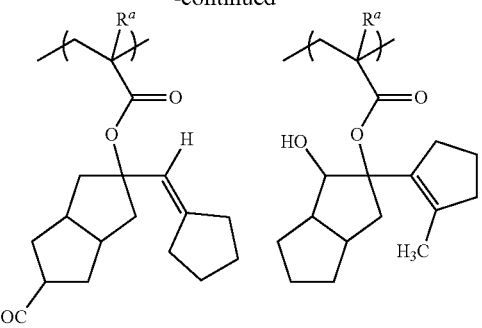
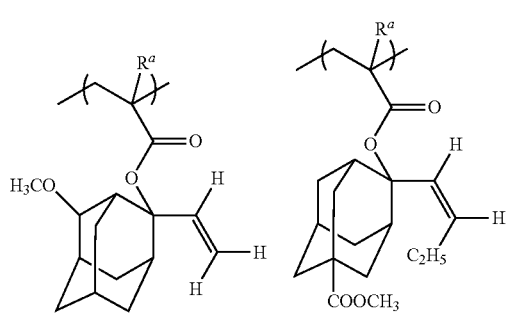
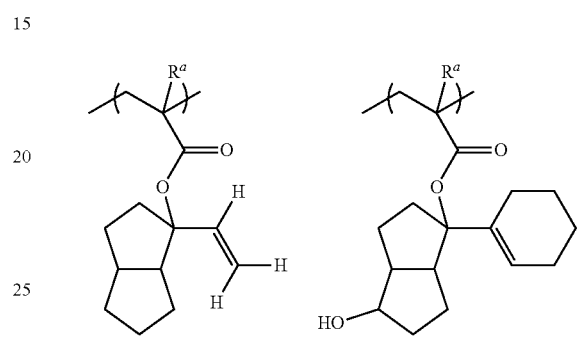
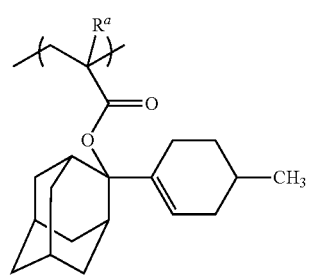
[Chemical Formula 48]
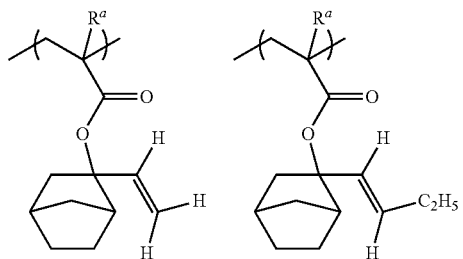
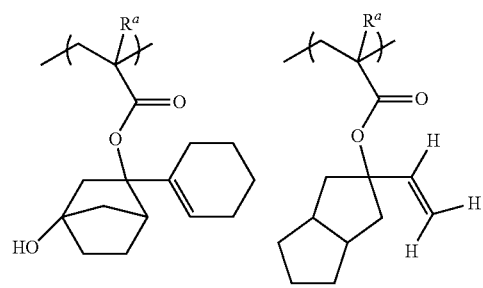
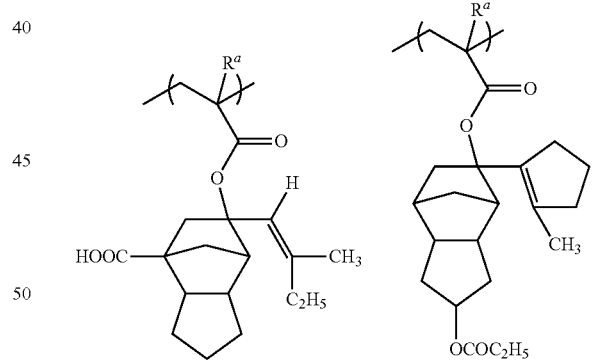
[Chemical Formula 49]
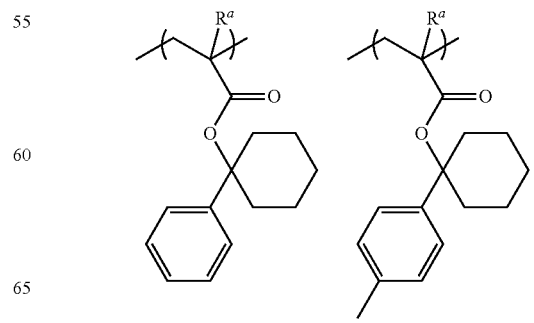

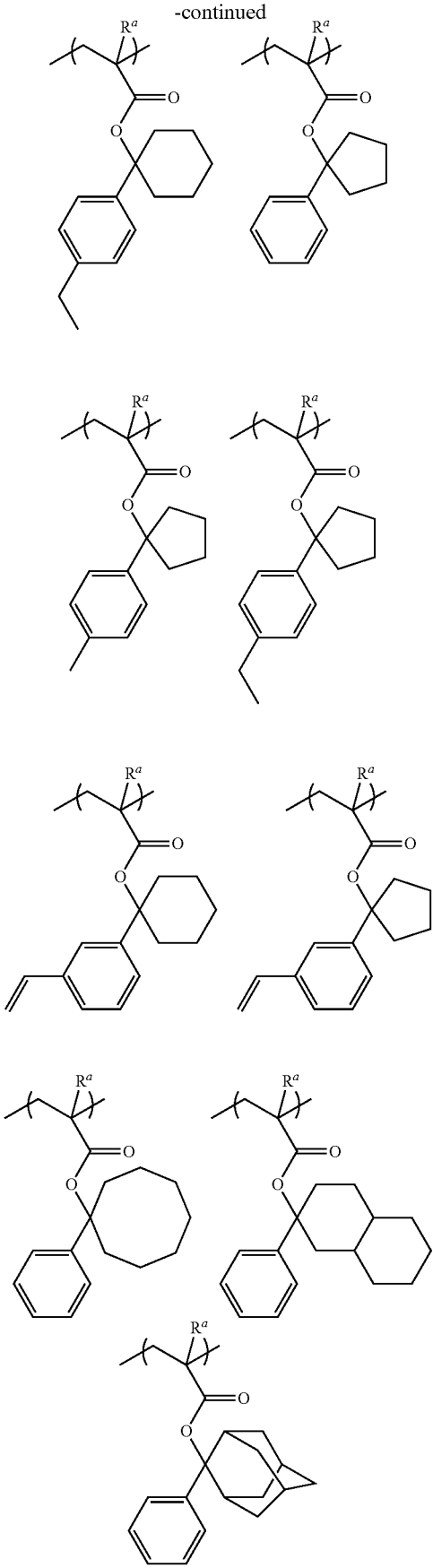
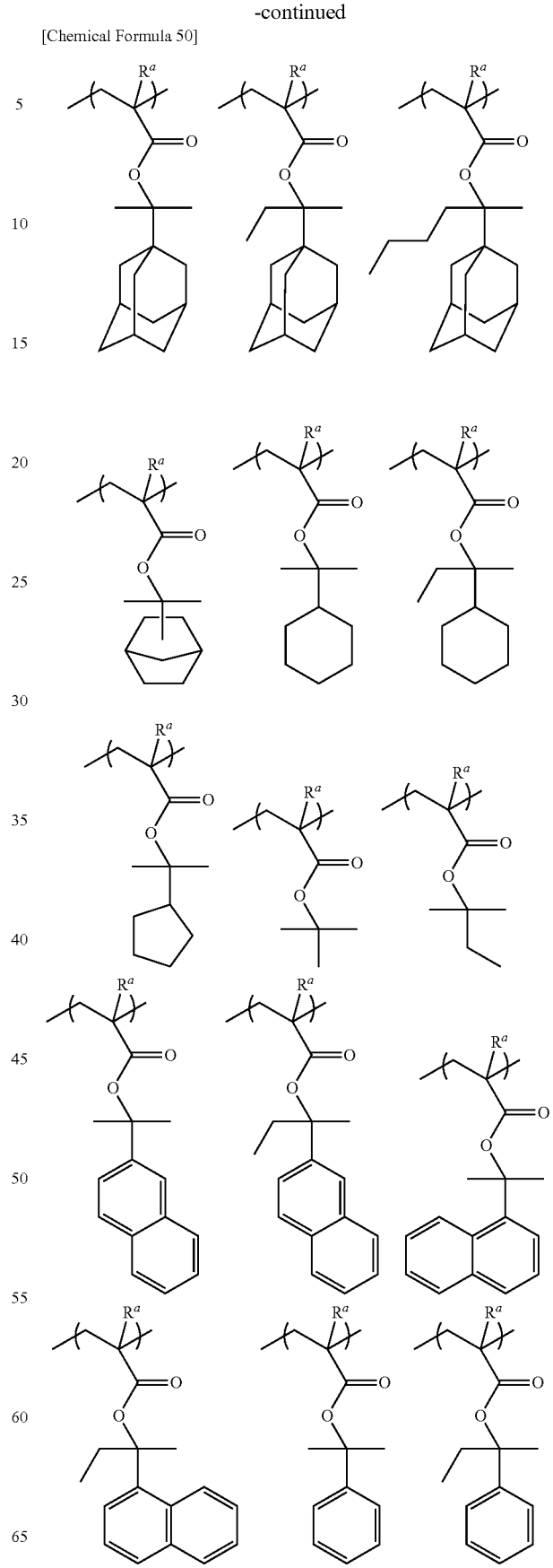
[Chemical Formula 50]

[Chemical Formula 51]
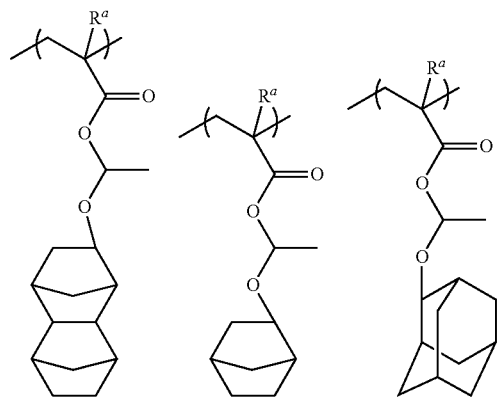
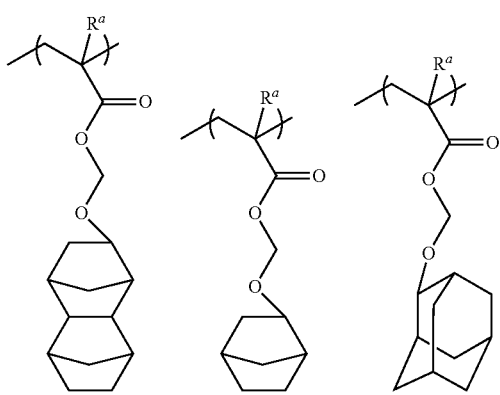
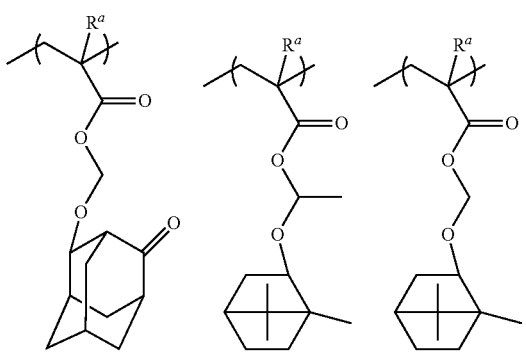
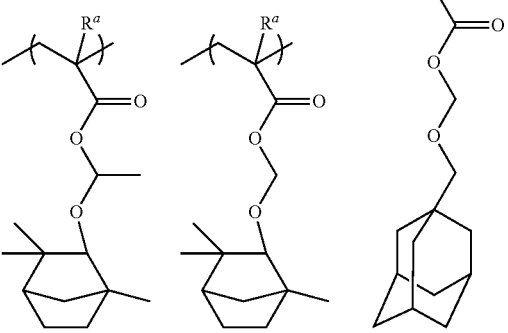
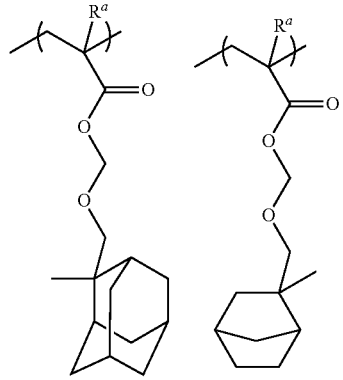
[Chemical Formula 52]
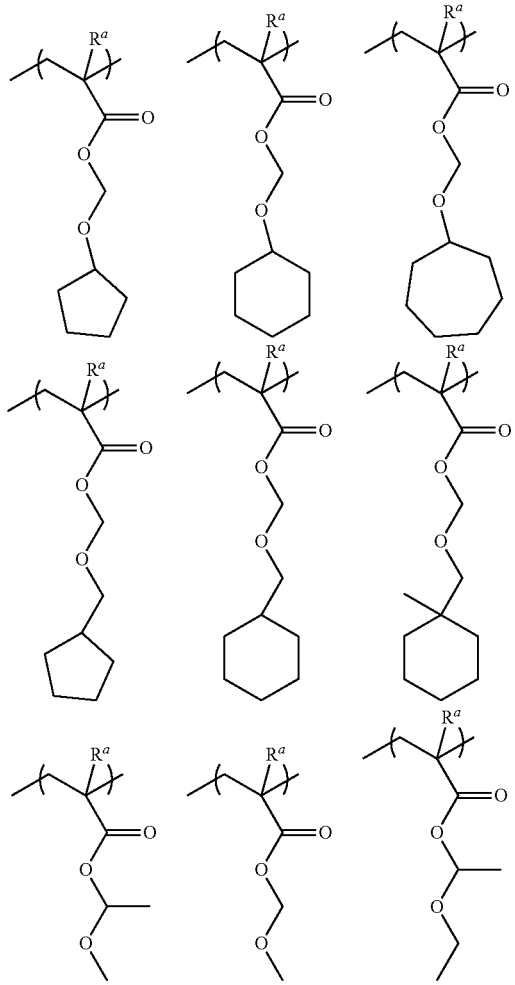

[Chemical Formula 53]
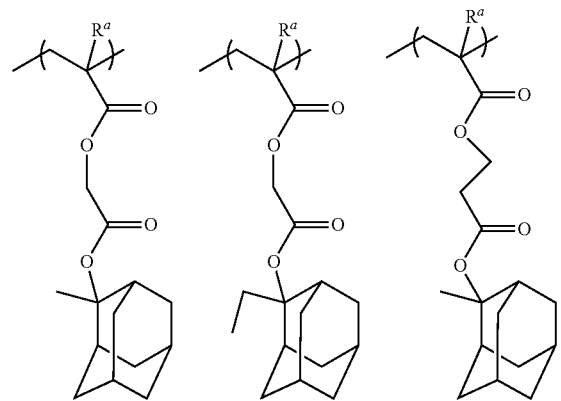
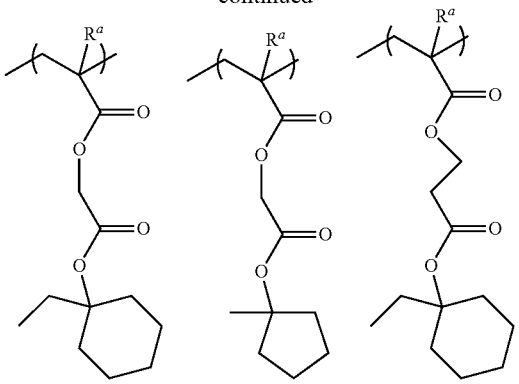
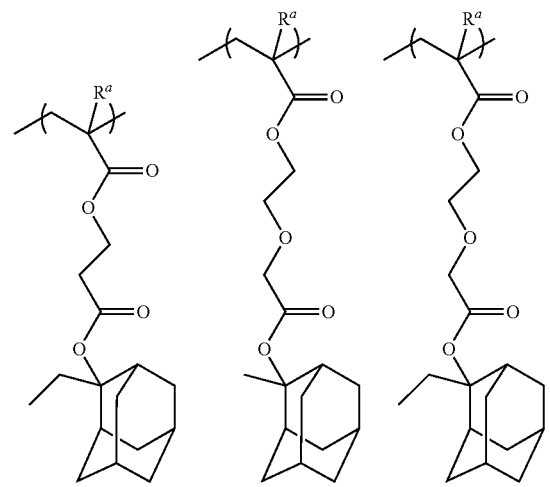
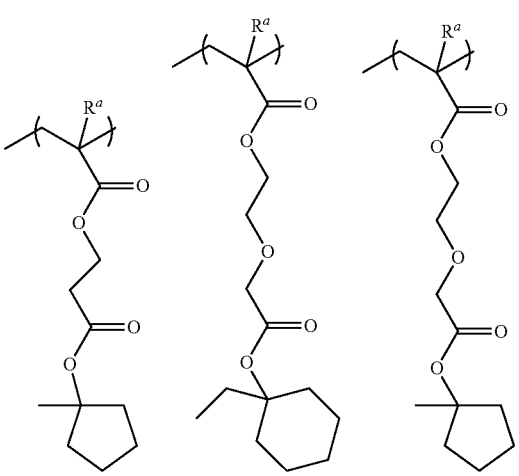
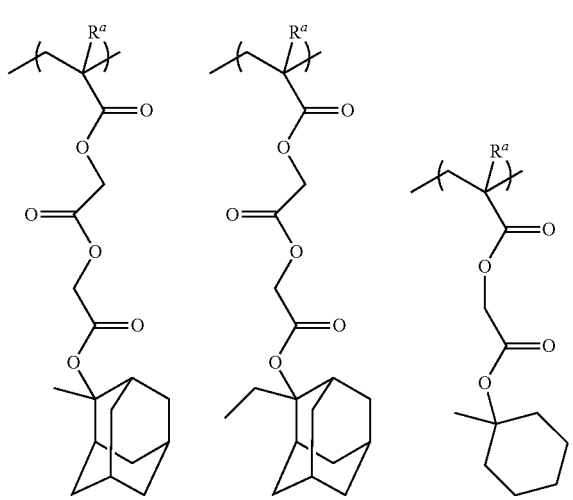
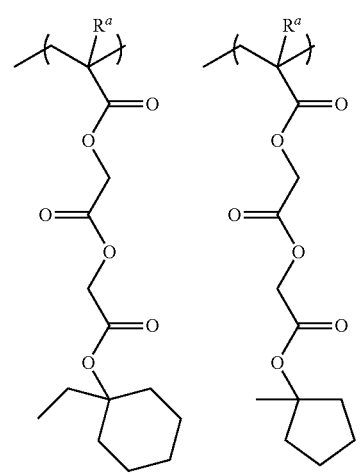
Specific examples of structural unit represented by formula (a1-2) are shown below.

[Chemical Formula 54]

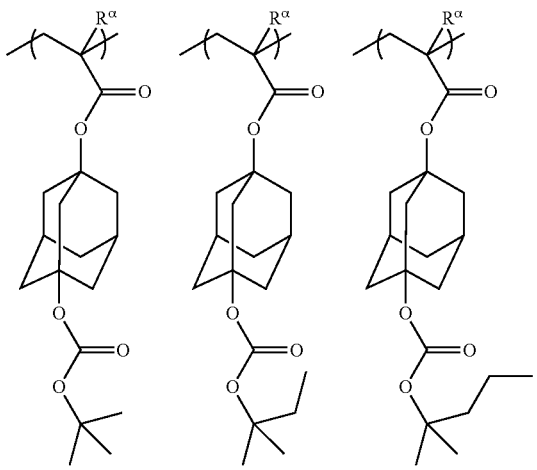

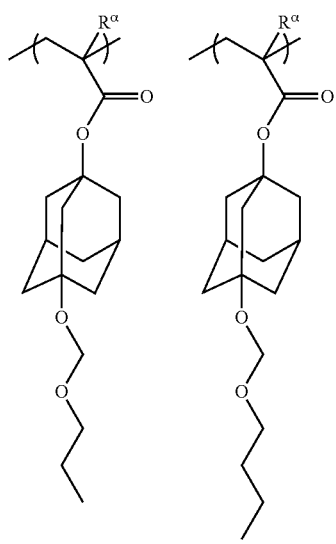

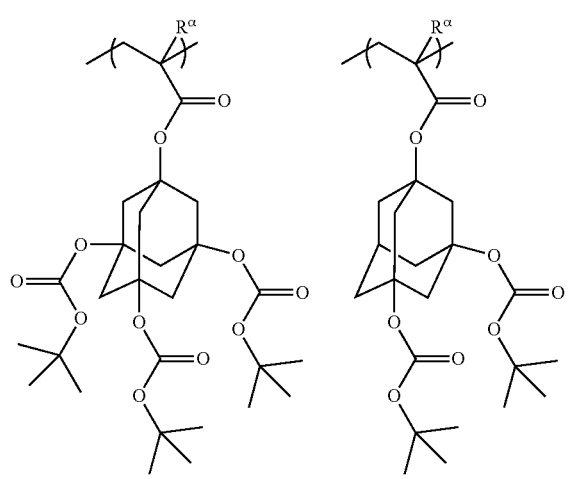

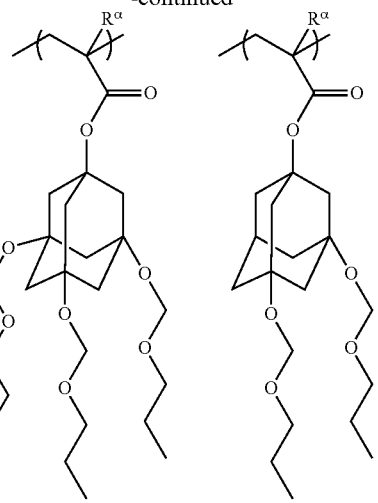

-continued

As the structural unit (a1) contained in the component (A1), 1 type of structural unit may be used, or 2 or more types may be used.

In the component (A1), the amount of the structural unit (a1) based on the combined total (100 mol %) of all structural units constituting the component (A1) is preferably 5 to 80 mol %, more preferably 10 to 75 mol %, and still more preferably 20 to 60 mol %.

When the amount of the structural unit (a1) is at least as large as the lower limit of the above-mentioned preferable range, various lithography properties such as sensitivity, resolution and roughness may be improved. On the other hand, when the amount of the structural unit (a1) is no more than the upper limit of the above-mentioned preferable range, a good balance may be achieved with the other structural units, and the lithography properties may be improved.

<<Structural Unit (a2)>>

The structural unit (a2) is a structural unit which contains a lactone-containing cyclic group, an —SO₂— containing cyclic group or a carbonate-containing cyclic group (provided that structural units which fall under the definition of the structural unit (a1) are excluded).

When the component (A1) is used for forming a resist film, the lactone-containing cyclic group, the —SO₂— containing cyclic group or the carbonate-containing cyclic group within the structural unit (a2) is effective in improving the adhesion between the resist film and the substrate. In addition, by virtue of containing the structural unit (a2), for example, the acid diffusion length is appropriately adjusted, the adhesion of the resist film to the substrate is enhanced, or the solubility during development is appropriately adjusted. As a result, the lithography properties are enhanced.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group for the structural unit (a2) is not particularly limited, and an arbitrary structural unit may be used. Specific examples include groups represented by general formulae (a2-r-1) to (a2-r-7) shown below.

[Chemical Formula 55]

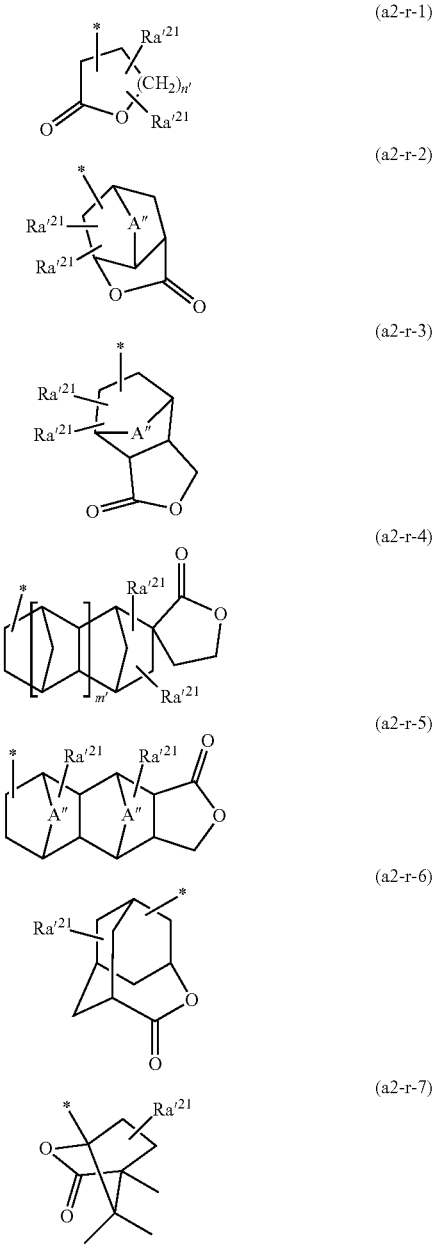

In the formulae, each $Ra'^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —SO$_2$— containing cyclic group; A" represents an oxygen atom (—O—), a sulfur atom (—S—) or an alkylene group of 1 to 5 carbon atoms which may contain an oxygen atom or a sulfur atom; n' represents an integer of 0 to 2; and m' represents 0 or 1.

In formulae (a2-r-1) to (a2-r-7), the alkyl group for $Ra'^{21}$ is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly desirable.

The alkoxy group for $Ra'^{21}$ is preferably an alkoxy group of 1 to 6 carbon atoms. Further, the alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{21}$, a fluorine atom, chlorine atom, bromine atom and iodine atom can be given. Among these, a fluorine atom is preferable.

Examples of the halogenated alkyl group for $Ra'^{21}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

With respect to —COOR" and —OC(=O)R" for $Ra'^{21}$, R" represents a hydrogen atom, an alkyl group, a lactone-containing cyclic group, a carbonate-containing cyclic group or an —SO$_2$— containing cyclic group.

The alkyl group for R" may be linear, branched or cyclic, and preferably has 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane which may or may not be substituted with a fluorine atom or a fluorinated alkyl group. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

Examples of the lactone-containing cyclic group for R" include groups represented by the aforementioned general formulae (a2-r-1) to (a2-r-7).

The carbonate-containing cyclic group for R" is the same as defined for the carbonate-containing cyclic group described later. Specific examples of the carbonate-containing cyclic group include groups represented by general formulae (ax3-r-1) to (ax3-r-3).

The —SO$_2$— containing cyclic group for R" is the same as defined for the —SO$_2$-containing cyclic group described later. Specific examples of the —SO$_2$— containing cyclic group include groups represented by general formulae (a5-r-1) to (a5-r-4).

The hydroxyalkyl group for $Ra'^{21}$ preferably has 1 to 6 carbon atoms, and specific examples thereof include the alkyl groups for $Ra'^{21}$ in which at least one hydrogen atom has been substituted with a hydroxy group.

In formulae (a2-r-2), (a2-r-3) and (a2-r-5), as the alkylene group of 1 to 5 carbon atoms represented by A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A″, an alkylene group of 1 to 5 carbon atoms or —O— is preferable, more preferably an alkylene group of 1 to 5 carbon atoms, and most preferably a methylene group.

Specific examples of the groups represented by the aforementioned general formulae (a2-r-1) to (a2-r-7) are shown below.

[Chemical Formula 56]

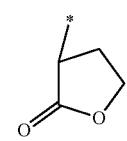 (r-lc-1-1)

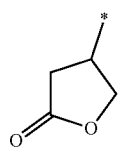 (r-lc-1-2)

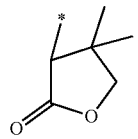 (r-lc-1-3)

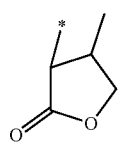 (r-lc-1-4)

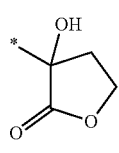 (r-lc-1-5)

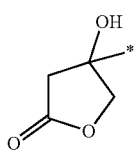 (r-lc-1-6)

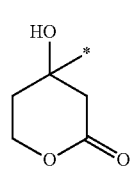 (r-lc-1-7)

-continued

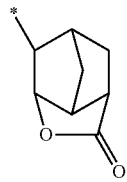 (r-lc-2-1)

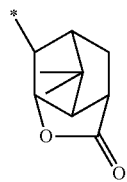 (r-lc-2-2)

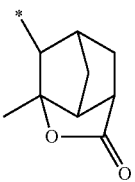 (r-lc-2-3)

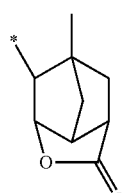 (r-lc-2-4)

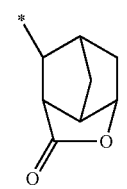 (r-lc-2-5)

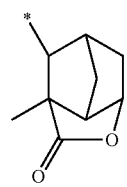 (r-lc-2-6)

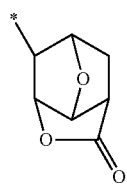 (r-lc-2-7)

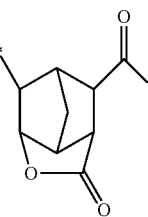 (r-lc-2-8)

-continued
(r-lc-2-9)
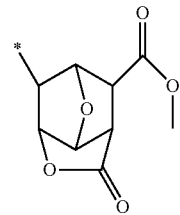
(r-lc-2-10)
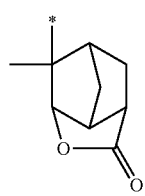
(r-lc-2-11)
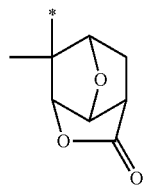
(r-lc-2-12)
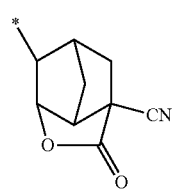
(r-lc-2-13)
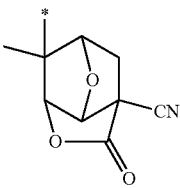
(r-lc-2-14)
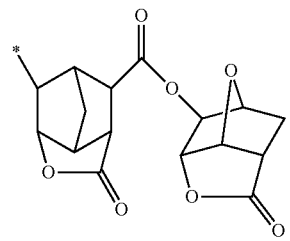
(r-lc-2-15)
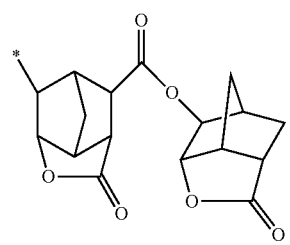
-continued
(r-lc-2-16)
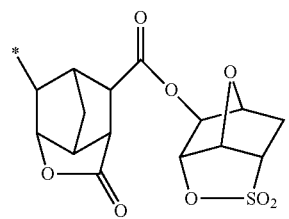
(r-lc-2-17)
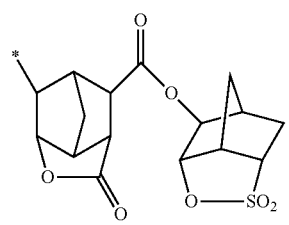
(r-lc-2-18)
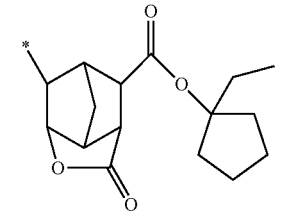
(r-lc-3-1)
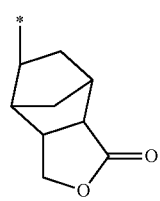
(r-lc-3-2)
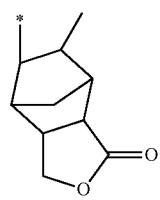
(r-lc-3-3)
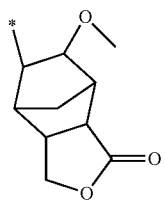
(r-lc-3-4)
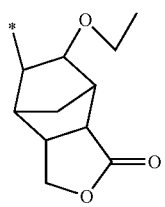

-continued (r-lc-3-5)

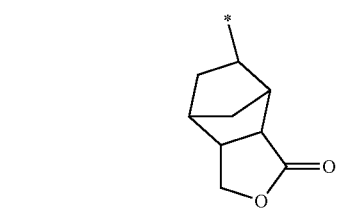

[Chemical Formula 57]

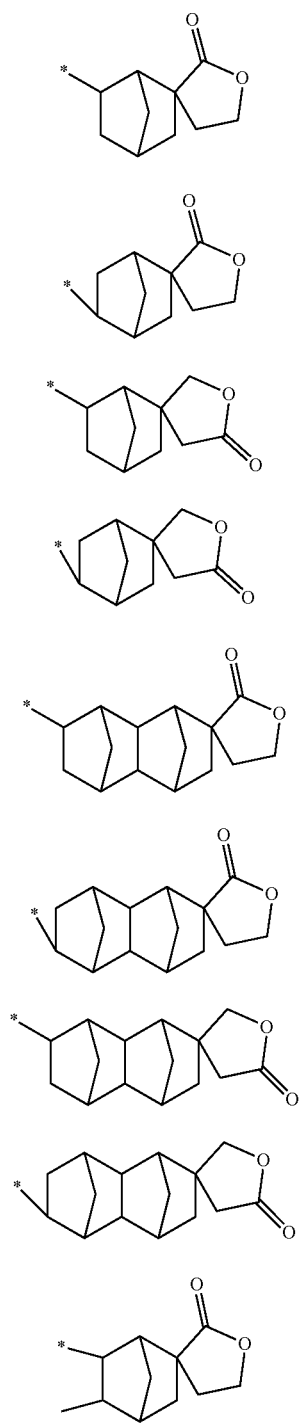

(r-lc-4-1)

(r-lc-4-2)

(r-lc-4-3)

(r-lc-4-4)

(r-lc-4-5)

(r-lc-4-6)

(r-lc-4-7)

(r-lc-4-8)

(r-lc-4-9)

-continued (r-lc-5-1)

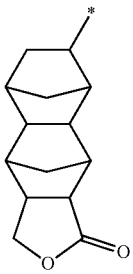

(r-lc-5-2)

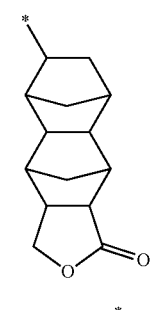

(r-lc-5-3)

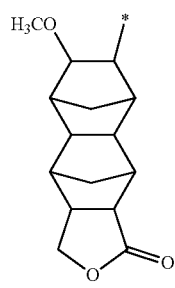

(r-lc-5-4)

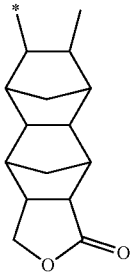

(r-lc-6-1)

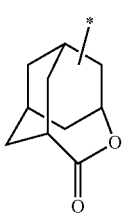

(r-lc-7-1)

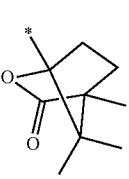

An "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group. The ring containing —$SO_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$-containing cyclic group may be either a monocyclic group or a polycyclic group. As the —SO$_2$— containing cyclic group, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable.

More specific examples of the —SO$_2$— containing cyclic group include groups represented by general formulas (a5-r-1) to (a5-r-4) shown below.

[Chemical Formula 58]

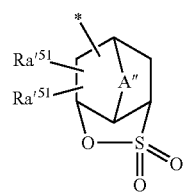
(a5-r-1)

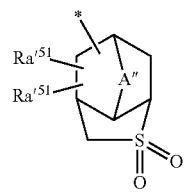
(a5-r-2)

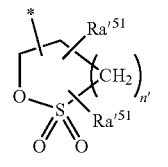
(a5-r-3)

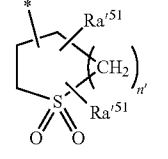
(a5-r-4)

In the formulae, each Ra'$^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —SO$_2$— containing cyclic group; A" represents an oxygen atom, a sulfur atom or an alkylene group of 1 to 5 carbon atoms which may contain an oxygen atom or a sulfur atom; and n' represents an integer of 0 to 2.

In general formulae (a5-r-1) and (a5-r-2), A" is the same as defined for A" in general formulae (a2-r-2), (a2-r-3) and (a2-r-5).

Examples of the alkyl group, alkoxy group, halogen atom, halogenated alkyl group, —COOR", —OC(=O)R" and hydroxyalkyl group for Ra'$^{51}$ include the same groups as those described above in the explanation of Ra'$^{21}$ in the general formulas (a2-r-1) to (a2-r-7).

Specific examples of the groups represented by the aforementioned general formulae (a5-r-1) to (a5-r-4) are shown below. In the formulae shown below, "Ac" represents an acetyl group.

[Chemical Formula 59]

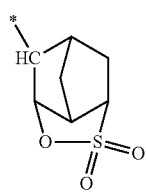
(r-sl-1-1)

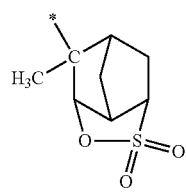
(r-sl-1-2)

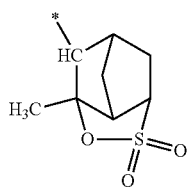
(r-sl-1-3)

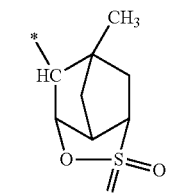
(r-sl-1-4)

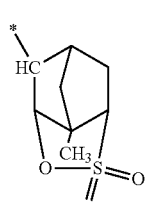
(r-sl-1-5)

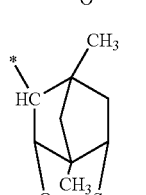
(r-sl-1-6)

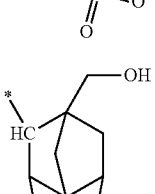
(r-sl-1-7)

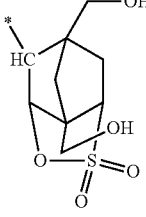

-continued
(r-sl-1-8)
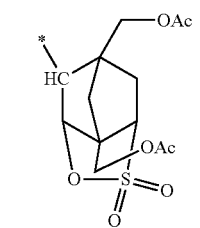
(r-sl-1-9)
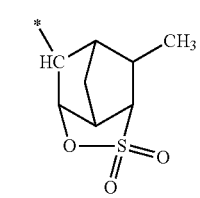
(r-sl-1-10)
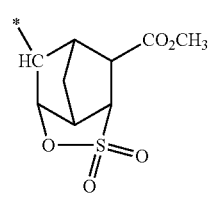
(r-sl-1-11)
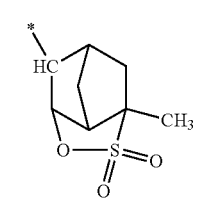
(r-sl-1-12)
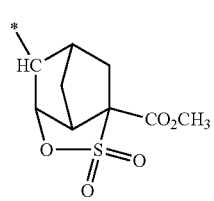
(r-sl-1-13)
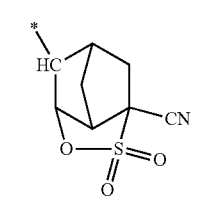
(r-sl-1-14)
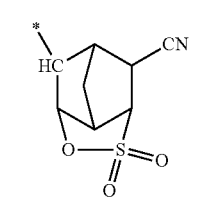
(r-sl-1-15)
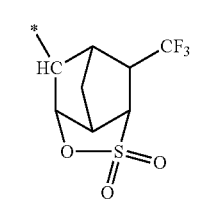
-continued
(r-sl-1-16)
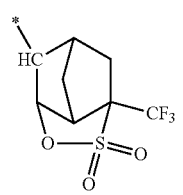
(r-sl-1-17)
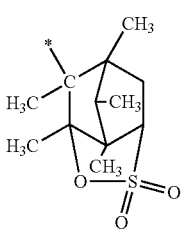
(r-sl-1-18)
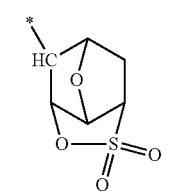
(r-sl-1-19)
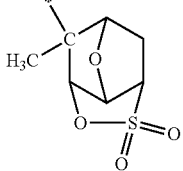
(r-sl-1-20)
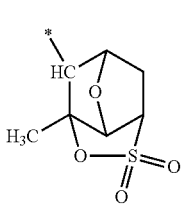
(r-sl-1-31)
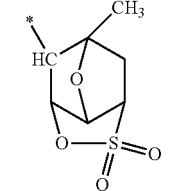
[Chemical Formula 60]
(r-sl-1-22)
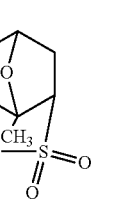

103
-continued
(r-sl-1-23)
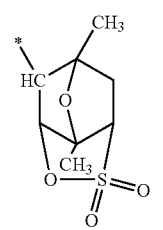
(r-sl-1-24)
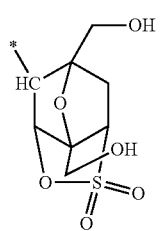
(r-sl-1-25)
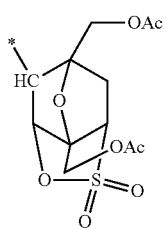
(r-sl-1-26)
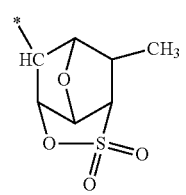
(r-sl-1-27)
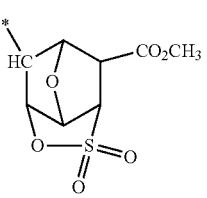
(r-sl-1-28)
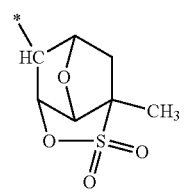
(r-sl-1-29)
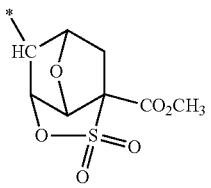
104
-continued
(r-sl-1-30)
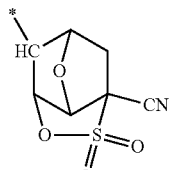
(r-sl-1-31)
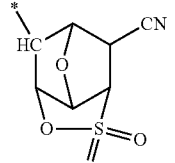
(r-sl-1-32)
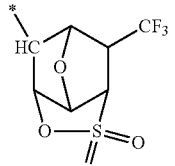
(r-sl-1-33)
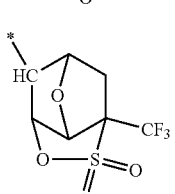
[Chemical Formula 61]
(r-sl-2-1)
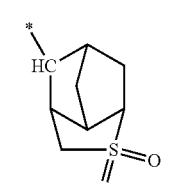
(r-sl-2-2)
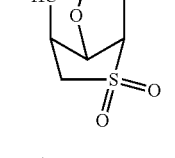
(r-sl-3-1)
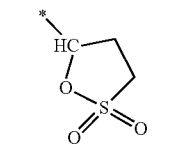
(r-sl-4-1)
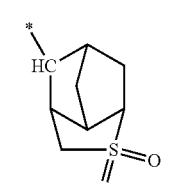
The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group is not particularly limited, and an arbitrary group may be used. Specific examples include groups represented by general formulae (ax3-r-1) to (ax3-r-3) shown below.

[Chemical Formula 62]

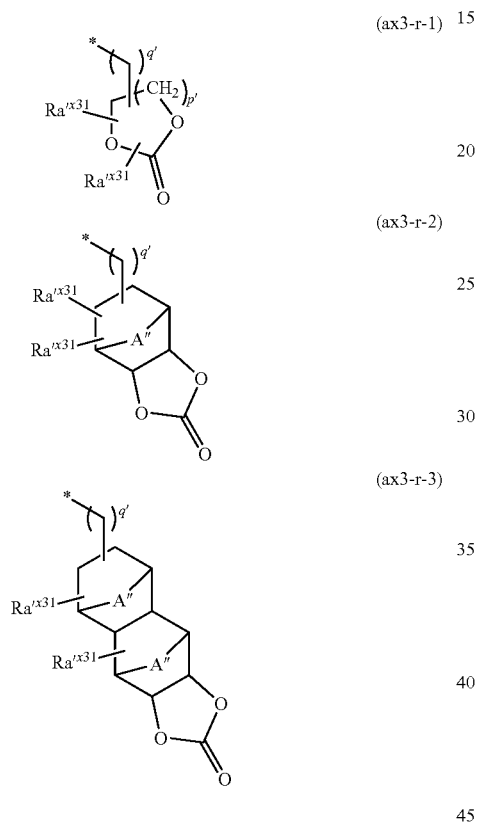

In the formulae, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom, an alkyl group, a lactone-containing cyclic group, a carbonate-containing cyclic group or an —$SO_2$— containing cyclic group; A" represents an oxygen atom, a sulfur atom or an alkylene group of 1 to 5 carbon atoms which may contain an oxygen atom or a sulfur atom; p' represents an integer of 0 to 3; and q' represents 0 or 1.

In general formulae (ax3-r-2) and (ax3-r-3), A" is the same as defined for A" in general formulae (a2-r-2), (a2-r-3) and (a2-r-5).

Examples of the alkyl group, alkoxy group, halogen atom, halogenated alkyl group, —COOR", —OC(=O)R" and hydroxyalkyl group for $Ra'^{31}$ include the same groups as those described above in the explanation of $Ra'^{21}$ in the general formulas (a2-r-1) to (a2-r-7).

Specific examples of the groups represented by the aforementioned general formulae (ax3-r-1) to (ax3-r-3) are shown below.

[Chemical Formula 63]

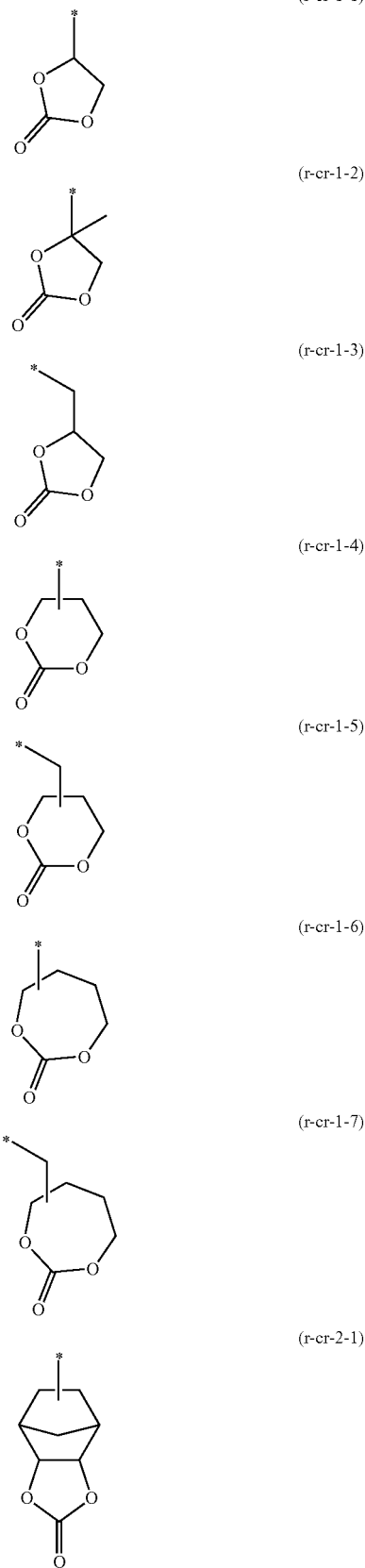

(r-cr-2-2)

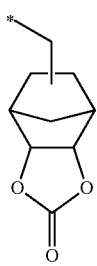

(r-cr-2-3)

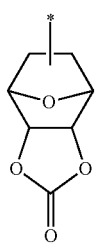

(r-cr-2-4)

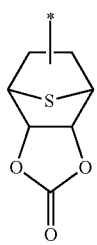

(r-cr-3-1)

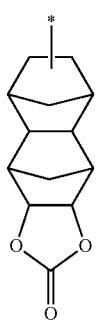

(r-cr-3-2)

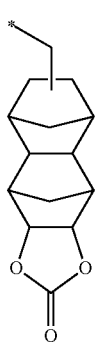

(r-cr-3-3)

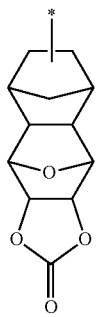

(r-cr-3-4)

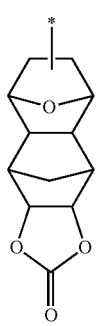

(r-cr-3-5)

As the structural unit (a2), a structural unit derived from an acrylate ester which may have the hydrogen atom bonded to the carbon atom on the α-position substituted with a substituent is preferable.

The structural unit (a2) is preferably a structural unit represented by general formula (a2-1) shown below.

[Chemical Formula 64]

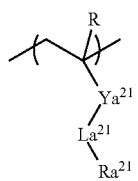

(a2-1)

In the formula, R represents a hydrogen atom, an alkyl group of 1 to 5 carbon atoms or a halogenated alkyl group of 1 to 5 carbon atoms; $Ya^{21}$ represents a single bond or a divalent linking group; $La^{21}$ represents —O—, —COO—, —CON(R')—, —OCO—, —CONHCO— or —CONHCS—; and R' represents a hydrogen atom or a methyl group; provided that, when $La^{21}$ represents —O—, $Ya^{21}$ does not represents —CO—; and $Ra^{21}$ represents a lactone-containing cyclic group, a carbonate-containing cyclic group or an —$SO_2$— containing cyclic group.

In the formula (a2-1), R is the same as defined above. As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

In the formula (a2-1), the divalent linking group for $Ya^{21}$ is not particularly limited, and preferable examples thereof include a divalent hydrocarbon group which may have a substituent and a divalent linking group containing a hetero atom. The divalent hydrocarbon group which may have a substituent and the divalent linking group containing a hetero atom for $Ya^{21}$ are the same as defined for the divalent hydrocarbon group which may have a substituent and the divalent linking group containing a hetero atom described above in relation to $Ya^{x1}$ in general formula (a10-1).

$Ya^{21}$ preferably represents an ester bond [—C(=O)—O—], an ether bond (—O—), a linear or branched alkylene group, a combination of these, or a single bond.

In the formula (a2-1), $Ra^{21}$ represents a lactone-containing cyclic group, an —$SO_2$-containing cyclic group or a carbonate-containing cyclic group.

Preferable examples of the lactone-containing cyclic group, the —$SO_2$— containing cyclic group and the carbonate-containing cyclic group for $Ra^{21}$ include groups represented by general formulae (a2-r-1) to (a2-r-7), groups represented by general formulae (a5-r-1) to (a5-r-4) and groups represented by general formulae (ax3-r-1) to (ax3-r-3).

Among the above examples, a lactone-containing cyclic group or a —$SO_2$— containing cyclic group is preferable, and a group represented by general formula (a2-r-1), (a2-r-2), (a2-r-6) or (a5-r-1) is more preferable. Specifically, a group represented by any of chemical formulae (r-1c-1-1) to (r-1c-1-7), (r-1c-2-1) to (r-1c-2-18), (r-1c-6-1), (r-si-1-1) and (r-si-1-18) is still more preferable.

As the structural unit (a2) contained in the component (A1), 1 kind of structural unit may be used, or 2 or more kinds may be used.

When the component (A1) includes the structural unit (a2), the amount of the structural unit (a3) based on the combined total of all structural units constituting the component (A1) is preferably 20 to 70 mol %, more preferably 40 to 60 mol %.

When the amount of the structural unit (a2) is at least as large as the lower limit of the above preferable range, the effect of using the structural unit (a2) may be satisfactorily achieved. On the other hand, when the amount of the structural unit (a2) is no more than the upper limit of the above preferable range, a good balance may be achieved with the other structural units, and various lithography properties may be improved.

<<Structural Unit (a3)>>

The structural unit (a3) is a structural unit containing a polar group-containing aliphatic hydrocarbon group (provided that the structural units that fall under the definition of structural units (a1), (a2) and (a3) are excluded). By virtue of including the structural unit (a3), various advantages may be obtained, such as appropriate adjustment of acid diffusion length, enhancement of adhesion of a resist film to a substrate, appropriate adjustment of solubility of the resist during developing, and improvement in etching resistance, which may lead to improvement in lithography properties.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers.

In the case where the cyclic group is a monocyclic group, the monocyclic group preferably has 3 to 10 carbon atoms. Of the various possibilities, structural units derived from an acrylate ester that include an aliphatic monocyclic group that contains a hydroxyl group, cyano group, carboxyl group or a hydroxyalkyl group in which part of the hydrogen atoms of the alkyl group have been substituted with fluorine atoms are particularly desirable. Examples of the monocyclic groups include groups in which two or more hydrogen atoms have been removed from a monocycloalkane. Specific examples include groups in which two or more hydrogen atoms have been removed from a monocycloalkane such as cyclopentane, cyclohexane or cyclooctane. Of these polycyclic groups, groups in which two or more hydrogen atoms have been removed from cyclopentane or cyclohexane are preferred industrially.

In the case where the cyclic group is a polycyclic group, the polycyclic group preferably has 7 to 30 carbon atoms. Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobomane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid.

On the other hand, in the structural unit (a3), when the hydrocarbon group within the polar group-containing aliphatic hydrocarbon group is a polycyclic group, structural units represented by formulas (a3-1), (a3-2), (a3-3) and (a3-4) shown below are preferable.

[Chemical Formula 65]

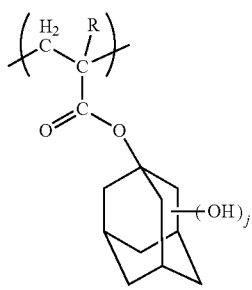
(a3-1)

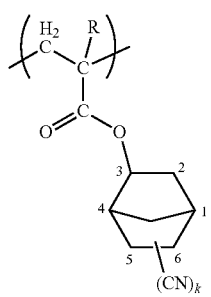
(a3-2)

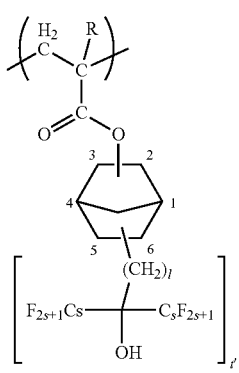
(a3-3)

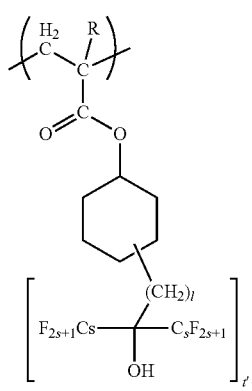
(a3-4)

In the formulas, R is the same as defined above; j is an integer of 1 to 3; k is an integer of 1 to 3; t' is an integer of 1 to 3; l is an integer of 0 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group, j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1.1 is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

In formula (a3-4), t' is preferably 1 or 2.1 is preferably 0 or 1. s is preferably 1. The fluorinated alkyl alcohol is preferably bonded to the 3rd or 5th position of the cyclohexyl group.

As the structural unit (a3) contained in the component (A1), 1 type of structural unit may be used, or 2 or more types may be used.

When the component (A1) includes the structural unit (a3), the amount of the structural unit (a3) based on the combined total (100 mol %) of all structural units constituting the component (A1) is preferably 1 to 30 mol %, more preferably 2 to 25 mol %, and still more preferably 5 to 20 mol %.

When the amount of the structural unit (a3) is at least as large as the lower limit of the above preferable range, the effect of using the structural unit (a2) may be satisfactorily achieved due to the aforementioned effects. On the other hand, when the amount of the structural unit (a3) is no more than the upper limit of the above preferable range, a good balance may be achieved with the other structural units, and various lithography properties may be improved.

<<Other Structural Units>>

The component (A1) may further include a structural unit other than the structural units (a1), (a2) and (a3).

Examples of other structural units include a structural unit (a10) containing hydroxystyrene skeleton, a structural unit (a9) represented by general formula (a9-1), a structural unit derived from styrene (provided that the structural units that fall under the definition of structural unit (a10) are excluded), and a structural unit (a4) containing an acid non-dissociable, aliphatic cyclic group.

<<Structural Unit (a10) Containing Hydroxystyrene Skeleton>>

The structural unit (a10) is a structural unit represented by general formula (a10-1) shown below.

[Chemical Formula 66]

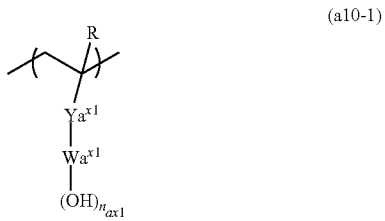
(a10-1)

In the formula, R represents a hydrogen atom, an alkyl group of 1 to 5 carbon atoms or a halogenated alkyl group of 1 to 5 carbon atoms; $Ya^{x1}$ represents a single bond or a divalent linking group; $Wa^{x1}$ represents an aromatic hydrocarbon group which may have a substituent; and $n_{ax1}$ represents an integer of 1 or more.

In general formula (a10-1), R represents a hydrogen atom, an alkyl group of 1 to carbon atoms or a halogenated alkyl group of 1 to 5 carbon atoms.

As the alkyl group having 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

The halogenated alkyl group of 1 to 5 carbon atoms represented by R is a group in which part or all of the hydrogen atoms of the aforementioned alkyl group of 1 to 5 carbon atoms have been substituted with halogen atoms. As the halogen atom, a fluorine atom is most preferable.

As R, a hydrogen atom, an alkyl group of 1 to 5 carbon atoms or a fluorinated alkyl group of 1 to 5 carbon atoms is preferable, and in view of industrial availability, a hydrogen atom, a methyl group or a trifluoromethyl group is more preferable, a hydrogen atom or a methyl group is still more preferable, and a methyl group is most preferable.

In formula (a10-1), $Ya^{x1}$ represents a single bond or a divalent linking group.

In the aforementioned chemical formula, the divalent linking group for $Ya^{x1}$ is not particularly limited, and preferable examples thereof include a divalent hydrocarbon group which may have a substituent and a divalent linking group containing a hetero atom.

Divalent Hydrocarbon Group which May have a Substituent:

In the case where $Ya^{x1}$ is a divalent linking group which may have a substituent, the hydrocarbon group may be either an aliphatic hydrocarbon group or an aromatic hydrocarbon group.

Aliphatic Hydrocarbon Group for $Ya^{x1}$

An "aliphatic hydrocarbon group" refers to a hydrocarbon group that has no aromaticity. The aliphatic hydrocarbon group may be saturated or unsaturated. In general, the aliphatic hydrocarbon group is preferably saturated. Examples of the aliphatic hydrocarbon group include a linear or branched aliphatic hydrocarbon group, and an aliphatic hydrocarbon group containing a ring in the structure thereof can be given.

Linear or Branched Aliphatic Hydrocarbon Group

The linear aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

The branched aliphatic hydrocarbon group preferably has 2 to 10 carbon atoms, more preferably 3 to 6, still more preferably 3 or 4, and most preferably 3.

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and a carbonyl group.

Aliphatic Hydrocarbon Group Containing a Ring in the Structure Thereof

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which 2 hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and more preferably a methyl group, an ethyl group, a propyl group, an n-butyl group or a tert-butyl group.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and still more preferably a methoxy group or an ethoxy group.

The halogen atom as the substituent is preferably a fluorine atom.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$—, or —S(=O)$_2$—O— is preferable.

Aromatic Hydrocarbon Group for $Ya^{x1}$

The aromatic hydrocarbon group is a hydrocarbon group having at least one aromatic ring.

The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Here, the number of carbon atoms within a substituent(s) is not included in the number of carbon atoms of the aromatic hydrocarbon group.

Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom. Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group). The alkylene group which is bonded to the aforementioned aryl group or heteroaryl group preferably has 1 to 4 carbon atoms, more preferably 1 or 2 carbon atoms, and most preferably 1 carbon atom.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and more preferably a methyl group, an ethyl group, a propyl group, an n-butyl group or a tert-butyl group.

As the alkoxy group, the halogen atom and the halogenated alkyl group for the substituent, the same groups as the aforementioned substituent groups for substituting a hydrogen atom within the cyclic aliphatic hydrocarbon group can be used.

Divalent Linking Group Containing a Hetero Atom

In the case where $Ya^{x1}$ is a divalent linking group containing a hetero atom, preferable examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, —S(=O)$_2$—O—, or a group represented by general formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$— or —$Y^{21}$—S(=O)$_2$—O—$Y^{22}$— (in the formula, $Y^{21}$ and $Y^{22}$ each independently represents a divalent hydrocarbon group which may have a substituent, O represents an oxygen atom, and m" represents an integer of 0 to 3).

In the case where the divalent linking group containing a hetero atom is —C(=O)—NH—, —C(=O)—NH—C(=O)—, —NH— or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In general formulae —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$— or —$Y^{21}$—S(=O)$_2$—O—$Y^{22}$—, $Y^{21}$ and $Y^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group for $Ya^{x1}$.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m''}$-$Y^{22}$—, m" represents an integer of 0 to 3, preferably an integer of 0 to 2, more preferably 0 or 1, and most preferably 1. Namely, it is particularly desirable that the group represented by the formula —[$Y^{21}$—C(=O)—O]$_{m''}$-$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

Among the above examples, as $Ya^{x1}$, a single bond, an ester bond —C(=O)—O—、—O—C(=O)—], an ether bond (—O—), a linear or branched alkylene group, or a combination of these is preferable, and a single bond or an ester bond —C(=O)—O—、—O—C(=O)—] is more preferable.

In formula (a10-1), $Wa^{x1}$ represents an aromatic hydrocarbon group which may have a substituent.

Examples of the aromatic hydrocarbon group for $Wa^{x1}$ include a group obtained by removing ($n_{ax1}$+1) hydrogen atoms from an aromatic ring which may have a substituent. The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20 carbon atoms, and still more preferably 6 to 15 carbon atoms, and most preferably 6 to 12 carbon atoms. Specific examples of the aromatic ring include an aromatic hydrocarbon ring, such as benzene, naphthalene, anthracene or phenanthrene; and an aromatic heterocyclic ring in which part of the carbon atoms constituting the aromatic hydrocarbon ring has been substituted with a heteroatom. Examples of the hetero atom within the aromatic hetero rings include an oxygen atom, a sulfur atom and a nitrogen atom. Specific examples of the aromatic hetero ring include a pyridine ring and a thiophene ring.

Examples of the aromatic hydrocarbon group for $Wa^{x1}$ include a group obtained by removing $(n_{ax1}+1)$ hydrogen atoms from an aromatic compound having two or more aromatic rings which may have a substituent (e.g., biphenyl or fluorene).

Among the above examples, as $Wa^{x1}$, a group in which $(n_{ax1}+1)$ hydrogen atoms have been removed from benzene, naphthalene, anthracene or biphenyl is preferable, a group in which $(n_{ax1}+1)$ hydrogen atoms have been removed from benzene or naphthalene is more preferable, and a group in which $(n_{ax1}+1)$ hydrogen atoms have been removed from benzene is still more preferable.

The aromatic hydrocarbon group for $Wa^{x1}$ may or may not have a substituent. Examples of the substituent include an alkyl group, an alkoxy group, a halogen atom, and a halogenated alkyl group. The alkyl group, the alkoxy group and the halogen atom and the halogenated alkyl group as the substituent are the same as defined for the substituent for the cyclic aliphatic hydrocarbon group represented by $Ya^{x1}$. The substituent is preferably a linear or branched alkyl group having 1 to 5 carbon atoms, more preferably a linear or branched alkyl group having 1 to 3 carbon atoms, still more preferably an ethyl group or a methyl group, and most preferably a methyl group. The aromatic hydrocarbon group for $Wa^{x1}$ preferably has no substituent.

In formula (a10-1), $n_{ax1}$ is an integer of 1 or more, preferably an integer of 1 to 10, more preferably an integer of 1 to 5, still more preferably 1, 2 or 3, and most preferably 1 or 2.

Specific examples of the structural unit (a10) represented by formula (a10-1) are shown below.

In the formulae shown below, $R^\alpha$ represents a hydrogen atom, a methyl group or a trifluoromethyl group.

[Chemical Formula 67]

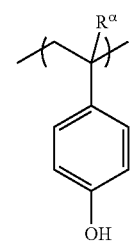

(a10-1-11)

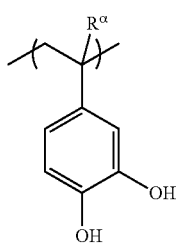

(a10-1-12)

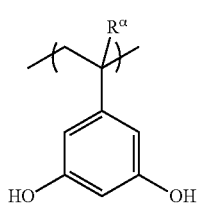

(a10-1-13)

-continued

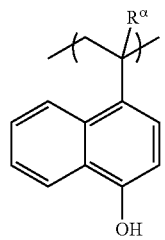

(a10-1-14)

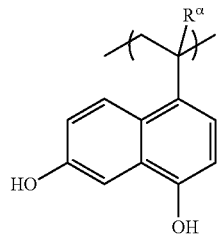

(a10-1-15)

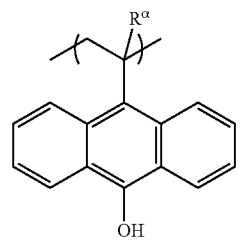

(a10-1-16)

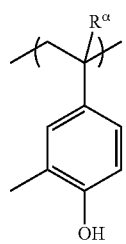

(a10-1-17)

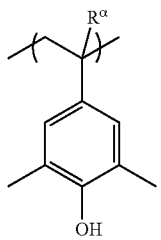

(a10-1-18)

[Chemical Formula 68]

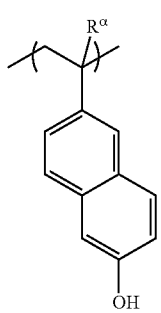

(a10-1-21)

(a10-1-22)
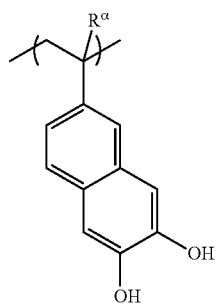
(a10-1-23)
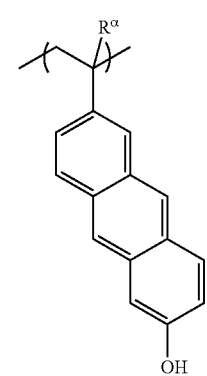
(a10-1-24)
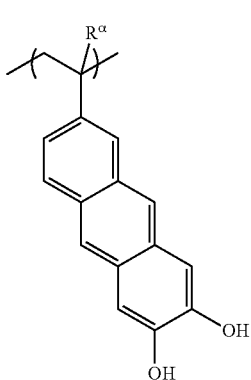
[Chemical Formula 69]
(a10-1-31)
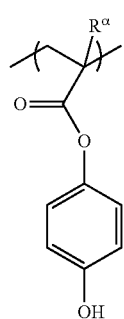
(a10-1-32)
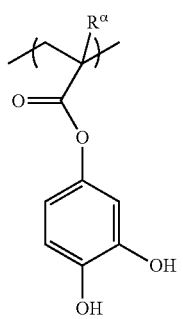
(a10-1-33)
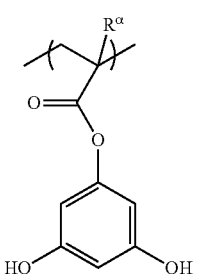
(a10-1-34)
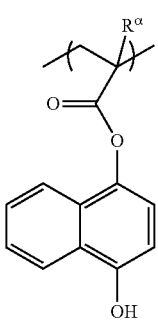
(a10-1-35)
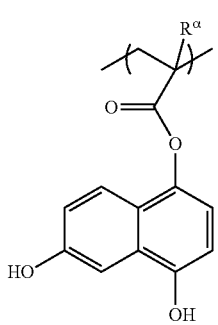
(a10-1-36)
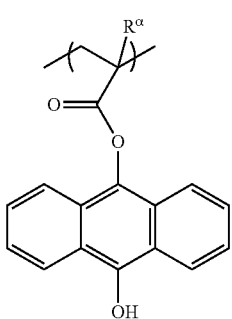

[Chemical Formula 70]

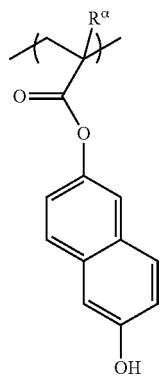
(a10-1-41)

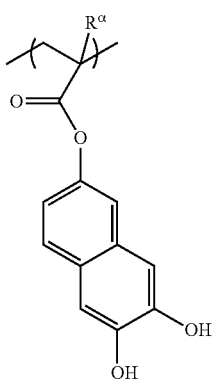
(a10-1-42)

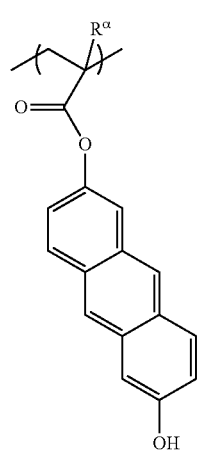
(a10-1-43)

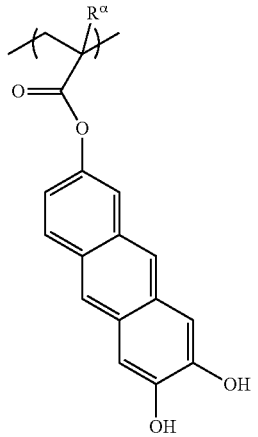
(a10-1-44)

As the structural unit (a10) contained in the component (A1), 1 kind of structural unit may be used, or 2 or more kinds of structural units may be used.

When the component (A1) includes the structural unit (a10), the amount of the structural unit (a10) based on the combined total of all structural units constituting the component (A1) (100 mol %) is preferably 5 to 80 mol %, more preferably 10 to 75 mol %, still more preferably 30 to 70 mol %, and still more preferably 40 to 60 mol %.

When the amount of the structural unit (a10) is within the above-mentioned preferable range, the efficiency of supplying proton within the resist film may be improved, solubility in a developing solution may be reliably assured, and the effects of the present invention may be more reliably achieved.

Structural Unit (a4):

The structural unit (a4) is a structural unit containing an acid non-dissociable cyclic group. When the component (A1) includes the structural unit (a4), dry etching resistance of the photosensitive resin pattern to be formed may be improved. Further, the hydrophobicity of the component (A1) may be further improved.

An "acid non-dissociable, aliphatic cyclic group" in the structural unit (a4) refers to a cyclic group which is not dissociated by the action of the acid (e.g., acid generated from the component (B) described later) upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used. In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-7) shown below.

[Chemical Formula 71]

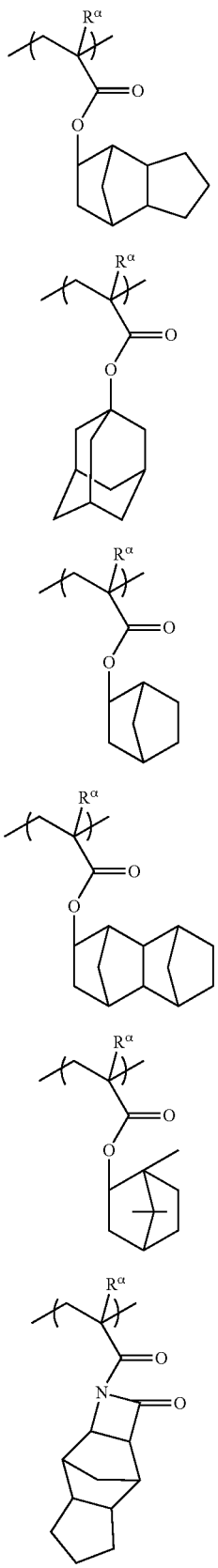

(a4-1)
(a4-2)
(a4-3)
(a4-4)
(a4-5)
(a4-6)

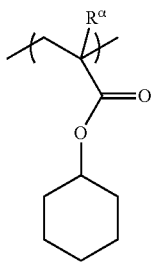

(a4-7)

In the formulae, $R^\alpha$ represents a hydrogen atom, a methyl group or a trifluoromethyl group.

As the structural unit (a4) contained in the component (A1), 1 type of structural unit may be used, or 2 or more types may be used.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

The component (A1) may be produced, for example, by dissolving the monomers corresponding with each of the structural units in a polymerization solvent, followed by addition of a radical polymerization initiator such as azobisisobutyronitrile (AIBN) or dimethyl-2,2'-azobisisoutyrate (e.g., V-601). Alternatively, the component (A1) can be prepared by dissolving a monomer from which the structural unit (a1) is derived, and a precursor monomer (monomer for which the functional group is protected) from which the structural unit other than the structural unit (a1) is derived in a polymerization solvent, polymerizing the dissolved monomers using the radical polymerization initiator described above, followed by performing a deprotection reaction. In the polymerization, a chain transfer agent such as HS—$CH_2$—$CH_2$—$CH_2$—$C(CF_3)_2$—OH may be used to introduce a —$C(CF_3)_2$—OH group at the terminal(s) of the polymer. Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The weight average molecular weight (Mw) (the polystyrene equivalent value determined by gel permeation chromatography (GPC)) of the component (A1) is not particularly limited, but is preferably 1,000 to 50,000, more preferably 2,000 to 30,000, and still more preferably 3,000 to 20,000.

When the Mw of the component (A1) is no more than the upper limit of the above-mentioned preferable range, the resist composition exhibits a satisfactory solubility in a resist solvent. On the other hand, when the Mw of the component (A1) is at least as large as the lower limit of the above-mentioned preferable range, dry etching resistance and the cross-sectional shape of the resist pattern becomes satisfactory.

The dispersity (Mw/Mn) of the component (A1) is not particularly limited, but is preferably 1.0 to 4.0, more preferably 1.0 to 3.0, and most preferably 1.1 to 2.0. Here, Mn is the number average molecular weight.

<<Component (B)>>

The component (B) is an acid generator component which generates acid upon exposure.

As the component (B), there is no particular limitation, and any of the known acid generators used in conventional chemically amplified resist compositions may be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be mentioned.

[Chemical Formula 72]

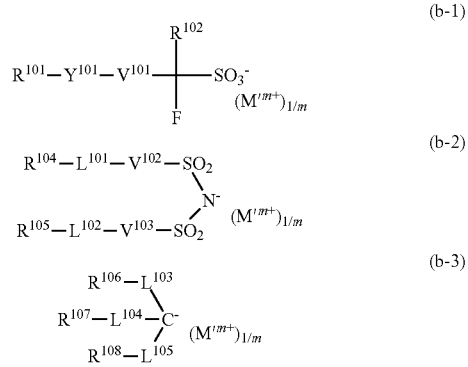

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{105}$ may be mutually bonded to form a ring structure; $R^{102}$ represents a fluorine atom or a fluorinated alkyl group having 1 to 5 carbon atoms; $Y^{101}$ represents a single bond or a divalent group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; m represents an integer of 1 or more; and $M'^{m+}$ represents an m-valent onium cation.

{Anion Moiety}
Anion Moiety of Component (b-1)

In the formula (b-1), $R^{101}$ represents a cyclic group which may have a substituent, a chain-like alkyl group which may have a substituent or a chain-like alkenyl group which may have a substituent.

Cyclic Group which May have a Substituent:

The cyclic group is preferably a cyclic hydrocarbon group, and the cyclic hydrocarbon group may be either an aromatic hydrocarbon group or an aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

The aromatic hydrocarbon group for $R^{101}$ is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group represented by $R^{101}$ include benzene, fluorene, naphthalene, anthracene, phenanthrene and biphenyl; and aromatic hetero rings in which part of the carbon atoms constituting the aforementioned aromatic rings has been substituted with a hetero atom. Examples of the hetero atom within the aromatic hetero rings include an oxygen atom, a sulfur atom and a nitrogen atom.

Specific examples of the aromatic hydrocarbon group represented by $R^{101}$ include a group in which one hydrogen atom has been removed from the aforementioned aromatic ring (i.e., an aryl group, such as a phenyl group or a naphthyl group), and a group in which one hydrogen of the aforementioned aromatic ring has been substituted with an alkylene group (e.g., an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

Examples of the cyclic aliphatic hydrocarbon group for $R^{101}$ include aliphatic hydrocarbon groups containing a ring in the structure thereof.

As examples of the hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given.

The alicyclic hydrocarbon group preferably has 3 to 20 carbon atoms, and more preferably 3 to 12 carbon atoms.

The alicyclic hydrocarbon group may be either a polycyclic or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 30 carbon atoms. Among poly cycloalkanes, a polycycloalkane having a bridged ring polycyclic skeleton, such as adamantane, norbomane, isobomane, tricyclodecane or tetracyclodpdecane, and a polycycloalkane having a condensed ring polycyclic skeleton, such as a cyclic group having a steroid skeleton are preferable.

Among these examples, as the cyclic aliphatic hydrocarbon group for $R^{101}$, a group in which one or more hydrogen atoms have been removed from a monocycloalkane or a polycycloalkane is preferable, a group in which one or more hydrogen atoms have been removed from a polycycloalkane is more preferable, an adamantyl group or a norbornyl group is still more preferable, and an adamantyl group is most preferable.

The linear aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms. As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

The branched aliphatic hydrocarbon group which may be bonded to the alicyclic hydrocarbon group preferably has 2 to 10 carbon atoms, more preferably 3 to 6 carbon atoms, still more preferably 3 or 4 carbon atoms, and most preferably 3 carbon atoms. As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The cyclic hydrocarbon group for $R^{101}$ may contain a hetero atom such as a heterocycle. Specific examples include lactone-containing cyclic groups represented by the aforementioned general formulae (a2-r-1) to (a2-r-7), the —$SO_2$— containing cyclic group represented by the aforementioned formulae (a5-r-1) to (a5-r-4), and other heterocyclic groups represented by chemical formulae (r-hr-1) to (r-hr-16) shown below. In the formulae, * indicates the bonding site which bonds to $Y^{101}$ in formula (b-1).

[Chemical Formula 73]

(r-hr-1)

(r-hr-2)

(r-hr-3)

(r-hr-4)

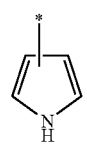
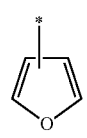
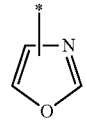
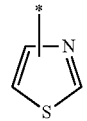

(r-hr-5)

(r-hr-6)

(r-hr-7)

(r-hr-8)

(r-hr-9)

(r-hr-10)

(r-hr-11)

(r-hr-12)

(r-hr-13)

(r-hr-14)

(r-hr-15)

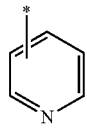
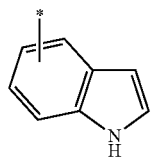
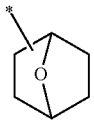
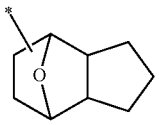
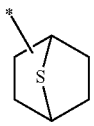
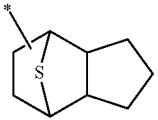
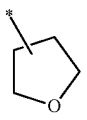
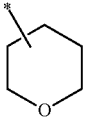
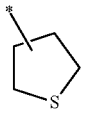
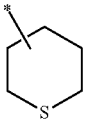
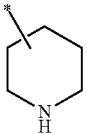

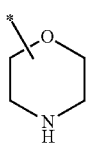

(r-hr-16)

As the substituent for the cyclic group for $R^{101}$, an alkyl group, an alkoxy group, a halogen atom, a halogenated alkyl group, a hydroxyl group, a carbonyl group, a nitro group or the like can be used. The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

The halogen atom as the substituent is preferably a fluorine atom.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The carbonyl group as the substituent is a group that substitutes a methylene group ($-CH_2-$) constituting the cyclic hydrocarbon group.

The cyclic hydrocarbon group for $R^{101}$ may be a condensed cyclic group in which an aliphatic hydrocarbon ring and an aromatic hydrocarbon ring are fused. Examples of the condensed ring include a compound in which one or more aromatic rings are fused with a polycycloalkane having a bridged polycyclic skeleton. Specific examples of the bridged polycycloalkane include a bicycloalkane, such as bicyclo[2.2.1]heptane (norbomane) or bicyclo[2.2.2]octane. As the condensed cyclic group, a group containing a condensed ring in which 2 or 3 aromatic rings are fused with a bicycloalkane is preferable, and a group containing a condensed ring in which 2 or 3 aromatic rings are fused with bicyclo[2.2.2]octane is more preferable. Specific examples of the condensed cyclic group for $R^{101}$ include groups represented by formulae (r-br-1) and (r-br-2) shown below. In the formulae, * indicates the bonding site which bonds to $Y^{101}$ in formula (b-1).

[Chemical Formula 74]

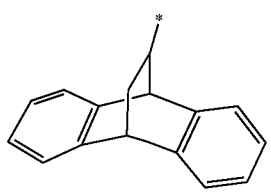

(r-br-1)

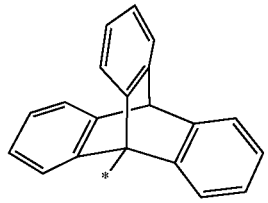

(r-br-2)

As the substituent for the condensed cyclic group for $R^{101}$, an alkyl group, an alkoxy group, a halogen atom, a halogenated alkyl group, a hydroxy group, a carbonyl group, a nitro group, an aromatic hydrocarbon group or an alicyclic hydrocarbon group may be mentioned.

The alkyl group, the alkoxy group, the halogen atom and the halogenated alkyl group as the substituent for the condensed cyclic group are the same as defined for the substituents for the cyclic group represented by $R^{101}$.

Examples of the aromatic hydrocarbon group as the substituent for the condensed cyclic group include a group in which one hydrogen atom has been removed from an aromatic hydrocarbon ring (an aryl group, such as a phenyl group or a naphthyl group); a group in which one hydrogen atom of the aforementioned aromatic hydrocarbon ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group); and a heterocyclic group represented by any of the aforementioned formulae (r-hr-1) to (r-hr-6).

Examples of the alicyclic hydrocarbon group as the substituent for the condensed cyclic group include a group in which one hydrogen atom has been removed from a monocycloalkane such as cyclopentane or cyclohexane; a group in which one hydrogen atom has been removed from a polycycloalkane such as adamantane, norbomane, isobomane, tricyclodecane or tetracyclododecane; a lactone-containing cyclic group represented by any of the aforementioned general formulae (a2-r-1) to (a2-r-7); an $-SO_2-$ containing cyclic group represented by any of the aforementioned general formulae (a5-r-1) to (a5-r-4); and a heterocyclic group represented by any of the aforementioned formulae (r-hr-7) to (r-hr-16).

Chain Alkyl Group which May have a Substituent:
The chain-like alkyl group for $R^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Chain alkenyl group which may have a substituent:

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among these examples, as the chain alkenyl group, a linear alkenyl group is preferable, a vinyl group or a propenyl group is more preferable, and a vinyl group is most preferable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among the above examples, as $R^{101}$, a cyclic group which may have a substituent is preferable, and a cyclic hydrocarbon group which may have a substituent is more preferable. Specifically, a phenyl group, a naphthyl group, a group in which one or more hydrogen atoms have been removed from a polycycloalkane, a lactone-containing cyclic group represented by any one of the aforementioned formula (a2-r-1) to (a2-r-7), and an —$SO_2$— containing cyclic group represented by any one of the aforementioned formula (a5-r-1) to (a5-r-4).

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—$SO_2$—) bonded thereto. Examples of the divalent linking group containing an oxygen atom include divalent linking groups represented by general formula (y-a1-1) to (y-a1-7) shown below.

[Chemical Formula 75]

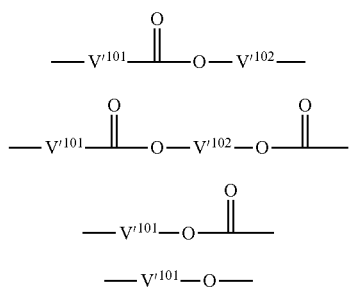

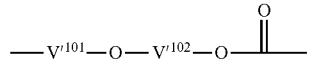

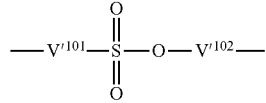

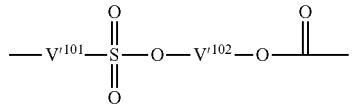

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms, more preferably an alkylene group of 1 to 10 carbon atoms, and still more preferably an alkylene group of 1 to 5 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—$CH_2$—]; an alkylmethylene group, such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—; an ethylene group [—$CH_2CH_2$—]; an alkylethylene group, such as —CH($CH_3$)$CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; an alkyltrimethylene group, such as —CH($CH_3$)$CH_2CH_2$— and —$CH_2$CH($CH_3$)$CH_2$—; a tetramethylene group [—$CH_2CH_2CH_2CH_2$—]; an alkyltetramethylene group, such as —CH($CH_3$)$CH_2CH_2CH_2$-、—$CH_2$CH($CH_3$)$CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group (monocyclic aliphatic hydrocarbon group or polycyclic aliphatic hydrocarbon group) for $Ra'^3$ in the aforementioned formula (a1-r-1), and a cyclohexylene group, 1,5-adamantylene group or 2,6-adamantylene group is preferable.

$Y^{101}$ is preferably a divalent linking group containing an ether bond or a divalent linking group containing an ester bond, and groups represented by the aforementioned formulas (y-a1-1) to (y-a1-5) are preferable.

In formula (b-1), $V^{101}$ represents a single bond, an alkylene group or a fluorinated alkylene group. The alkylene group and the fluorinated alkylene group for $V^{101}$ preferably has 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

Specific examples of the anion moiety represented by formula (b-1) include a fluorinated alkylsulfonate anion such as a trifluoromethanesulfonate anion or a perfluorobutanesulfonate anion in the case where $Y^{101}$ is a single bond; and an anion represented by any one of formulae (an-1) to (an-3) in the case where $Y^{101}$ represents a divalent linking group containing an oxygen atom.

[Chemical Formula 76]

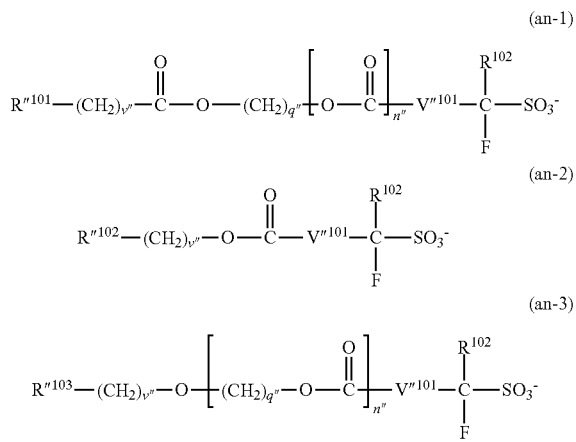

In the formulae, $R''^{101}$ represents an aliphatic cyclic group which may have a substituent, a monovalent heterocyclic group represented by any of the aforementioned formulae (r-hr-1) to (r-hr-6), a condensed cyclic group represented by the aforementioned formula (r-br-1) or (r-br-2), or a chain-like alkyl group which may have a substituent; $R''^{102}$ represents an aliphatic cyclic group which may have a substituent, a condensed cyclic group represented by the aforementioned formula (r-br-1) or (r-br-2), a lactone-containing cyclic group represented by any of the aforementioned formulae (a2-r-1) and (a2-r-3) to (a2-r-7), or a —SO$_2$- containing cyclic group represented by any of formulae (a5-r-1) to (a5-r-4); $R''^{103}$ represents an aromatic cyclic group which may have a substituent, an aliphatic cyclic group which may have a substituent, or a chain-like alkenyl group which may have a substituent; $V''^{101}$ represents a single bond, an alkylene group having 1 to 4 carbon atoms or a fluorinated alkylene group having 1 to 4 carbon atoms; $R^{102}$ represents a fluorine atom or a fluorinated alkyl group of 1 to 5 carbon atoms; each v" independently represents an integer of 0 to 3; each q" independently represents an integer of 0 to 20; and n" represents 0 or 1.

As the aliphatic cyclic group for $R''^{101}$, $R''^{102}$ and $R''^{103}$ which may have a substituent, the same groups as the cyclic aliphatic hydrocarbon group for $R^{101}$ in the aforementioned formula (b-1) are preferable. Examples of the substituent include the same substituents as those described above for the cyclic aliphatic hydrocarbon group for $R^{101}$ in the aforementioned formula (b-1).

As the aromatic cyclic group for $R''^{103}$ which may have a substituent, the same groups as the aromatic hydrocarbon group for the cyclic hydrocarbon group represented by $R^{101}$ in the aforementioned formula (b-1) is preferable. Examples of the substituent include the same substituents as those described above for the aromatic hydrocarbon group for $R^{101}$ in the aforementioned formula (b-1).

As the chain alkyl group for $R''^{101}$ which may have a substituent, the same chain alkyl groups as those described above for $R^{101}$ in the aforementioned formula (b-1) are preferable.

As the chain alkenyl group for $R''^{103}$ which may have a substituent, the same chain alkenyl groups as those described above for $R^{101}$ in the aforementioned formula (b-1) are preferable.

Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain alkyl group for $R^{104}$ and $R^{105}$, the larger the number of hydrogen atoms being substituted with fluorine atom(s), the acid strength becomes stronger, and the transparency to a high energy beam having a wavelength of no more than 250 nm or electron beam may be improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b-1).

In formula (b-3), $L^{103}$ to $L^{105}$ each independently represents a single bond, —CO— or —SO$_2$—.

Among these examples, as the anion moiety of the component (B), an anion for the component (b-1) is preferable. Among these, an anion represented by any one of the aforementioned general formulae (an-1) to (an-3) is more preferable, and an anion represented by the aforementioned general formula (an-1) or (an-2) is more preferable, and an anion represented by the aforementioned general formula (an-2) is still more preferable.

[Cation Moiety]

In formulae (b-1), (b-2) and (b-3), $M'^{m+}$ represents an m-valent onium cation. Among these, a sulfonium cation or an iodonium cation is preferable, m represents an integer of 1 or more.

Preferable examples of the cation moiety $((M'^{m+})_{1/m})$ include an organic cation represented by any of general formulae (ca-1) to (ca-5) shown below.

[Chemical Formula 77]

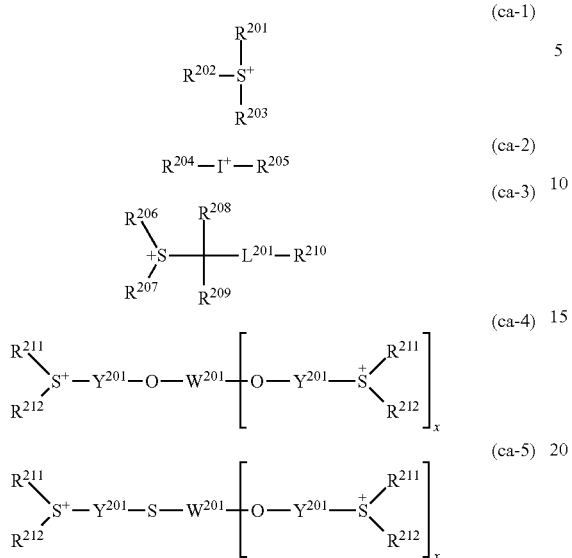

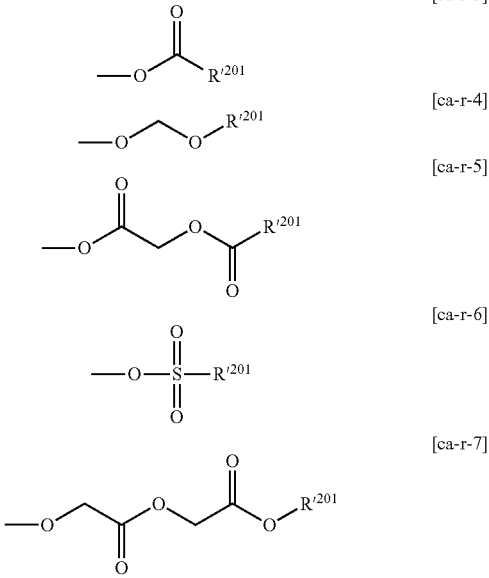

In the formulae, $R^{201}$ to $R^{207}$, $R^{211}$ and $R^{212}$ each independently represents an aryl group which may have a substituent, an alkyl group which may have a substituent, or an alkenyl group which may have a substituent. $R^{201}$ to $R^{203}$, $R^{206}$ and $R^{207}$, and $R^{211}$ and $R^{212}$ may be mutually bonded to form a ring with the sulfur atom. $R^{208}$ and $R^{209}$ each independently represents a hydrogen atom or an alkyl group of 1 to 5 carbon atoms. $R^{210}$ represents an aryl group which may have a substituent, an alkyl group which may have a substituent, an alkenyl group which may have a substituent, or an —$SO_2$— containing cyclic group which may have a substituent. $L^{201}$ represents —C(=O)— or —C(=O)—O—. Each $Y^{201}$ independently represents an arylene group, an alkylene group or an alkenylene group, x represents 1 or 2. $W^{201}$ represents an (x+1) valent linking group.

In formulae (ca-1) to (ca-5), as the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

The alkyl group for $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, and groups represented by general formulae (ca-r-1) to (ca-r-7) shown below.

[Chemical Formula 78]

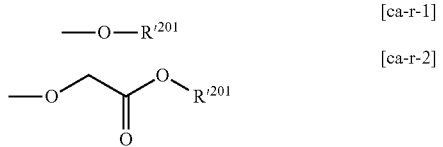

In the formulae, each $R'^{201}$ independently represents a hydrogen atom, a cyclic group which may have a substituent, a chain-like alkyl group which may have a substituent, or a chain-like alkenyl group which may have a substituent.

Cyclic Group which May have a Substituent:

The cyclic group is preferably a cyclic hydrocarbon group, and the cyclic hydrocarbon group may be either an aromatic hydrocarbon group or an aliphatic hydrocarbon group. An "aliphatic hydrocarbon group" refers to a hydrocarbon group that has no aromaticity. The aliphatic hydrocarbon group may be either saturated or unsaturated, but in general, the aliphatic hydrocarbon group is preferably saturated.

The aromatic hydrocarbon group for $R'^{201}$ is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 10 carbon atoms. Here, the number of carbon atoms within a substituent(s) is not included in the number of carbon atoms of the aromatic hydrocarbon group.

Examples of the aromatic ring contained in the aromatic hydrocarbon group for $R'^{201}$ include benzene, fluorene, naphthalene, anthracene, phenanthrene, biphenyl, or an aromatic hetero ring in which part of the carbon atoms constituting the aromatic ring has been substituted with a hetero atom. Examples of the hetero atom within the aromatic hetero rings include an oxygen atom, a sulfur atom and a nitrogen atom.

Specific examples of the aromatic hydrocarbon group for $R'^{201}$ include a group in which 1 hydrogen atom has been removed from the aforementioned aromatic ring (an aryl group, such as a phenyl group or a naphthyl group), and a group in which 1 hydrogen atom of the aforementioned aromatic ring has been substituted with an alkylene group (an arylalkyl group, such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

Examples of the cyclic aliphatic hydrocarbon group for $R'^{201}$ include aliphatic hydrocarbon groups containing a ring in the structure thereof.

As examples of the hydrocarbon group containing a ring in the structure thereof, an alicyclic hydrocarbon group (a group in which one hydrogen atom has been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given.

The alicyclic hydrocarbon group preferably has 3 to 20 carbon atoms, and more preferably 3 to 12 carbon atoms.

The alicyclic hydrocarbon group may be either a polycyclic group or a monocyclic group. As the monocyclic alicyclic hydrocarbon group, a group in which one or more hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the polycyclic group preferably has 7 to 30 carbon atoms. Among polycycloalkanes, a polycycloalkane having a bridged ring polycyclic skeleton, such as adamantane, norbomane, isobomane, tricyclodecane or tetracyclodpdecane, and a polycycloalkane having a condensed ring polycyclic skeleton, such as a cyclic group having a steroid skeleton are preferable.

Among these examples, as the cyclic aliphatic hydrocarbon group for $R'^{201}$, a group in which one or more hydrogen atoms have been removed from a monocycloalkane or a polycycloalkane is preferable, a group in which one or more hydrogen atoms have been removed from a polycycloalkane is more preferable, an adamantyl group or a norbornyl group is still more preferable, and an adamantyl group is most preferable.

The linear or branched aliphatic hydrocarbon group which may be bonded to the alicyclic hydrocarbon group preferably has 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, $C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The cyclic hydrocarbon group for $R'^{201}$ may contain a hetero atom such as a heterocycle. Specific examples include lactone-containing cyclic groups represented by the aforementioned general formulae (a2-r-1) to (a2-r-7), the —$SO_2$— containing cyclic group represented by the aforementioned formulae (a5-r-1) to (a5-r-4), and other heterocyclic groups represented by the aforementioned chemical formulae (r-hr-1) to (r-hr-16).

As the substituent for the cyclic group for $R'^{201}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

The halogen atom as the substituent is preferably a fluorine atom.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The carbonyl group as the substituent is a group that substitutes a methylene group (—$CH_2$—) constituting the cyclic hydrocarbon group.

Chain alkyl group which may have a substituent:

The chain alkyl group for $R'^{201}$ may be linear or branched.

The linear alkyl group preferably has 1 to 20 carbon atoms, more preferably 1 to 15 carbon atoms, and still more preferably 1 to 10 carbon atoms.

The branched alkyl group preferably has 3 to 20 carbon atoms, more preferably 3 to 15 carbon atoms, and still more preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Chain alkenyl group which may have a substituent:

The chain alkenyl group for $R'^{201}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylvinyl group, a 2-methylvinyl group, a 1-methylpropenyl group and a 2-methylpropenyl group.

Among these examples, as the chain alkenyl group, a linear alkenyl group is preferable, a vinyl group or a propenyl group is more preferable, and a vinyl group is most preferable.

As the substituent for the chain-like alkyl group or alkenyl group for $R'^{201}$, an alkoxy group, a halogen atom, a halogenated alkyl group, a hydroxyl group, a carbonyl group, a nitro group, an amino group, a cyclic group for $R'^{201}$ or the like may be used.

As the cyclic group which may have a substituent, the chain alkyl group which may have a substituent and the chain alkenyl group which may have a substituent for $R'^{201}$, the same groups as those described above may be mentioned. As the cyclic group which may have a substituent and chain alkyl group which may have a substituent, the same groups as those described above for the acid dissociable group represented by the aforementioned formula (a1-r-2) may be also mentioned.

Among these examples, as $R^{201}$, a cyclic group which may have a substituent is preferable, and a cyclic hydrocarbon group which may have a substituent is more preferable. Specifically, for example, a phenyl group, a naphthyl group, a group in which one or more hydrogen atoms have been removed from a polycycloalkane, a lactone-containing cyclic group represented by any one of the aforementioned formula (a2-r-1) to (a2-r-7), and an —$SO_2$— containing cyclic group represented by any one of the aforementioned formula (a5-r-1) to (a5-r-4) are preferable.

In formulae (ca-1) to (ca-5), in the case where $R^{201}$ to $R^{203}$, $R^{206}$ and $R^{207}$, or $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —$SO_2$—, —$SO_3$—, —COO—, —CONH— or —N($R_N$)— ($R_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or an $SO_2$-containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms. As the —$SO_2$-containing cyclic group for $R^{210}$ which may have a substituent, an "—$SO_2$-containing polycyclic group" is preferable, and a group represented by the aforementioned general formula (a5-r-1) is more preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R^{101}$ in the aforementioned formula (b-1).

Examples of the alkylene group and alkenylene group for $Y^{201}$ include groups in which one hydrogen atom has been removed from the chain-like alkyl group or the chain-like alkenyl group given as an example of $R^{101}$ in the aforementioned formula (b-1).

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same hydrocarbon groups (which may have a substituent) as those described above for $Ya^{21}$ in the general formula (a2-1) can be mentioned. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by formula (ca-1) include cations represented by chemical formulae (ca-1-1) to (ca-1-70) shown below.

[Chemical Formula 79]

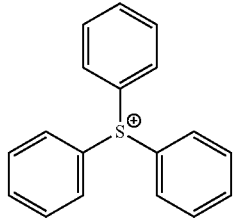

(ca-1-1)

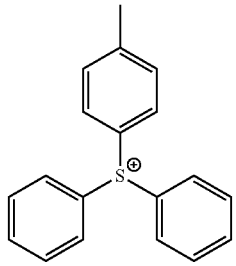

(ca-1-2)

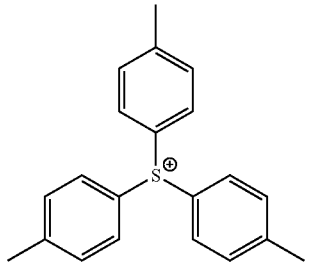

(ca-1-3)

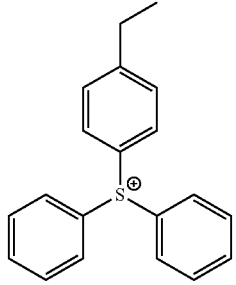

(ca-1-4)

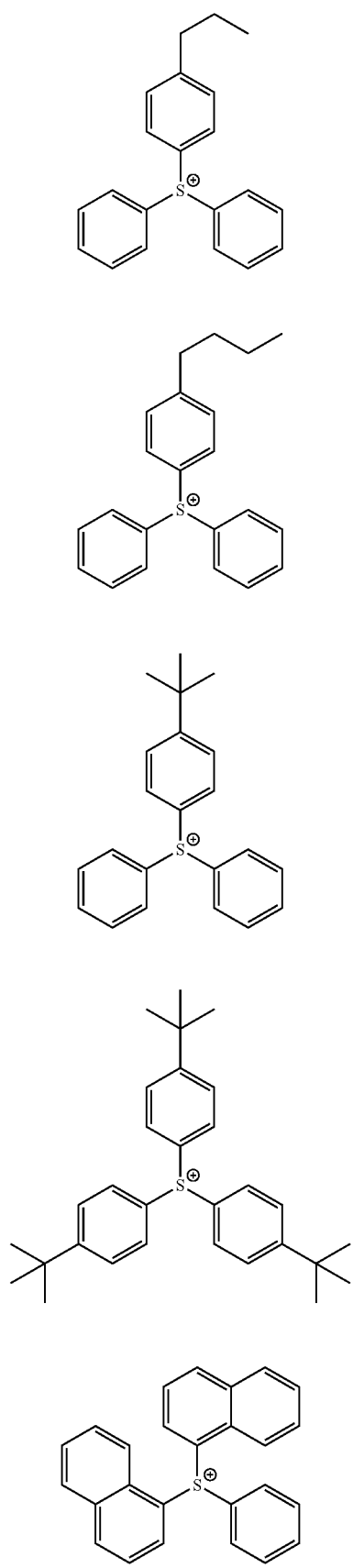
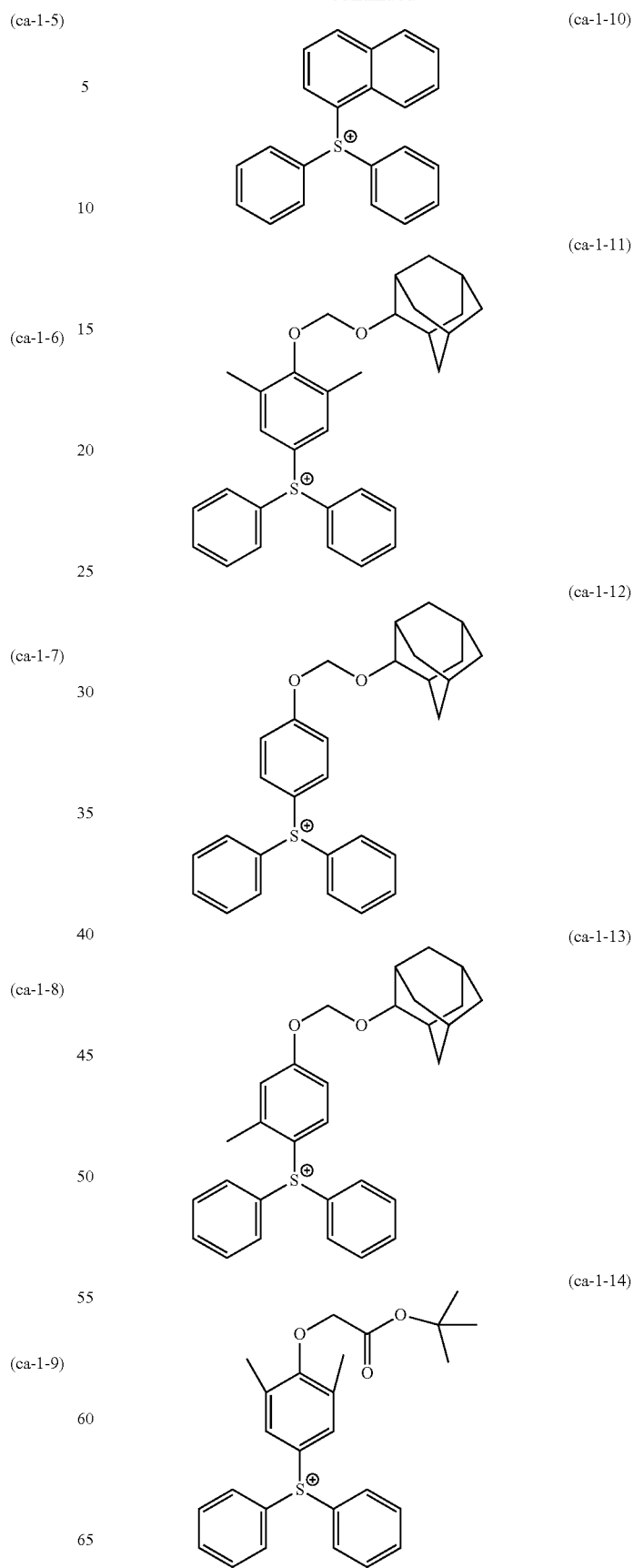

(ca-1-15)
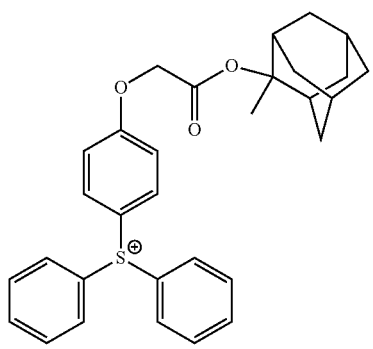
(ca-1-16)
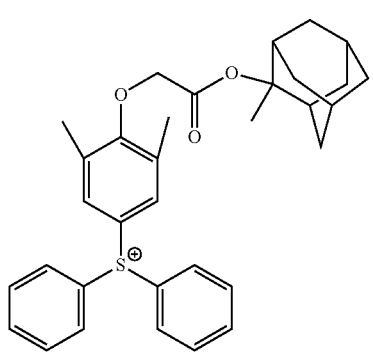
[Chemical Formula 80]
(ca-1-17)
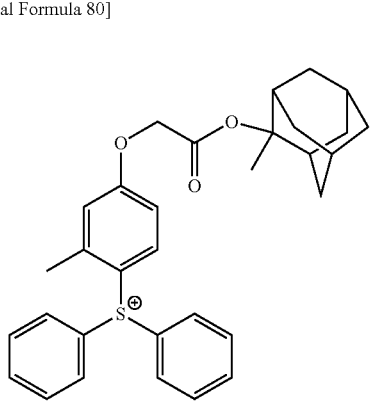
(ca-1-18)
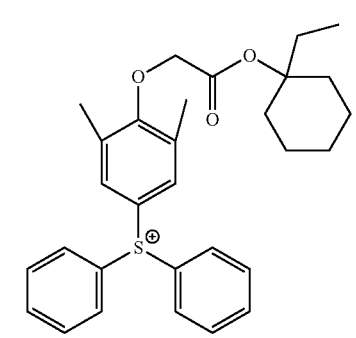
(ca-1-19)
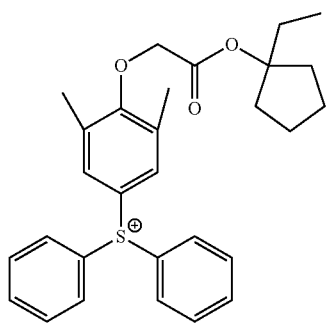
(ca-1-20)
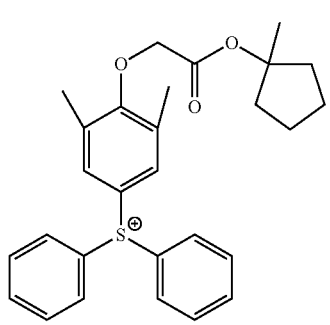
(ca-1-21)
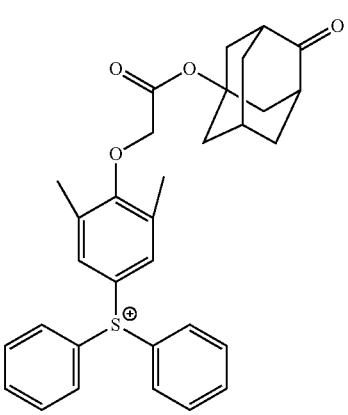
(ca-1-22)
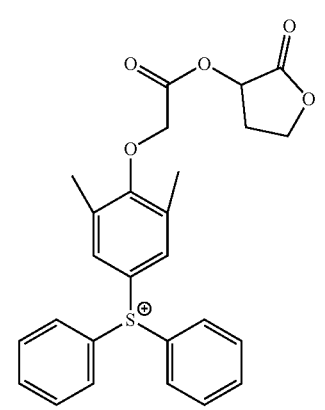

(ca-1-23)
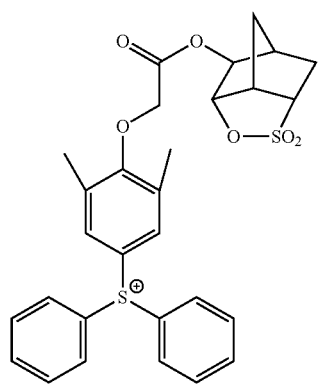
(ca-1-24)
(ca-1-25)
(ca-1-26)
(ca-1-27)
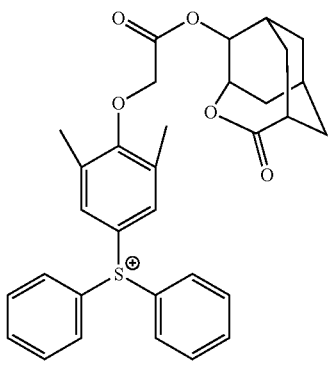
(ca-1-28)
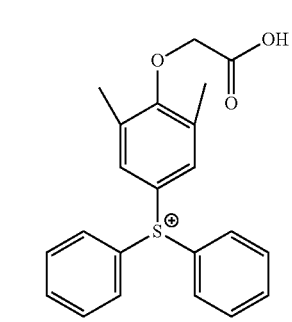
(ca-1-29)
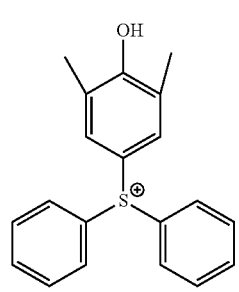
(ca-1-30)
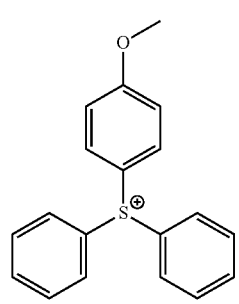
(ca-1-31)
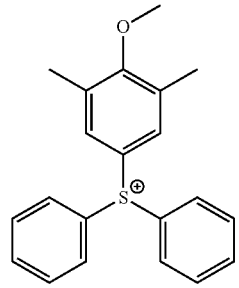

(ca-1-32)
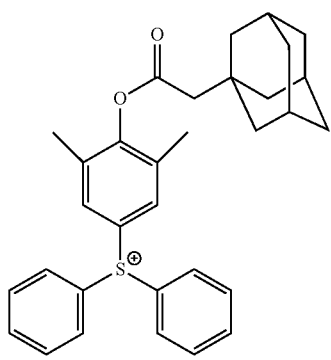
(ca-1-33)
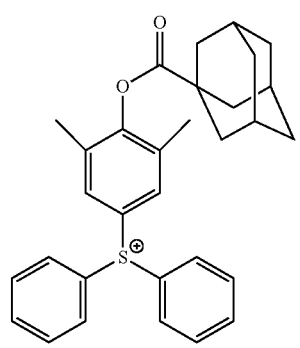
[Chemical Formula 81]
(ca-1-34)
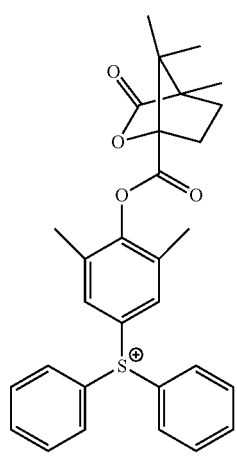
(ca-1-35)
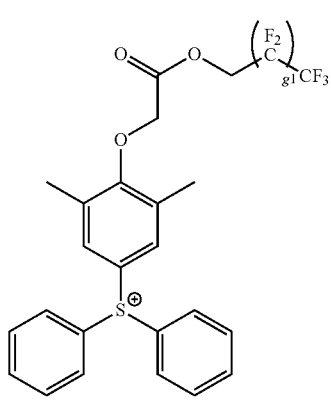
(ca-1-36)
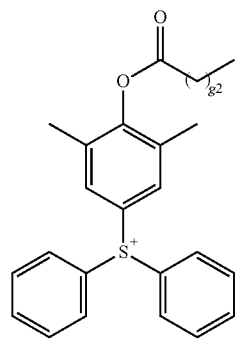
(ca-1-37)
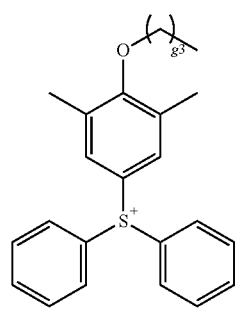
(ca-1-38)
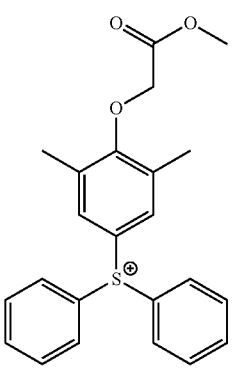
(ca-1-39)
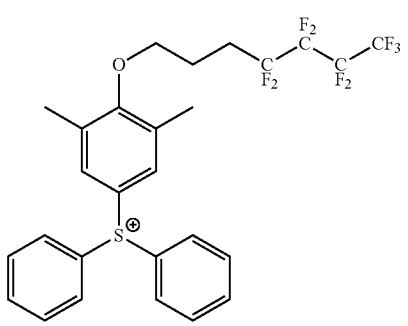

-continued
(ca-1-40)
(ca-1-41)
(ca-1-42)
(ca-1-43)
(ca-1-44)
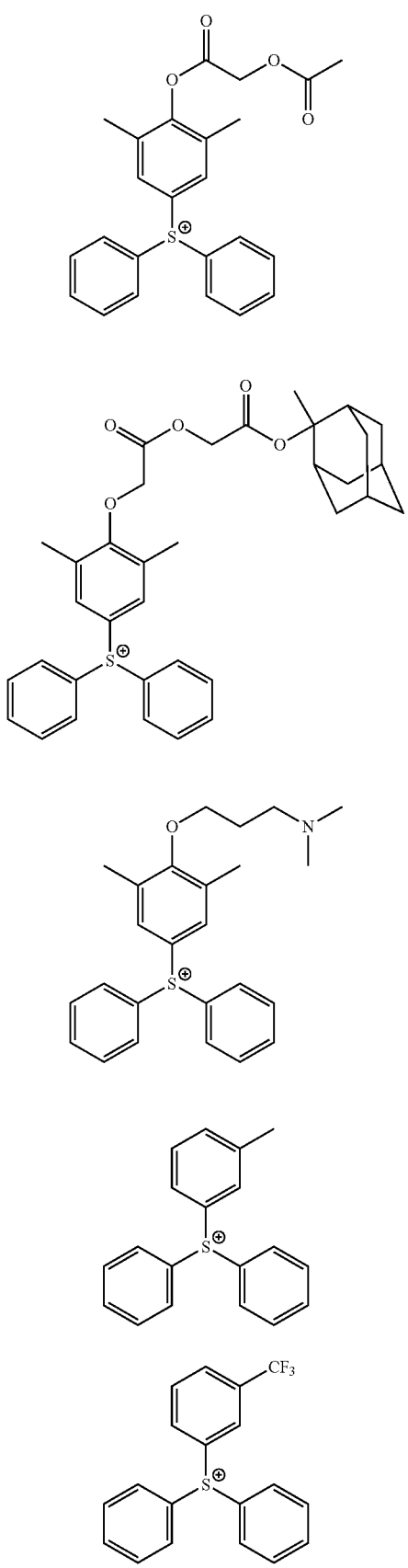
-continued
(ca-1-45)
(ca-1-46)
(ca-1-47)
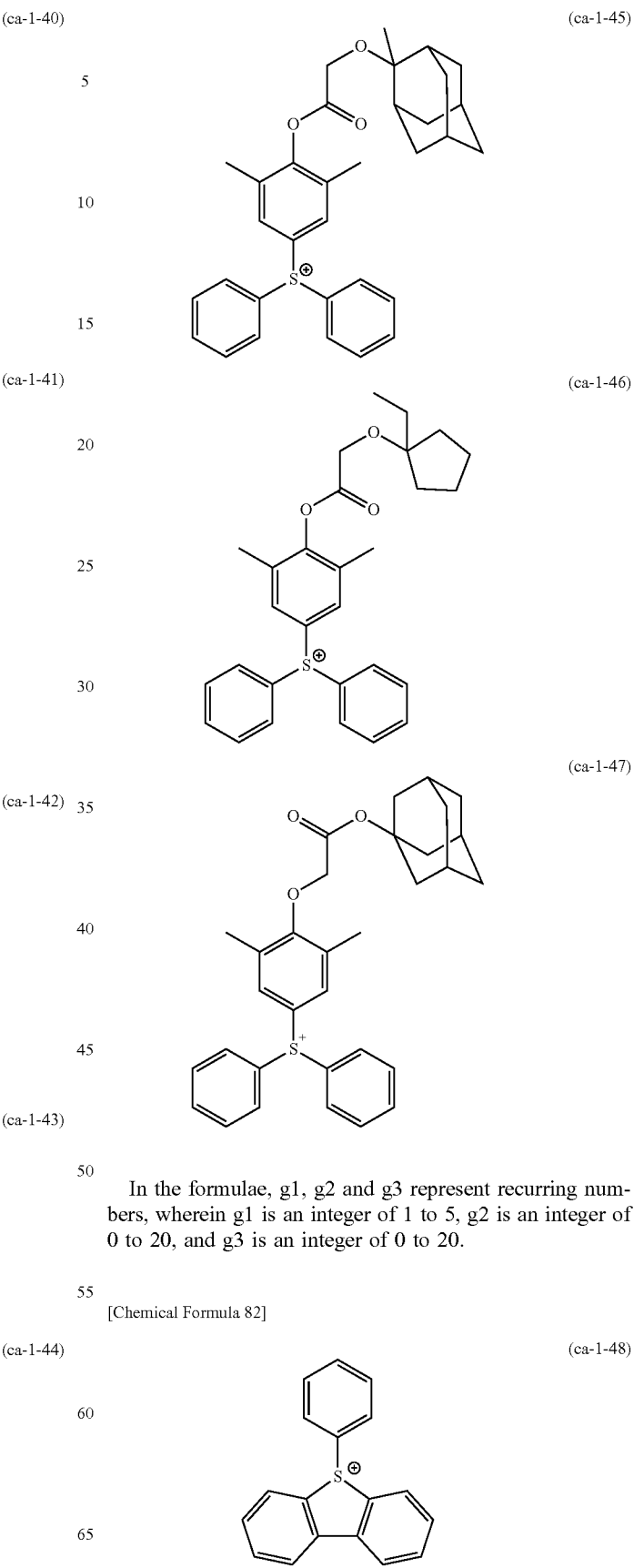
In the formulae, g1, g2 and g3 represent recurring numbers, wherein g1 is an integer of 1 to 5, g2 is an integer of 0 to 20, and g3 is an integer of 0 to 20.
[Chemical Formula 82]
(ca-1-48)

-continued
(ca-1-49)
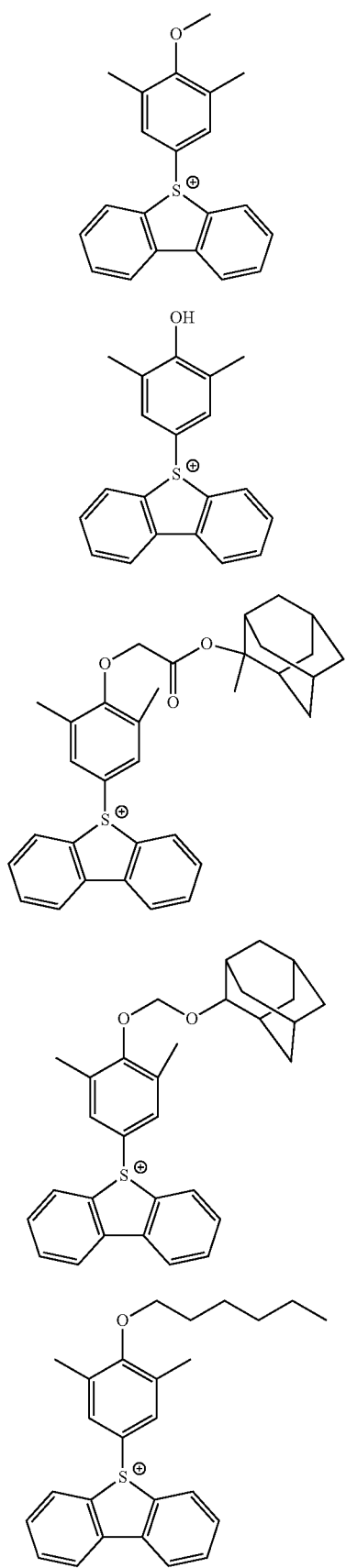
(ca-1-50)
(ca-1-51)
(ca-1-52)
(ca-1-53)
-continued
(ca-1-54)
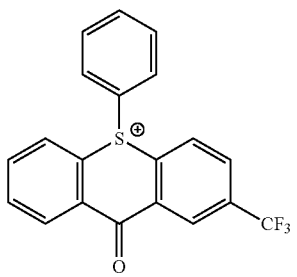
[Chemical Formula 83]
(ca-1-55)
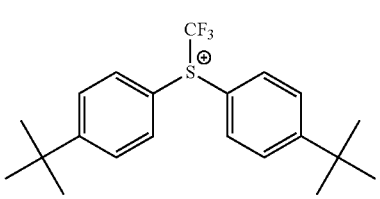
(ca-1-56)
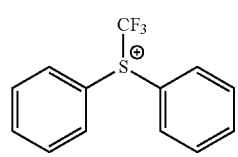
(ca-1-57)
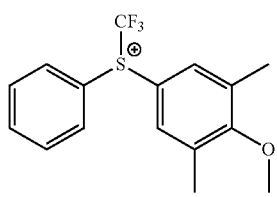
(ca-1-58)
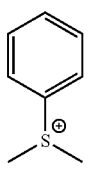
(ca-1-59)
(ca-1-60)
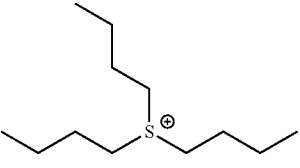
(ca-1-61)
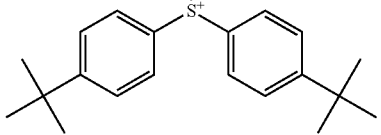

[Chemical Formula 84]
(ca-1-62) 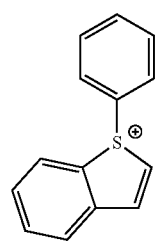
(ca-1-63) 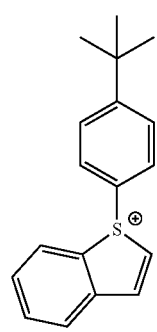
(ca-1-64) 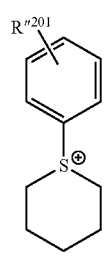
(ca-1-65) 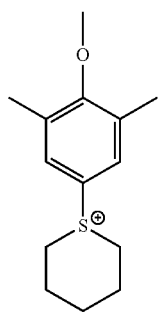
(ca-1-66) 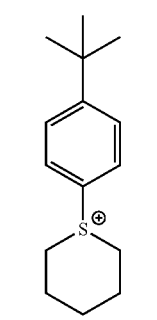
(ca-1-67) 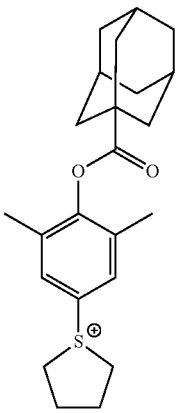
(ca-1-68) 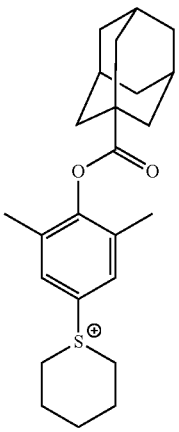
(ca-1-69) 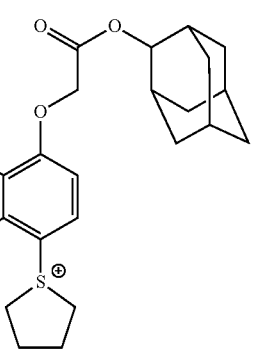
(ca-1-70) 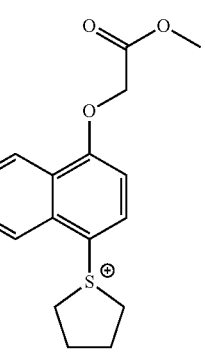
In the formulae, $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by the formula (ca-2) include a diphenyliodonium cation and a bis(4-tert-butylphenyl)iodonium cation.

Specific examples of preferable cations represented by formula (ca-3) include cations represented by formulae (ca-3-1) to (ca-3-6) shown below.

[Chemical Formula 85]

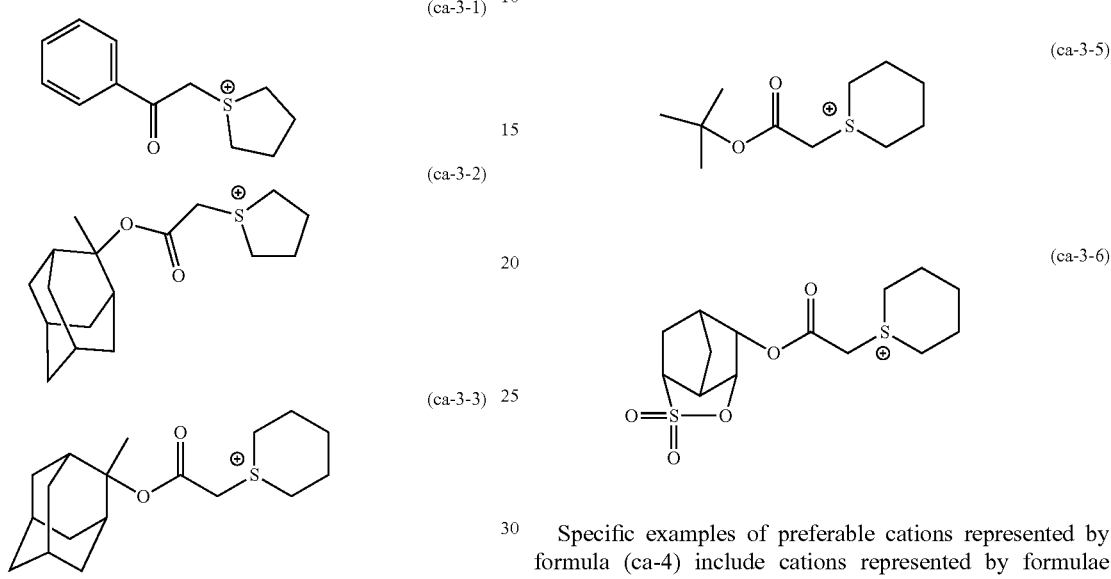

Specific examples of preferable cations represented by formula (ca-4) include cations represented by formulae (ca-4-1) and (ca-4-2) shown below.

[Chemical Formula 86]

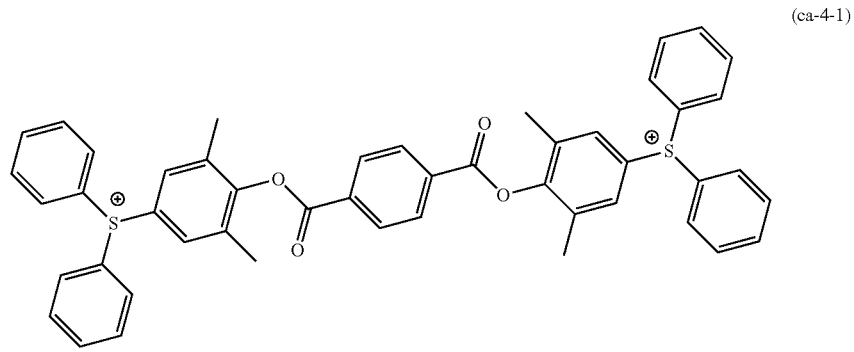

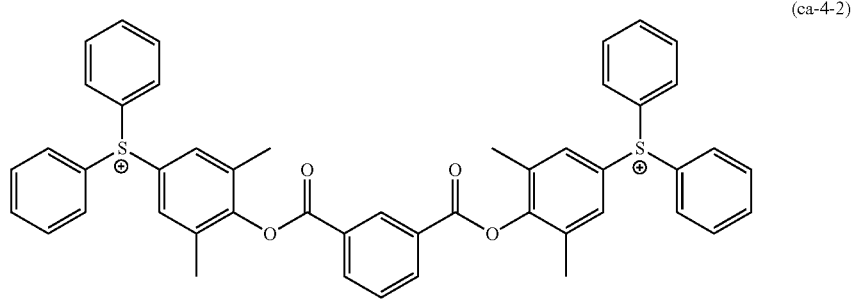

Specific examples of preferable cations represented by formula (ca-5) include cations represented by formulae (ca-5-1) to (ca-5-3) shown below.
[Chemical Formula 87]
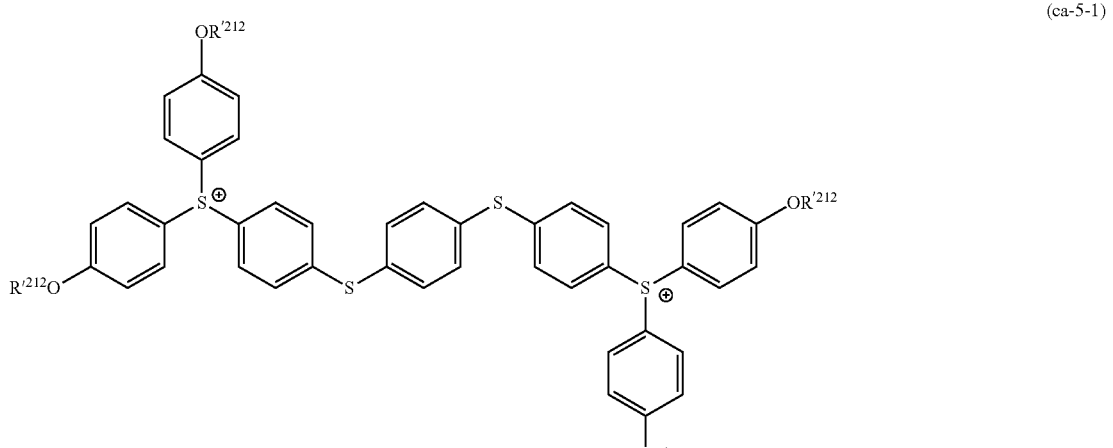
(ca-5-1)
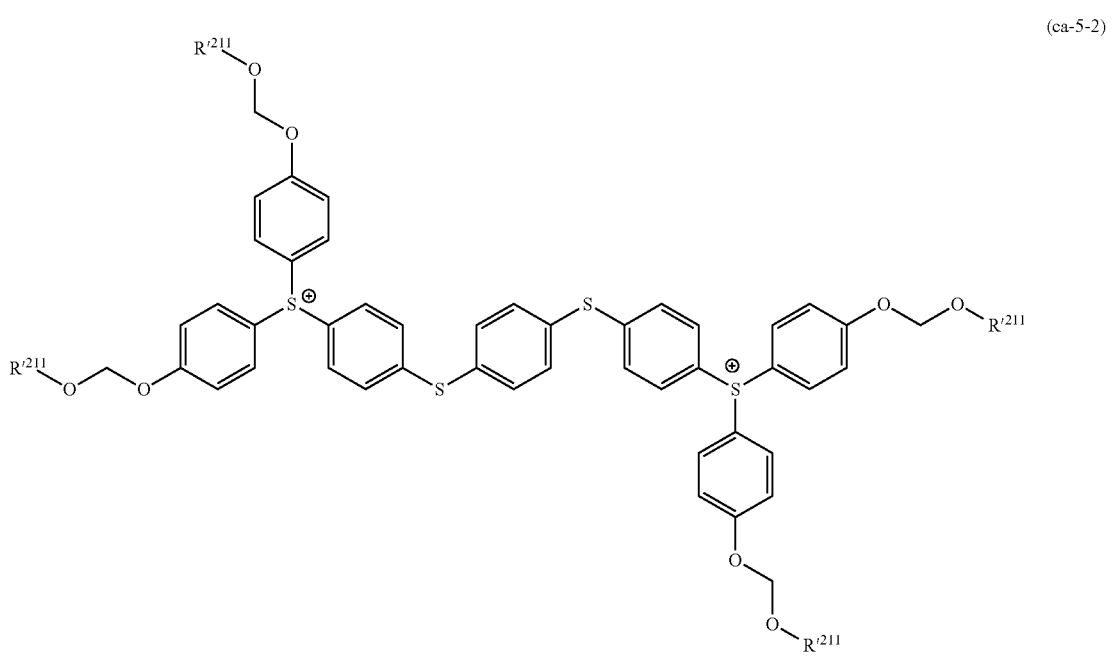
(ca-5-2)
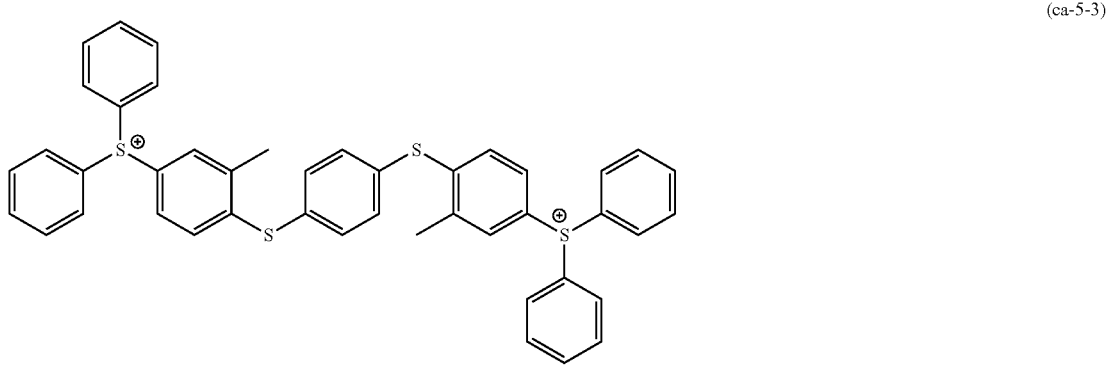
(ca-5-3)

Among these examples, as the cation moiety (($M^{m+}$)$_{l/m}$), a cation represented by general formula (ca-1) is preferable.

In the resist composition of the present embodiment, as the component (B), one kind of compound may be used, or two or more kinds of compounds may be used in combination.

When the resist composition contains the component (B), the amount of the component (B) relative to 100 parts by weight of the component (A) is preferably less than 50 parts by weight, more preferably 1 to 40 parts by weight, and still more preferably 5 to 25 parts by weight.

When the amount of the component (B) is within the above-mentioned preferable range, a pattern may be satisfactorily formed. Further, by virtue of the above-mentioned range, when each of the components are dissolved in an organic solvent, a homogeneous solution may be more reliably obtained and the storage stability of the resist composition becomes satisfactory.

<<Organic Solvent (S)>>

The resist composition of the present embodiment may be prepared by dissolving the resist materials for the resist composition in an organic solvent (hereafter, referred to as "component (S)").

The component (S) may be any organic solvent which can dissolve the respective components to give a homogeneous solution, and any organic solvent can be appropriately selected from those which have been conventionally known as solvents for a chemically amplified resist composition.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

In the resist composition of the present embodiment, as the component (S), one kind of solvent may be used, or two or more kinds of solvents may be used as a mixed solvent. Among these examples, PGMEA, PGME, γ-butyrolactone, EL and cyclohexanone are preferable.

Further, as the component (S), a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate. In general, the component (S) is used in an amount such that the solid content of the resist composition becomes within the range from 0.1 to 20% by weight, and preferably from 0.2 to 15% by weight.

In the present embodiment, the resist composition may contain, in addition to the aforementioned components (A), (B) and (S), any other optional components. Examples of optional components include the component (D), the component (E) and the component (F).

<<Component (D)>>

The resist composition according to the present embodiment may include a basic component (hereafter, sometimes referred to as "component (D)"), in addition to the component (A), or in addition to the component (A) and the component (B). The component (D) functions as an acid diffusion control agent, i.e., a quencher which traps the acid generated in the resist composition upon exposure.

The component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

When a resist pattern is formed using a resist composition containing the component (D), the contrast between exposed portions and unexposed portions of the resist film is further improved.

Component (D1)

When a resist pattern is formed using a resist composition containing the component (D1), the contrast between exposed portions and unexposed portions of the resist film is further improved. The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions of the resist film, the components (d1-1) to (d1-3) are decomposed and then lose the ability of controlling of acid diffusion (i.e., basicity), and therefore the components (d1-1) to (d1-3) cannot function as a quencher, whereas at unexposed portions of the resist film, the components (d1-1) to (d1-3) functions as a quencher.

[Chemical Formula 88]

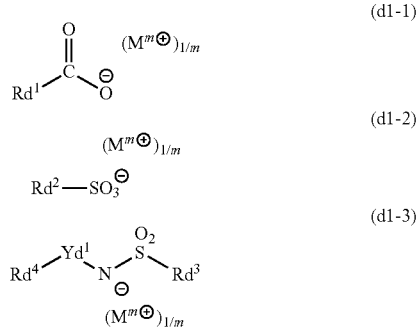

In the formulae, $Rd^1$ to $Rd^4$ represent a cyclic group which may have a substituent, a chain alkyl group which may have a substituent or a chain alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; m represents an integer of 1 or more; and each $M^{m+}$ independently represents an organic cation having a valency of m.

{Component (d1-1)}
Anion Moiety

In formula (d1-1), $Rd^1$ represents a cyclic group which may have a substituent, a chain alkyl group which may have a substituent or a chain alkenyl group which may have a substituent, and is the same groups as those defined above for $R'^{201}$.

Among these, as the group for $Rd^1$, an aromatic hydrocarbon group which may have a substituent, an aliphatic cyclic group which may have a substituent and a chain-like alkyl group which may have a substituent are preferable. Examples of the substituent for these groups include a hydroxy group, an oxo group, an alkyl group, an aryl group, a fluorine atom, a fluorinated alkyl group, a lactone-containing cyclic group represented by any one of the aforementioned formulae (a2-r-1) to (a2-r-7), an ether bond, an ester bond, and a combination thereof. In the case where an ether bond or an ester bond is included as the substituent, the substituent may be bonded via an alkylene group, and a linking group represented by any one of the aforementioned formulae (y-a1-1) to (y-a1-5) is preferable as the substituent.

Preferable examples of the aromatic hydrocarbon group include a phenyl group, a naphthyl group, and a polycyclic structure containing a bicyclooctane skeleton (a polycyclic structure constituted of a bicyclooctane skeleton and a ring structure other than bicyclooctane).

Examples of the aliphatic cyclic group include groups in which one or more hydrogen atoms have been removed from a polycycloalkane such as adamantane, norbomane, isobomane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is particularly desirable.

Specific examples of preferable anion moieties for the component (d1-1) are shown below.

[Chemical Formula 89]

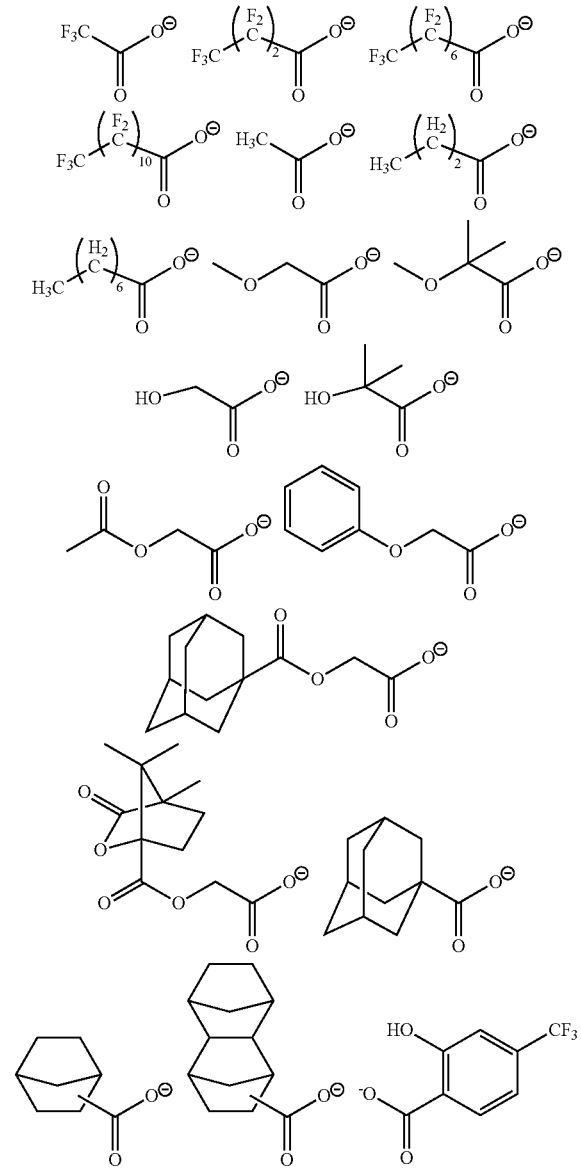

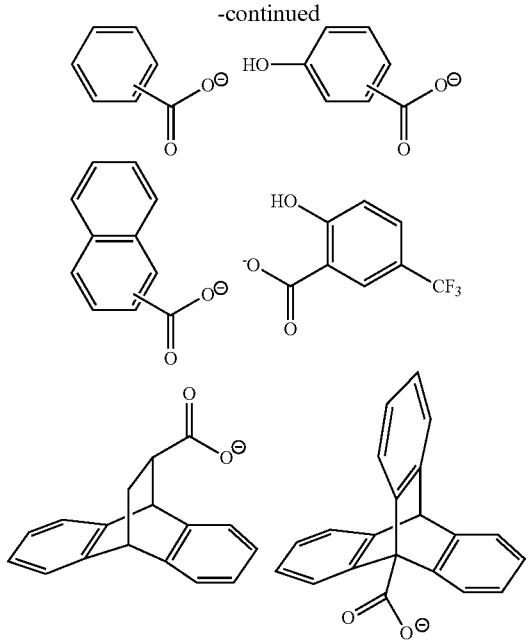

Cation Moiety

In formula (d1-1), $M^{m+}$ represents an organic cation having a valency of m.

As the organic cation for $M^{m+}$, for example, the same cation moieties as those represented by the aforementioned formulae (ca-1) to (ca-4) are preferable, cation moieties represented by the aforementioned general formulae (ca-1) is preferable, and cation moieties represented by the aforementioned formulae (ca-1-1) to (ca-1-78), (ca-1-101) to (ca-1-149) are still more preferable.

As the component (d1-1), one kind of compound may be used, or two or more kinds of compounds may be used in combination.

{Component (d1-2)}

Anion Moiety

In formula (d1-2), $Rd^2$ represents a cyclic group which may have a substituent, a chain alkyl group which may have a substituent or a chain alkenyl group which may have a substituent, and is the same groups as those defined above for $R'^{201}$.

However, the carbon atom adjacent to the sulfur atom within the $Rd^2$ has no fluorine atom bonded thereto. As a result, the anion of the component (d1-2) becomes an appropriately weak acid anion, thereby improving the quenching ability of the component (D).

As $Rd^2$, a chain-like alkyl group which may have a substituent or an aliphatic cyclic group which may have a substituent is preferable. The chain-like alkyl group preferably has 1 to 10 carbon atoms, and more preferably 3 to 10 carbon atoms. As the aliphatic cyclic group, a group in which one or more hydrogen atoms have been removed from adamantane, norbomane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic cyclic group, chain-like alkyl group) for $Rd^1$ in the formula (d1-1) can be mentioned.

Specific examples of preferable anion moieties for the component (d1-2) are shown below.

[Chemical Formula 90]

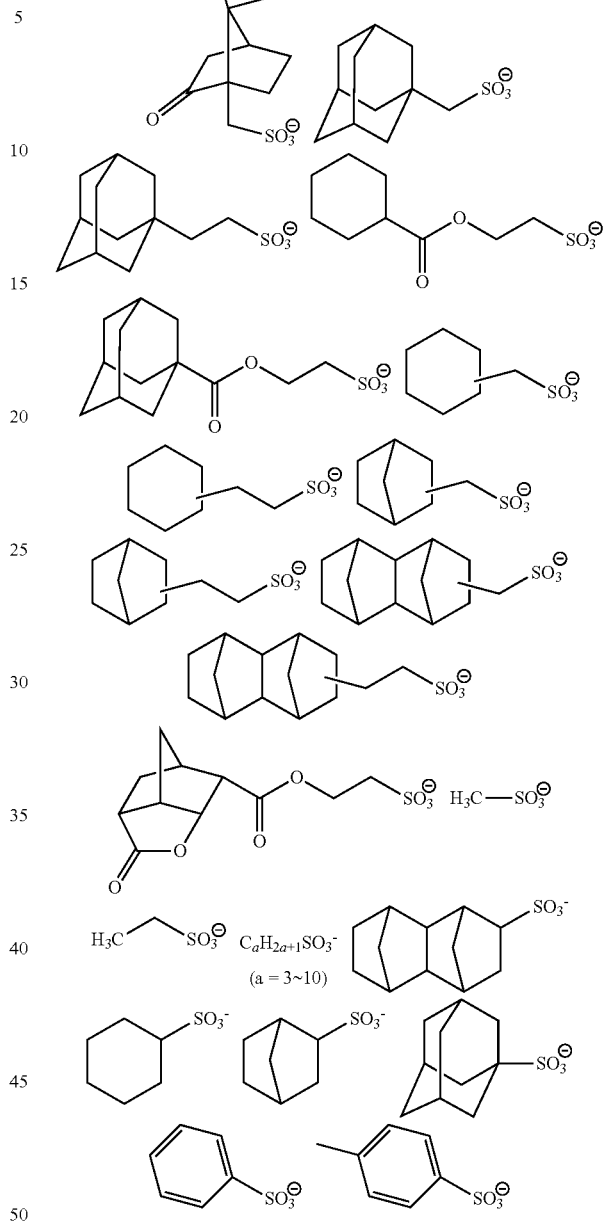

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}

Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for $R'^{201}$, and a cyclic group containing a fluorine atom, a chain alkyl group or a chain alkenyl group is preferable. Among these, a fluorinated alkyl group is preferable, and more preferably the same fluorinated alkyl groups as those described above for Rd¹.

In formula (d1-3), Rd⁴ represents a cyclic group which may have a substituent, a chain alkyl group which may have a substituent or a chain alkenyl group which may have a substituent, and is the same groups as those defined above for R'²⁰¹.

Among these, an alkyl group which may have substituent, an alkoxy group which may have substituent, an alkenyl group which may have substituent or a cyclic group which may have substituent is preferable.

The alkyl group for Rd⁴ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for Rd⁴ may be substituted with a hydroxy group, a cyano group or the like.

The alkoxy group for Rd⁴ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

The alkenyl group for Rd⁴ is the same as defined for the alkenyl group for R'²⁰¹, and a vinyl group, a propenyl group (an allyl group), a 1-methylpropenyl group or a 2-methylpropenyl group is preferable. These groups may have an alkyl group of 1 to 5 carbon atoms or a halogenated alkyl group of 1 to 5 carbon atoms as a substituent.

As the cyclic group for Rd⁴, the same groups as those described above for R'²⁰¹ may be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When Rd⁴ is an alicyclic group, the resist composition can be satisfactorily dissolved in an organic solvent, thereby improving the lithographic properties. Alternatively, when Rd⁴ is an aromatic group, the resist composition exhibits an excellent photoabsorption efficiency in a lithography process using EUV or the like as the exposure source, thereby resulting in the improvement of the sensitivity and the lithographic properties.

In formula (d1-3), Yd¹ represents a single bond or a divalent linking group. The divalent linking group for Yd¹ is not particularly limited, and examples thereof include a divalent hydrocarbon group (aliphatic hydrocarbon group, or aromatic hydrocarbon group) which may have a substituent and a divalent linking group containing a hetero atom. The divalent linking groups are the same as defined for the divalent hydrocarbon group which may have a substituent and the divalent linking group containing a hetero atom explained above as the divalent linking group for Ya²¹ in the aforementioned formula (a2-1).

As Yd¹, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 91]

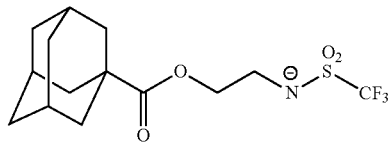

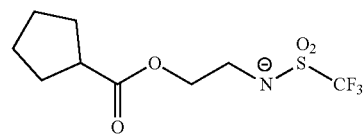

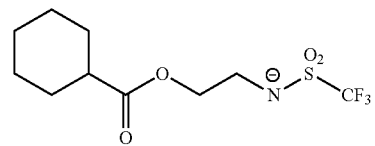

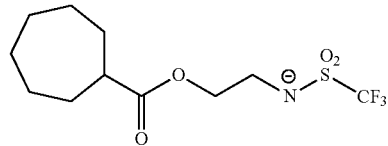

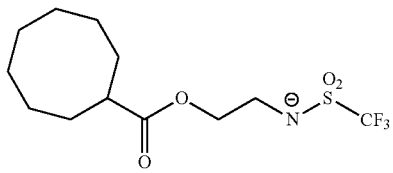

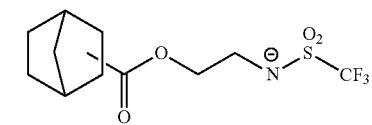

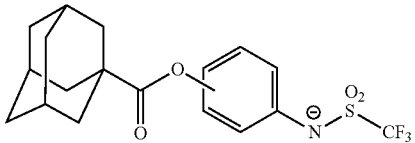

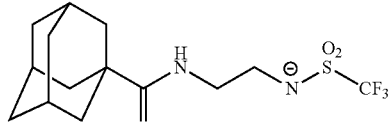

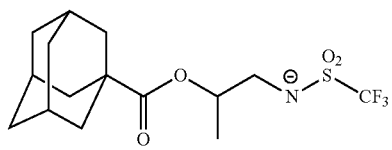

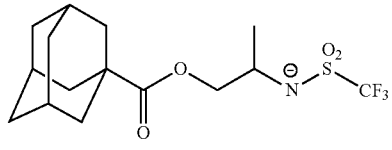

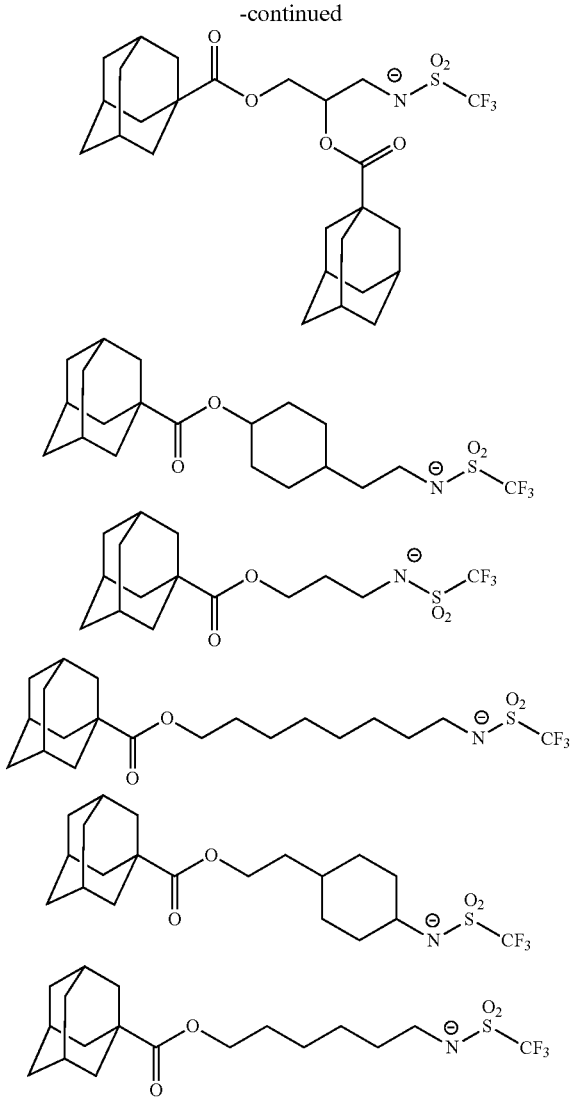

[Chemical Formula 92]

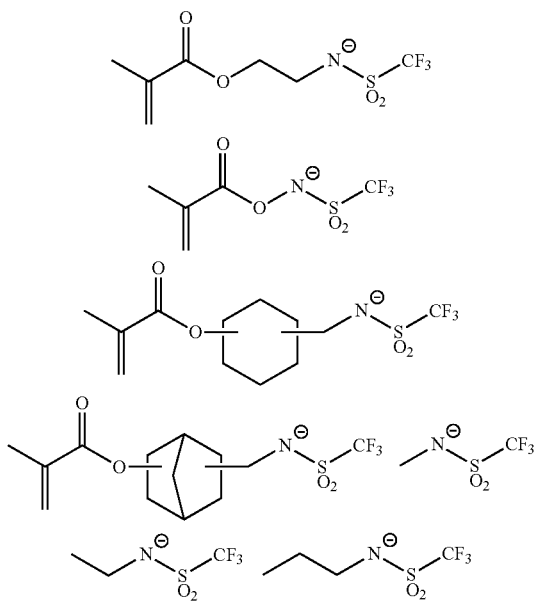

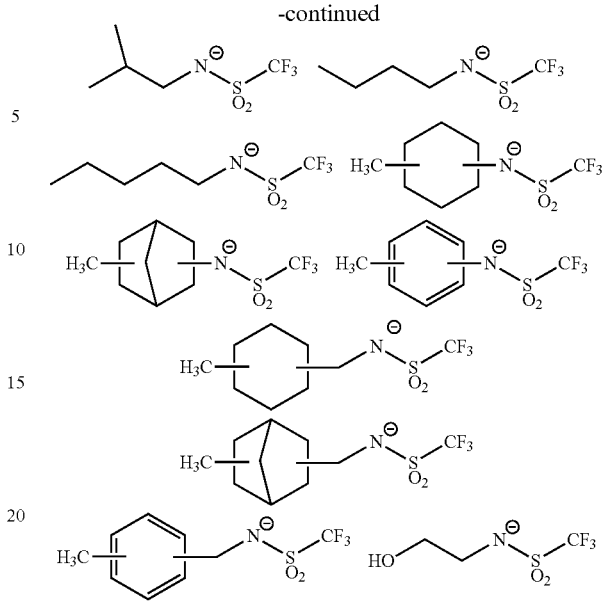

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

In the case where the resist composition contains the component (D1), the amount of the component (D1) relative to 100 parts by weight of the component (A) is preferably within a range from 0.5 to 20 parts by weight, more preferably from 1 to 15 parts by weight, and still more preferably from 5 to 10 parts by weight.

When the amount of the component (D1) is at least as large as the lower limit of the above-mentioned range, excellent lithographic properties and excellent resist pattern shape may be more reliably obtained. On the other hand, when the amount of the component (D1) is no more than the upper limit of the above-mentioned range, sensitivity can be maintained at a satisfactory level, and through-put becomes excellent.

Production Method of Component (D1):

The production methods of the components (d1-1) and (d1-2) are not particularly limited, and the components (d1-1) and (d1-2) can be produced by conventional methods.

Further, the production method of the component (d1-3) is not particularly limited, and the component (d1-3) can be produced in the same manner as disclosed in US2012-0149916.

Component (D2)

The acid diffusion control component may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine is preferable, and a secondary aliphatic amine or tertiary aliphatic amine is more preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine. The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris {2-(2-methoxyethoxy) ethyl}amine, tris {2-(2-methoxyethoxymethoxy) ethyl}amine, tris {2-(1-methoxyethoxy)ethyl}amine, tris {2-(1-ethoxy ethoxy)ethyl}amine, tris {2-(1-ethoxy-propoxy)ethyl}amine, tris[2-{2-(2-hydroxyethoxy) ethoxy}ethyl]amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof, as well as tribenzylamine, 2,6-diisopropylaniline and N-tert-butoxycarbonylpyrrolidine.

As the component (D2), one kind of compound may be used, or two or more kinds of compounds may be used in combination. When the resist composition contains the component (D2), the amount of the component (D2) is typically used in an amount within a range from 0.01 to 5 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

<<At Least One Compound (E) Selected from the Group Consisting of an Organic Carboxylic Acid, or a Phosphorus Oxo Acid or Derivative Thereof>>

In the resist composition of the present embodiment, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof may be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

In the resist composition of the present embodiment, as the component (E), one kind of compound may be used, or two or more kinds of compounds may be used in combination.

When the resist composition contains the component (E), the amount of the component (E) is typically used in an amount within a range from 0.01 to 5 parts by weight, relative to 100 parts by weight of the component (A).

<<Fluorine Additive (F)>>

In the present embodiment, the resist composition may further include a fluorine additive (hereafter, referred to as "component (F)") for imparting water repellency to the resist film, or improving lithography properties.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of the structural unit (f1) and the aforementioned structural unit (a1); and a copolymer of the structural unit (f1), a structural unit derived from acrylic acid or methacrylic acid and the aforementioned structural unit (a1) are preferable. As the structural unit (a1) to be copolymerized with the structural unit (f1), a structural unit derived from 1-ethyl-1-cyclooctyl (meth) acrylate or a structural unit derived from 1-methyl-1-adamantyl (meth)acrylate is preferable.

[Chemical Formula 93]

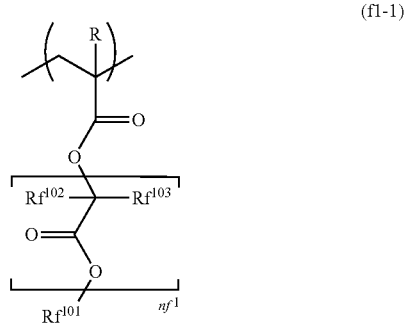

(f1-1)

In the formula, R is the same as defined above; $Rf^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 0 to 5; and $Rf^{101}$ represents an organic group containing a fluorine atom.

In formula (f1-1), R bonded to the carbon atom on the α-position is the same as defined above. As R, a hydrogen atom or a methyl group is preferable.

In formula (f1-1), as the halogen atom for $Rf^{102}$ and $Rf^{103}$, a fluorine atom is preferable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms. As the halogen atom, a fluorine atom is most preferable. Among these, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable. In formula (f1-1), $nf^1$ represents an integer of 0 to 5, preferably an integer of 0 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 6 carbon atoms is preferable, and a trifluoromethyl group, —$CH_2$—$CF_3$, —$CH_2$—$CF_2$—$CF_3$, —$CH(CF_3)_2$, —$CH_2$—$CH_2$—$CF_3$, and —$CH_2$—$CH_2$—$CF_2$—$CF_2$—$CF_2$—$CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight (Mw) is no more than the upper limit of the above-mentioned range, the resist may exhibit satisfactory solubility in a resist solvent. On the other hand, when the weight average molecular weight (Mw) is at least as large as the lower limit of the above-mentioned range, the water repellency of the resist film may become satisfactory.

Further, the dispersity (Mw/Mn) of the component (F) is preferably 1.0 to 5.0, more preferably 1.0 to 3.0, and most preferably 1.0 to 2.5.

In the resist composition of the present embodiment, as the component (F), one kind of compound may be used, or two or more kinds of compounds may be used in combination.

When the resist composition contains the component (F), the component (F) is used in an amount within a range from 0.5 to 10 parts by weight, relative to 100 parts by weight of the component (A).

If desired, other miscible additives may also be added to the resist composition of the present embodiment. Examples of such miscible additives include additive resins for improving the performance of the resist film, dissolution inhibitors, plasticizers, stabilizers, colorants, halation prevention agents, and dyes.

After dissolving the resist materials in the organic solvent (S), the resist composition of the present embodiment may have impurities or the like removed by using a polyimide porous film, a polyamide-imide porous film, or the like. For example, the resist composition may be subjected to filtration using a filter formed of a polyimide porous membrane, a filter formed of a polyamide-imide porous film, or a filter formed of a polyimide porous membrane and a polyamide-imide porous film. Examples of the polyimide porous membrane and the polyamide-imide porous film include those described in Japanese Unexamined Patent Application, First Publication No. 2016-155121.

<Step (via)>

Step (via) is a step of forming a resist film on a substrate using the resist composition.

In this step, the aforementioned resist composition is applied to a substrate using a spinner or the like, and a bake treatment (post applied bake (PAB)) is conducted at a temperature of 80 to 150° C., preferably 100 to 150° C. (more preferably higher than 100° C. and no more than 150° C.), for 40 to 120 seconds, preferably 60 to 120 seconds, to form a resist film.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio.

More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

<Step (viia)>

Step (viia) is a step of exposing the resist film, and developing the exposed resist film to form a resist pattern.

In this step, for example, using an exposure apparatus or the like, the resist film is subjected to a selective exposure through a mask having a predetermined pattern formed thereon (mask pattern).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

Thereafter, baking treatment (post exposure baking (PEB)) is conducted under temperature conditions of 80 to 150° C., preferably 90 to 130° C., for 40 to 120 seconds, preferably 60 to 100 seconds.

Next, the exposed resist film is subjected to a developing treatment using an alkali developing solution containing a non-ionic surfactant, to form a resist pattern.

As the developing solution, an alkali developing solution containing a non-ionic surfactant is used. Examples of the developing solution include a 0.1 to 10 wt % tetramethylammoniumhydroxide (TMAH) solution containing a non-ionic surfactant.

As the non-ionic surfactant contained in the alkali developing solution, a conventional non-ionic surfactant may be used. Specific examples of the non-ionic surfactant include polyoxyethylene alkyl ethers such as polyoxyethylene lauryl ether, polyoxyethylene stearyl ether, polyoxyethylene cetyl ether, polyoxyethylene oleyl ether, and the like; polyoxyethylene alkyl allyl ethers such as polyoxyethylene octyl phenol ether, polyoxyethylene nonyl phenol ether, and the like; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, sorbitan tristearate, and the like; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, and the like; and acetylenes, such as acetyleneglycol, and an oxyethylene adduct of acetylene glycol.

The amount of the non-ionic surfactant, based on the total amount of the developing solution is preferably 0.001 to 5% by weight, more preferably 0.005 to 2% by weight, and still more preferably 0.01 to 0.5% by weight.

The developing treatment may be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

After the developing treatment, it is preferable to conduct a rinse treatment. The rinse treatment is preferably a water rinse using pure water.

After the developing treatment or the rinse treatment, drying is conducted. If desired, bake treatment (post bake) can be conducted following the developing.

In this manner, a resist pattern may be formed.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

(Eighth Aspect)

An eighth aspect of the present embodiment is a method of forming a resist pattern, including: (ib) a step of copolymerizing a compound represented by general formula (m0-1) shown below with a compound represented by general formula (m0-2) shown below by living radical polymerization to obtain an alternating copolymer represented by general formula (p0) shown below (hereafter, sometimes referred to as "step (ib)"); (iib) a step of subjecting the alternating copolymer to hydrolysis to obtain a first polymeric compound precursor represented by general formula (Pre-2a) (hereafter, sometimes referred to as "step (iib)"); (iiib) a step of reacting the first polymeric compound precursor with a compound represented by general formula (Add-1) to obtain a polymeric compound (A01) represented by general formula (p1) (hereafter, sometimes referred to as "step (iiib)"); (ivb) a step of mixing the polymeric compound (A01) with an organic solvent to prepare a resist composition (hereafter, sometimes referred to as "step (ivb) "); (vb) a step of forming a resist film on a substrate using the resist composition (hereafter, sometimes referred to as "step (vb)"); and (vib) a step of exposing the resist film, and developing the exposed resist film to form a resist pattern (hereafter, sometimes referred to as "step (vib)").

In the eighth aspect, steps (ib) to (iiib) are the same as defined for steps (ib) to (iiib) in the method of producing a polymeric compound according to the fourth aspect.

Further, in the eighth aspect, steps (ivb) to (vib) are the same as defined for steps (va) to (viia) in the seventh aspect.

(Ninth Aspect)

A ninth aspect of the present embodiment is a method of forming a resist pattern, including: (ic) a step of copolymerizing compound represented by general formula (m0-1) with a compound represented by general formula (m0-2) by living radical polymerization to obtain an alternating copolymer represented by general formula (p0) (hereafter, sometimes referred to as "step (ic)"); (iic) a step of subjecting the alternating copolymer to hydrolysis to obtain a first polymeric compound precursor represented by general formula (Pre-1a) (hereafter, sometimes referred to as "step (iic)"); (iiic) a step of reacting the first polymeric compound with a compound represented by general formula (Add-2) to obtain a second polymeric compound precursor represented by general formula (Pre-1b-2) (hereafter, sometimes referred to as "step (iiic)"); (ivc) a step of subjecting the second polymeric compound precursor to hydrolysis to obtain a polymeric compound (A02) represented by general formula (p2) (hereafter, sometimes referred to as "step (ivc)"); (vc) a step of mixing the polymeric compound (A01) with an organic solvent to prepare a resist composition (hereafter, sometimes referred to as "step (vc)"); (vie) a step of forming a resist film on a substrate using the resist composition (hereafter, sometimes referred to as "step (vic)"); and (viic) a step of exposing the resist film, and developing the exposed resist film to form a resist pattern (hereafter, sometimes referred to as "step (viic)").

In the ninth aspect, steps (ic) to (ivc) are the same as defined for steps (ic) to (ivc) in the method of producing a polymeric compound according to the fifth aspect.

Further, in the ninth aspect, steps (vc) to (viic) are the same as defined for steps (va) to (viia) in the seventh aspect.

(Tenth Aspect)

A tenth aspect of the present embodiment is a method of forming a resist pattern, including: (id) a step of copolymerizing compound represented by general formula (m0-1) with a compound represented by general formula (m0-2) by living radical polymerization to obtain an alternating copolymer represented by general formula (p0) (hereafter, sometimes referred to as "step (id)"); (iid) a step of subjecting the alternating copolymer to hydrolysis to obtain a polymeric compound precursor represented by general formula (Pre-2a) (hereafter, sometimes referred to as "step (iid)"); (iiid) a step of reacting the polymeric compound precursor with a compound represented by general formula (Add-2) to obtain a polymeric compound (A02) represented by general formula (p2) (hereafter, sometimes referred to as "step (iiid)"); (ivd) a step of mixing the polymeric compound (A02) with an organic solvent to prepare a resist composition (hereafter, sometimes referred to as "step (ivd)"); (vd) a step of forming a resist film on a substrate using the resist composition (hereafter, sometimes referred to as "step (vd)"); and (vid) a step of exposing the resist film, and developing the exposed resist film to form a resist pattern (hereafter, sometimes referred to as "step (vid)").

In the tenth aspect, steps (id) to (iiid) are the same as defined for steps (id) to (iiid) in the method of producing a polymeric compound according to the sixth aspect.

Further, in the tenth aspect, steps (ivd) to (vid) are the same as defined for steps (va) to (viia) in the seventh aspect.

In the method of forming a resist pattern according to the present embodiment, by copolymerizing a compound (monomer) (m0-1) in which the hydroxystyrene skeleton is protected by a group that can be deprotected with an acid component and a compound (monomer) (m0-2) having a specific imide structure, the polymerization may be controlled by the electronic and chemical properties, and the variation of each structural unit of the obtained alternating copolymer may be suppressed. Therefore, it is presumed that, by using a resist composition containing a polymeric compound obtained from the alternating copolymer to form a resist pattern, lithography properties may be improved.

EXAMPLES

As follows is a description of examples of the present invention, although the scope of the present invention is by no way limited by these examples.

Production Method of Alternating Copolymer

Example 1A: Production of Alternating Copolymer

In a 50 mL reaction vessel, 6.4 mg (0.0080 mol) of a RuCp* catalyst and 0.615 mL (4.0 mmol) of p-acetoxystyrene (PACS) were dissolved in 1.0 mL of cyclohexanone. Further, to the 50 mL reaction vessel, 0.02 mL (0.080 mmol) of tributylamine, 0.988 g (4.0 mmol) of monomer (M0-1-1) and 0.014 mL (0.080 mmol) of ethyl 2-chloro-2-phenylacetate were added, and a polymerization reaction was conducted at 80° C. for 24 hours. After the polymerization reaction, the reaction liquid was rapidly cooled to −78° C. in an ice bath of methanol-dry ice, so as to obtain alternating copolymer (p0-1a) (0.564 g).

With respect to the obtained alternating copolymer (p0-1a), the weight average molecular weight (Mw) and the polydispersity (Mw/Mn) were determined by the polystyrene equivalent value as measured by gel permeation chromatography (GPC). As a result, it was found that the weight average molecular weight was 13,700, and the polydispersity was 1.25.

Further, as a result of an analysis by carbon 13 nuclear magnetic resonance spectroscopy (150 MHz_$^{13}$C-NMR) and proton 1 nuclear magnetic resonance spectroscopy (600 MHz_$^1$H-NMR), it was found that the composition of the copolymer (ratio (molar ratio) of the respective structural units within the structural formula) was l/m=50/50.

[Chemical Formula 94]

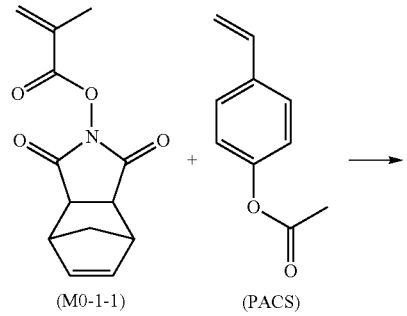

(M0-1-1)   (PACS)

[Chemical Formula 95]

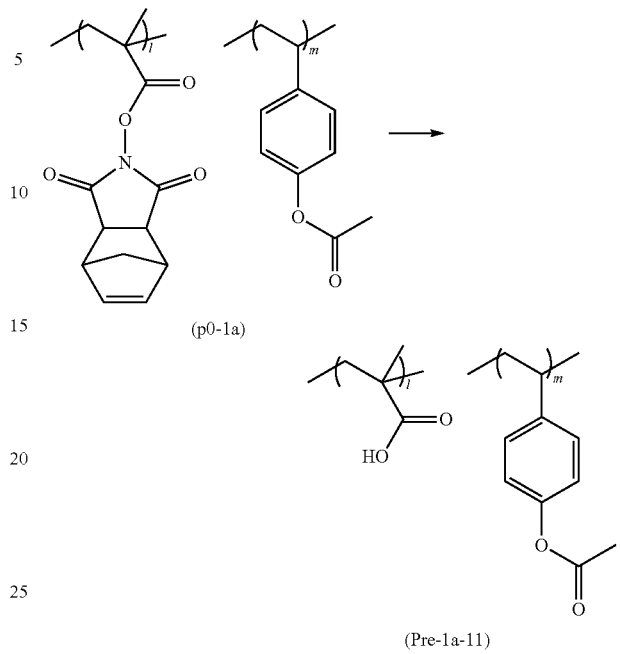

(p0-1a)

(Pre-1a-11)

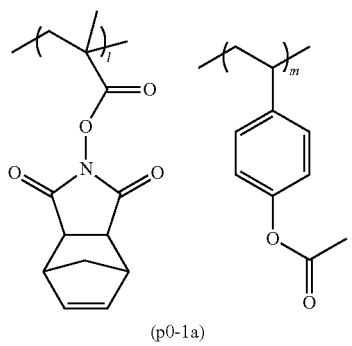

(p0-1a)

With respect to the alternating copolymer (p0-1a), alternating copolymerizability was evaluated using MALDI-TOF-MS. As a result, the peaks of each structural unit were alternately observed, and it was confirmed that variation in each structural unit in the alternating copolymer was small.

Production Example of Polymeric Compound

Example 2A: Production of Polymeric Compound (1a)

Alternating copolymer (p0-1a) was obtained in the same manner as in Example 1A. The alternating copolymer (p0-1a) (0.15 mol (30.71 g)) and hydrazine monohydrate (0.19 mol) were dissolved in THF (200 mL), followed by stirring at 65° C. for 4 hours.

After cooling the reaction liquid to room temperature, the reaction liquid was further cooled to 0° C. Then, hydrochloric acid (100 mL) was dropwise added to the resultant, and the obtained powder was collected. The powder was dried under reduced pressure, so as to obtain first polymeric compound precursor (Pre-1a-11) (0.13 mol (16.14 g)).

In a 500 mL three-necked flask, first polymeric compound precursor (Pre-1a-11) (0.13 mol (16.14 g)) was dissolved in a triple amount of dichloromethane, followed by purging the three-necked flask with nitrogen and cooling to 5° C. To the resultant was dropwise added a dichloromethane solution of 4-dimethylaminopyridine (DMAP) (0.03 mol) over 5 minutes while maintaining the temperature at lower than 10° C. Then, tert-butylalcohol (0.45 mol) was dropwise added to the resultant over 15 minutes, followed by maturing for 10 minutes.

Then, a dichloromethane solution of 1-(3-dimethylaminopropyl)-3-ethylcarbodiimide hydrochloride (EDC/HCl) (0.38 mol) was dropwise added to the resultant over 90 minutes while maintaining the temperature at 10° C. or lower, followed by stirring at 10° C. or lower for 18 hours.

Thereafter, the resultant was washed with a 1% hydrochloric acid, and the organic phase was collected. Then, water washing was conducted 3 times.

Thereafter, the organic phase was concentrated, and tert-butyl methyl ether (TBME) was dropwise added to the concentrated liquid over 1 hour.

The solid content was collected and dried under reduced pressure, so as to obtain second polymeric compound precursor (Pre-1b-111) (0.10 mol (16.52 g)).

[Chemical Formula 96]

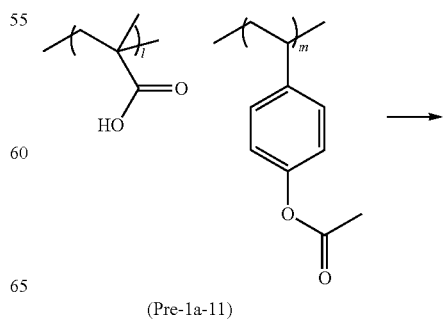

(Pre-1a-11)

-continued

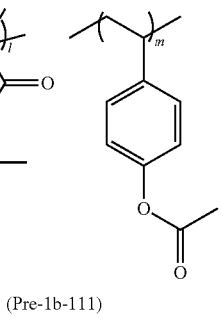

(Pre-1b-111)

Second polymeric compound precursor (Pre-1b-111) (0.1 mol (16.52 g)) was dissolved in methyl ethyl ketone (MEK), and using an equimolar amount of a 1% aqueous solution of $K_2CO_3$, stirring was conducted at room temperature for 1 hour.

The resultant was dropwise added to a heptane/isopropylalcohol mixed solvent over 30 minutes, and a powder was precipitated.

The obtained powder was subjected to dispersion washing with a heptane/isopropylalcohol mixed solvent a plurality of times.

The solid content was collected and dried under reduced pressure, so as to obtain polymeric compound (p1-1a) (0.06 mol (7.8 g)).

With respect to the polymeric compound (p1-1a), the weight average molecular weight (Mw) was determined by the polystyrene equivalent value as measured by gel permeation chromatography (GPC). As a result, it was found that the weight average molecular weight was 9,000.

Further, as a result of an analysis by carbon 13 nuclear magnetic resonance spectroscopy (150 MHz_$^{13}$C-NMR) and proton 1 nuclear magnetic resonance spectroscopy (600 MHz_$^1$H-NMR), it was found that the composition of the copolymer (ratio (molar ratio) of the respective structural units within the structural formula) was l/m=50/50.

[Chemical Formula 97]

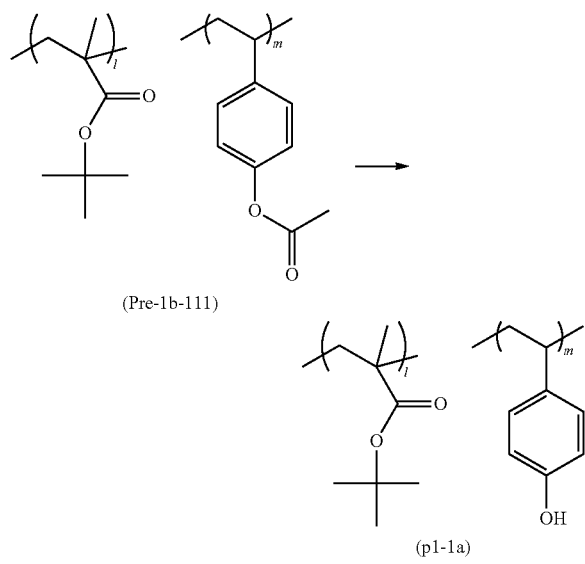

Example 3A: Production of Polymeric Compound (2a)

Alternating copolymer (p0-1a) was obtained in the same manner as in Example 1A. Alternating copolymer (p0-1a) (0.15 mol (29.50 g)) was dissolved in methyl ethyl ketone (MEK) (100 mL), and using methanesulfonic acid (50 mL), stirring was conducted at room temperature for 1 hour.

The resultant was dropwise added to a heptane/isopropylalcohol mixed solvent over 30 minutes, and a powder was precipitated. The obtained powder was subjected to dispersion washing with a heptane/isopropylalcohol mixed solvent a plurality of times.

The solid content was collected and dried under reduced pressure, so as to obtain polymeric compound precursor (Pre-2a-11) (0.11 mol (21.63 g)).

[Chemical Formula 98]

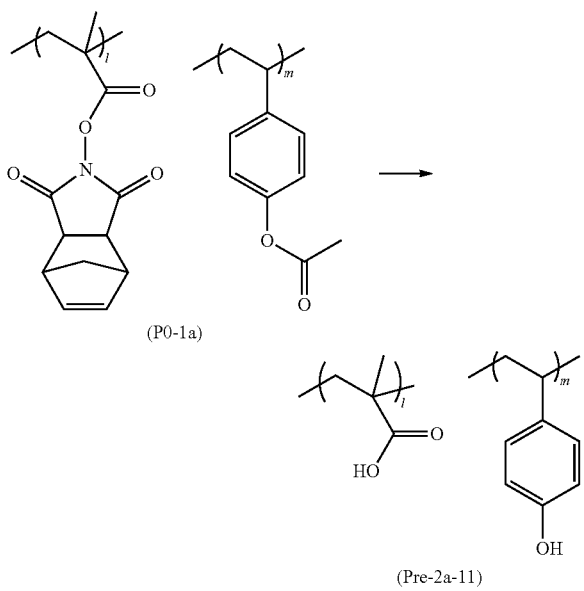

In a 500 mL three-necked flask, polymeric compound precursor (Pre-2a-11) was dissolved in dimethylformamide (DMF)/tert-butylalcohol mixed solvent, followed by adding concentrated sulfuric acid and reflux for 12 hours.

After the reaction, the resultant was cooled to room temperature, and water was added to precipitate a solid, followed by dispersion washing with water 3 times to neutralize the pH.

The solid content was collected and dried under reduced pressure, so as to obtain polymeric compound (p1-2a) (0.02 mol (2.62 g)).

With respect to the polymeric compound (p1-2a), the weight average molecular weight (Mw) was determined by the polystyrene equivalent value as measured by gel permeation chromatography (GPC). As a result, it was found that the weight average molecular weight was 9,000

Further, as a result of an analysis by carbon 13 nuclear magnetic resonance spectroscopy (150 MHz_$^{13}$C-NMR) and proton 1 nuclear magnetic resonance spectroscopy (600 MHz_$^1$H-NMR), it was found that the composition of the copolymer (ratio (molar ratio) of the respective structural units within the structural formula) was l/m=50/50.

[Chemical Formula 99]

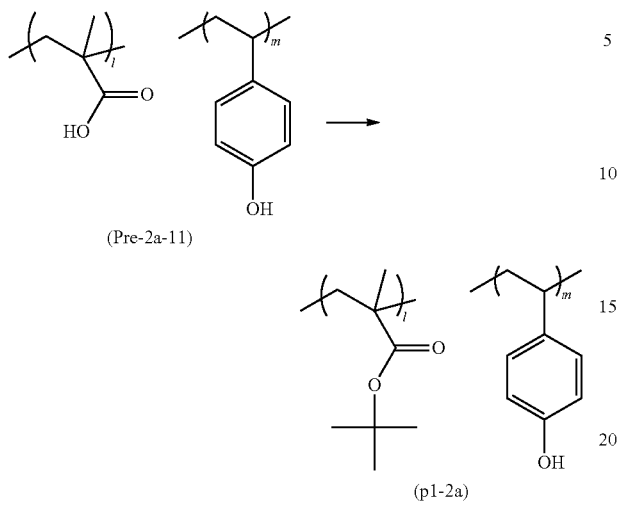

(Pre-2a-11)

(p1-2a)

Example 4A: Production of Polymeric Compound (3a)

Polymeric compound precursor (Pre-2a-11) was obtained in the same manner as in Example 3A.

In a 500 mL three-necked flask, polymeric compound precursor (Pre-2a-11) was dissolved in DBU (registered trademark) (0.08 mol) and DMF (100 ml), followed by adding compound 1 (0.15 mol) and reflux for 4 hours. The resultant was cooled, and water was added to obtain a solid content, followed by dispersion washing with water twice.

The solid content was collected and dried under reduced pressure, so as to obtain polymeric compound (p2-1a) (0.02 mol (3.70 g)).

With respect to the polymeric compound (p2-1a), the weight average molecular weight (Mw) was determined by the polystyrene equivalent value as measured by gel permeation chromatography (GPC). As a result, it was found that the weight average molecular weight was 12,000.

Further, as a result of an analysis by carbon 13 nuclear magnetic resonance spectroscopy (150 MHz_$^{13}$C-NMR) and proton 1 nuclear magnetic resonance spectroscopy (600 MHz_$^{1}$H-NMR), it was found that the composition of the copolymer (ratio (molar ratio) of the respective structural units within the structural formula) was l/m=50/50.

[Chemical Formula 100]

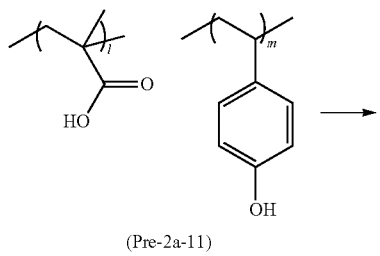

(Pre-2a-11)

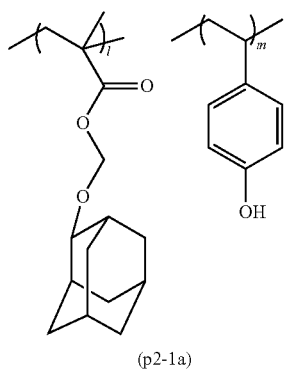

(p2-1a)

Production Method of Alternating Copolymer 1

In a 50 mL reaction vessel, 6.4 mg (0.0080 mol) of a RuCp* catalyst and 0.615 mL (4.0 mmol) of 3,5-dimethyl-p-acetoxystyrene (PACS-1) were dissolved in 1.0 mL of cyclohexanone. Further, to the 50 mL reaction vessel, 0.02 mL (0.080 mmol) of tributylamine, 0.988 g (4.0 mmol) of monomer (M0-1-1) and 0.014 mL (0.080 mmol) of ethyl 2-chloro-2-phenylacetate were added, and a polymerization reaction was conducted at 80° C. for 24 hours. After the polymerization reaction, the reaction liquid was rapidly cooled to −78° C. in an ice bath of methanol-dry ice, so as to obtain alternating copolymer (p0-1) (0.564 g).

With respect to the obtained alternating copolymer (p0-1), the weight average molecular weight (Mw) and the polydispersity (Mw/Mn) were determined by the polystyrene equivalent value as measured by gel permeation chromatography (GPC). As a result, it was found that the weight average molecular weight was 13,700, and the polydispersity was 1.25.

Further, as a result of an analysis by carbon 13 nuclear magnetic resonance spectroscopy (150 MHz_$^{13}$C-NMR) and proton 1 nuclear magnetic resonance spectroscopy (600 MHz_$^{1}$H-NMR), it was found that the composition of the copolymer (ratio (molar ratio) of the respective structural units within the structural formula) was l/m=50/50.

[Chemical Formula 101]

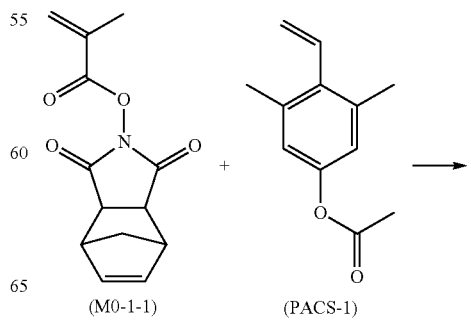

(M0-1-1)  (PACS-1)

-continued

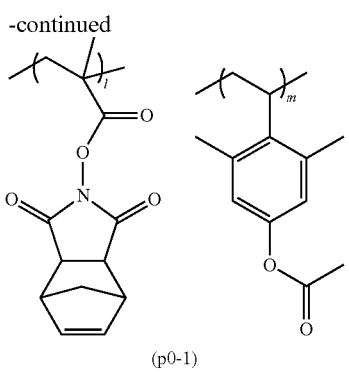

(p0-1)

With respect to the alternating copolymer (p0-1), alternating copolymerizability was evaluated using MALDI-TOF-MS. As a result, the peaks of each structural unit were alternately observed, and it was confirmed that variation in each structural unit in the alternating copolymer was small.

Production Example of Polymeric Compound 1

Alternating copolymer (p0-1) (0.15 mol (30.71 g)) and hydrazine monohydrate (0.19 mol) were dissolved in THF (200 mL), followed by stirring at 65° C. for 4 hours.

After cooling the reaction liquid to room temperature, the reaction liquid was further cooled to 0° C. Then, hydrochloric acid (100 mL) was dropwise added to the resultant, and the obtained powder was collected. The powder was dried under reduced pressure, so as to obtain first polymeric compound precursor (Pre-1a-1) (0.13 mol (16.14 g)).

[Chemical Formula 102]

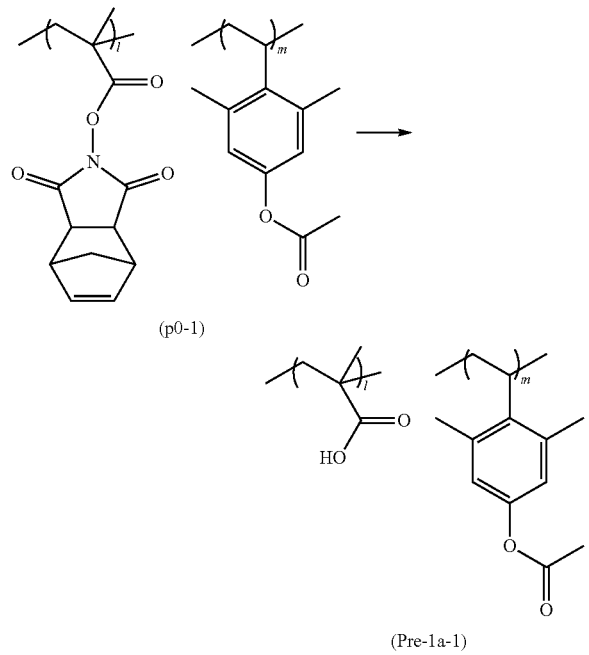

In a 500 mL three-necked flask, first polymeric compound precursor (Pre-1a-1) (0.13 mol (16.14 g)) was dissolved in a triple amount of dichloromethane, followed by purging the three-necked flask with nitrogen and cooling to 5° C. To the resultant was dropwise added a dichloromethane solution of 4-dimethylaminopyridine (DMAP) (0.03 mol) over 5 minutes while maintaining the temperature at lower than 10° C. Then, tert-butylalcohol (0.45 mol) was dropwise added to the resultant over 15 minutes, followed by maturing for 10 minutes.

Then, a dichloromethane solution of 1-(3-dimethylaminopropyl)-3-ethylcarbodiimide hydrochloride (EDC/HCl) (0.38 mol) was dropwise added to the resultant over 90 minutes while maintaining the temperature at 10° C. or lower, followed by stirring at 10° C. or lower for 18 hours.

Thereafter, the resultant was washed with a 1% hydrochloric acid, and the organic phase was collected. Then, water washing was conducted 3 times.

Thereafter, the organic phase was concentrated, and tert-butyl methyl ether (TBME) was dropwise added to the concentrated liquid over 1 hour.

The solid content was collected and dried under reduced pressure, so as to obtain second polymeric compound precursor (Pre-1b-11) (0.10 mol (16.52 g)).

[Chemical Formula 103]

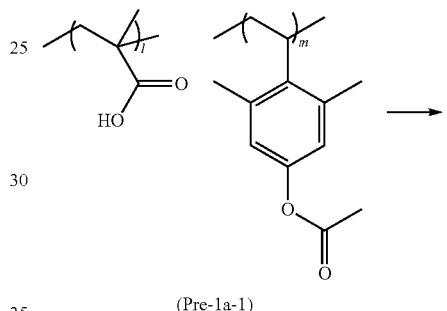

(Pre-1a-1)

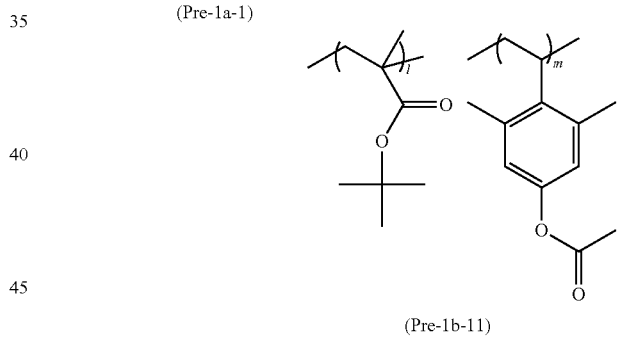

(Pre-1b-11)

Second polymeric compound precursor (Pre-1b-11) (0.1 mol (16.52 g)) was dissolved in methyl ethyl ketone (MEK), and using an equimolar amount of a 1% aqueous solution of $K_2CO_3$, stirring was conducted at room temperature for 1 hour.

The resultant was dropwise added to a heptane/isopropylalcohol mixed solvent over 30 minutes, and a powder was precipitated.

The obtained powder was subjected to dispersion washing with a heptane/isopropylalcohol mixed solvent a plurality of times.

The solid content was collected and dried under reduced pressure, so as to obtain polymeric compound (p1-1-1) (0.06 mol (7.8 g)).

With respect to the polymeric compound (p1-1-1), the weight average molecular weight (Mw) was determined by the polystyrene equivalent value as measured by gel permeation chromatography (GPC). As a result, it was found that the weight average molecular weight was 9,000.

Further, as a result of an analysis by carbon 13 nuclear magnetic resonance spectroscopy (150 MHz_$^{13}$C-NMR) and proton 1 nuclear magnetic resonance spectroscopy (600 MHz_$^x$H-NMR), it was found that the composition of the copolymer (ratio (molar ratio) of the respective structural units within the structural formula) was l/m=50/50.

[Chemical Formula 104]

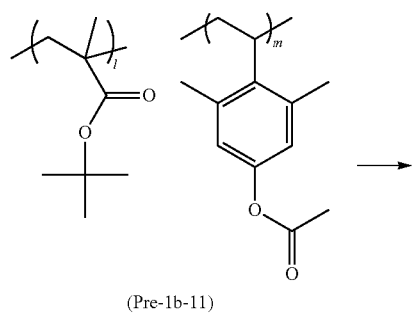

(Pre-1b-11)

(p1-1-1)

Production Example of Polymeric Compound 2

Alternating copolymer (p0-1) (0.15 mol (29.50 g)) was dissolved in methyl ethyl ketone (MEK) (100 mL), and using methanesulfonic acid (50 mL), stirring was conducted at room temperature for 1 hour.

The resultant was dropwise added to a heptane/isopropylalcohol mixed solvent over 30 minutes, and a powder was precipitated. The obtained powder was subjected to dispersion washing with a heptane/isopropylalcohol mixed solvent a plurality of times.

The solid content was collected and dried under reduced pressure, so as to obtain polymeric compound precursor (Pre-2-a1) (0.11 mol (21.63 g)).

[Chemical Formula 105]

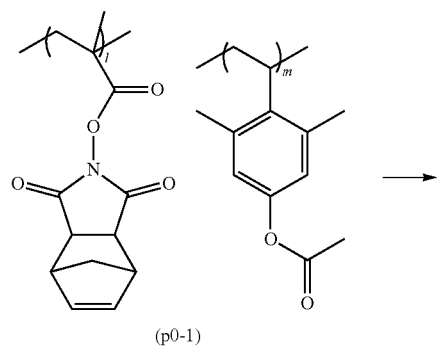

(p0-1)

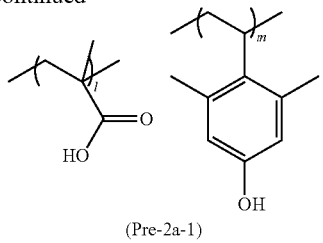

(Pre-2a-1)

In a 500 mL three-necked flask, polymeric compound precursor (Pre-2a-1) was dissolved in dimethylformamide (DMF)/tert-butylalcohol mixed solvent, followed by adding concentrated sulfuric acid and reflux for 12 hours.

After the reaction, the resultant was cooled to room temperature, and water was added to precipitate a solid, followed by dispersion washing with water 3 times to neutralize the pH.

The solid content was collected and dried under reduced pressure, so as to obtain polymeric compound (p1-2-1) (0.02 mol (2.62 g)).

With respect to the polymeric compound (p1-2-1), the weight average molecular weight (Mw) was determined by the polystyrene equivalent value as measured by gel permeation chromatography (GPC). As a result, it was found that the weight average molecular weight was 9,000.

Further, as a result of an analysis by carbon 13 nuclear magnetic resonance spectroscopy (150 MHz_$^{13}$C-NMR) and proton 1 nuclear magnetic resonance spectroscopy (600 MHz_$^1$H-NMR), it was found that the composition of the copolymer (ratio (molar ratio) of the respective structural units within the structural formula) was l/m=50/50.

[Chemical Formula 106]

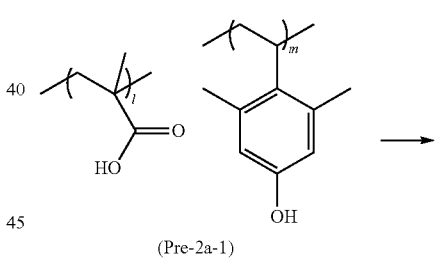

(Pre-2a-1)

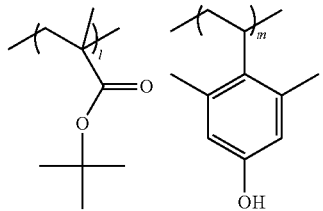

(p1-2-1)

In the same manner as in Production Example 1 of polymeric compound, polymeric compounds (p1-1-2) to (p1-1-8) were produced.

With respect to each polymeric compound, the compositional ratio of the polymers (the molar ratio of the respective structural units in the polymeric compound) as determined by $^{13}$C-NMR, the weight average molecular weight (Mw) and the polydispersity (Mw/Mn) determined by the polystyrene equivalent value as measured by GPC are also shown in Table 1.

[Chemical Formula 107]

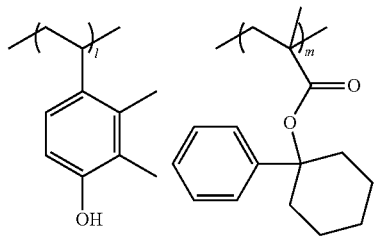
(p1-1-2)

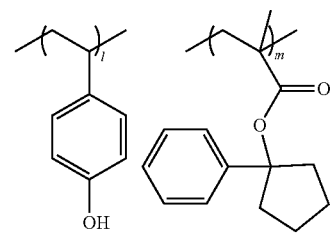
(p1-1-3)

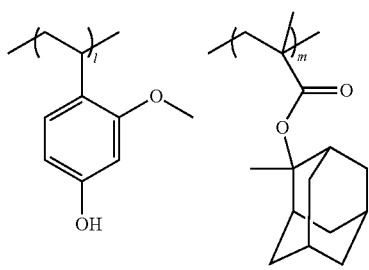
(p1-1-4)

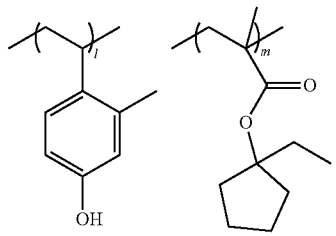
(p1-1-5)

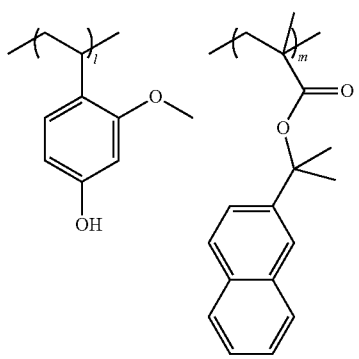
(p1-1-6)

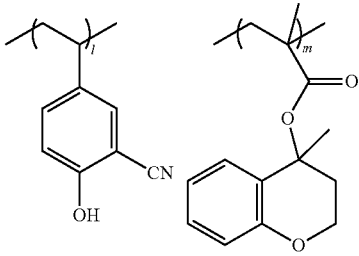
(p1-1-7)

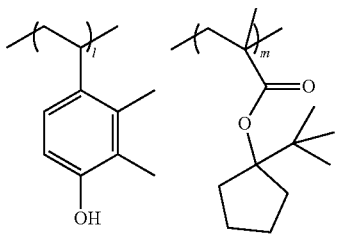
(P1-1-8)

TABLE 1

| Polymeric compound | Copolymer compositional ratio of polymeric compound (molar ratio) | Weight average molecular weight (Mw) | Polydispersity (Mw/Mn) |
|---|---|---|---|
| (p1-1-1) | l/m = 50/50 | 9000 | 1.28 |
| (p1-1-2) | l/m = 50/50 | 13400 | 1.27 |
| (p1-1-3) | l/m = 50/50 | 13400 | 1.32 |
| (p1-1-4) | l/m = 50/50 | 12000 | 1.32 |
| (p1-1-5) | l/m = 50/50 | 11000 | 1.28 |
| (p1-1-6) | l/m = 50/50 | 13000 | 1.33 |
| (p1-1-7) | l/m = 50/50 | 12800 | 1.29 |
| (p1-1-8) | l/m = 50/50 | 10000 | 1.26 |

Production Example of Polymeric Compound 2

In the same manner as in the production example of alternating copolymer, alternating copolymer (p0-1) was obtained. Alternating copolymer (p0-1) (0.15 mol (29.50 g)) was dissolved in methyl ethyl ketone (MEK) (100 mL), and using methanesulfonic acid (50 mL), stirring was conducted at room temperature for 1 hour.

The resultant was drop wise added to a heptane/isopropylalcohol mixed solvent over 30 minutes, and a powder was precipitated. The obtained powder was subjected to dispersion washing with a heptane/isopropylalcohol mixed solvent a plurality of times.

The solid content was collected and dried under reduced pressure, so as to obtain polymeric compound precursor (Pre-2a-1) (0.11 mol (21.63 g)).

[Chemical Formula 108]

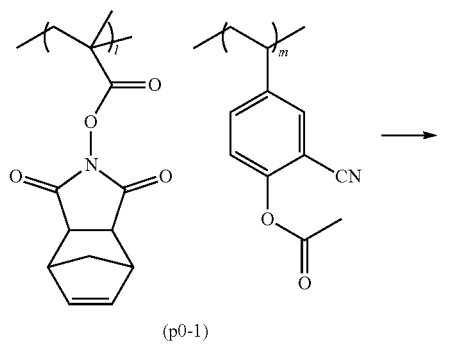

(p0-1)

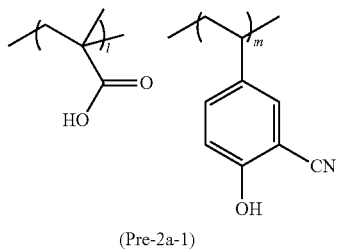

(Pre-2a-1)

In a 500 mL three-necked flask, polymeric compound precursor (Pre-2a-1) was dissolved in DBU (registered trademark) (0.08 mol) and DMF (100 ml), followed by adding compound 1 (0.15 mol) and reflux for 4 hours. The resultant was cooled, and water was added to obtain a solid content, followed by dispersion washing with water twice.

The solid content was collected and dried under reduced pressure, so as to obtain polymeric compound (p2-1-1) (0.02 mol (3.70 g)).

With respect to the polymeric compound (p2-1-1), the weight average molecular weight (Mw) and the polydispersity (Mw/Mn) were determined by the polystyrene equivalent value as measured by gel permeation chromatography (GPC). As a result, it was found that the weight average molecular weight was 12,300, and the polydispersity was 1.32.

Further, as a result of an analysis by carbon 13 nuclear magnetic resonance spectroscopy (150 MHz_$^{13}$C-NMR) and proton 1 nuclear magnetic resonance spectroscopy (600 MHz_$^{1}$H-NMR), it was found that the composition of the copolymer (ratio (molar ratio) of the respective structural units within the structural formula) was l/m=50/50.

[Chemical Formula 109]

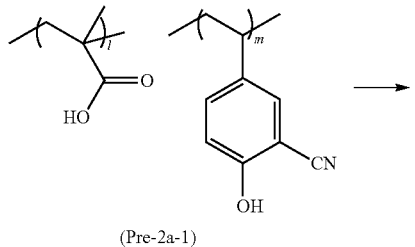

(Pre-2a-1)

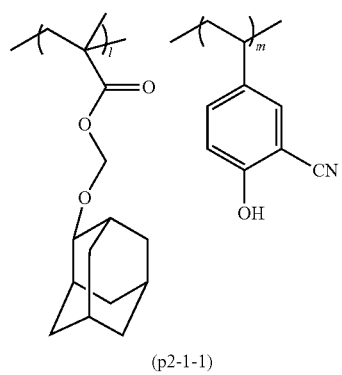

(p2-1-1)

Production Example of Polymeric Compound 3

10.0 g of monomer (a10-1pre), 9.5 g of monomer (a1-1-1), 1.4 g of dimethyl-2,2'-azobisisoutyrate (V-601) were dissolved in 50.0 g of methyl ethyl ketone (MEK), followed by heating to 85° C. in a nitrogen atmosphere, and stirring for 5 hours. Then, to the reaction liquid was added 9.4 g of acetic acid and 160 g of methanol, followed by a deprotection reaction at 30° C. for 8 hours. After the reaction finished, the obtained reaction liquid was washed by precipitating in 2,500 g of heptane. The obtained white solid was subjected to filtration, followed by drying under reduced pressure for one night, so as to obtain 10.1 g of a polymeric compound (A-10) as an objective compound.

[Chemical Formula 110]

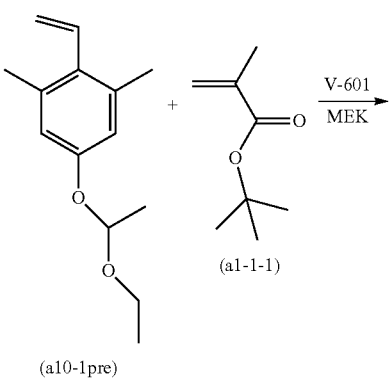

(a10-1pre)   (a1-1-1)

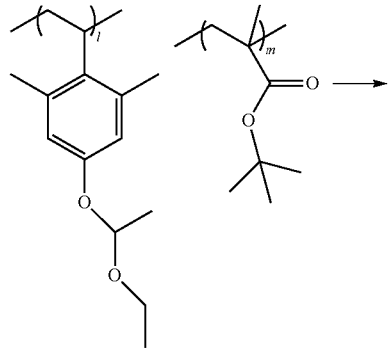

-continued

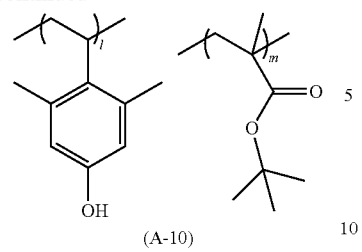

(A-10)

In the same manner as the production of polymeric compound (A-10), polymeric compounds (A-11) to (A-19) were produced.

With respect to each polymeric compound, the compositional ratio of the polymers (the molar ratio of the respective structural units in the polymeric compound) as determined by $^{13}$C-NMR, the weight average molecular weight (Mw) and the polydispersity (Mw/Mn) determined by the polystyrene equivalent value as measured by GPC are also shown in Table 2.

[Chemical Formula 111]

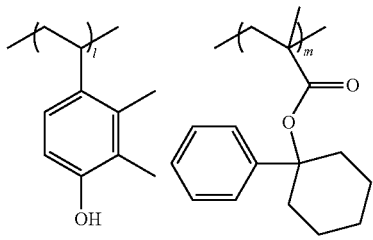

(A-11)

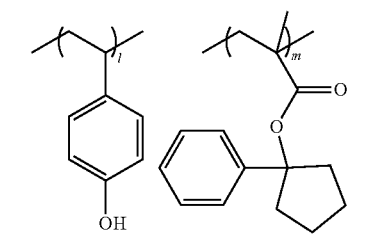

(A-12)

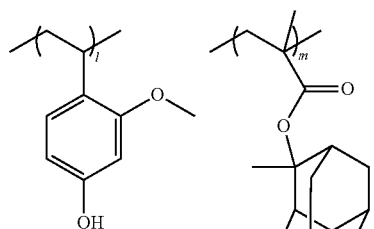

(A-13)

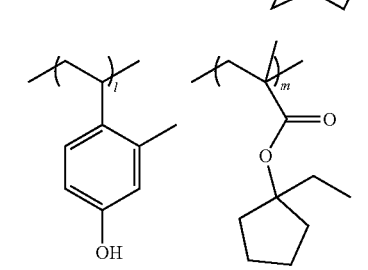

(A-14)

-continued

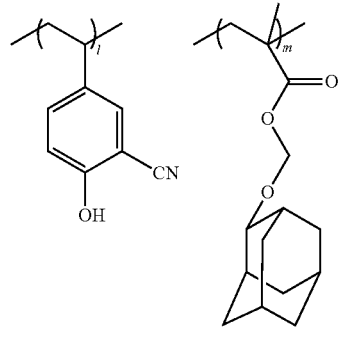

(A-15)

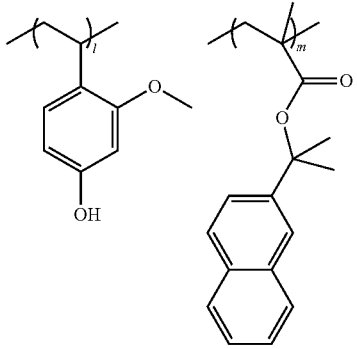

(A-16)

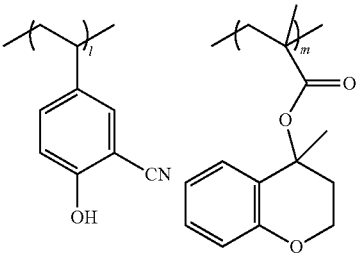

(A-17)

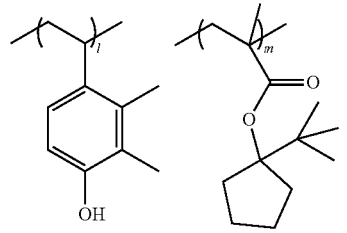

(A-18)

TABLE 2

| Polymeric compound | Copolymer compositional ratio of polymeric compound (molar ratio) | Weight average molecular weight (Mw) | Polydispersity (Mw/Mn) |
|---|---|---|---|
| (A-10) | l/m = 50/50 | 9200 | 1.29 |
| (A-11) | l/m = 50/50 | 13000 | 1.30 |
| (A-12) | l/m = 50/50 | 13100 | 1.33 |
| (A-13) | l/m = 50/50 | 12400 | 1.34 |
| (A-14) | l/m = 50/50 | 11000 | 1.30 |
| (A-15) | l/m = 50/50 | 12000 | 1.35 |
| (A-16) | l/m = 50/50 | 12600 | 1.36 |
| (A-17) | l/m = 50/50 | 13300 | 1.34 |
| (A-18) | l/m = 50/50 | 10400 | 1.29 |

Production of Resist Composition

Examples 1 to 9, Comparative Examples 1 to 9

The components shown in Tables 3 and 4 were mixed together and dissolved to obtain each resist composition.

TABLE 3

|  | Component (A) | Component (B) | Component (D) | Component (S) |
|---|---|---|---|---|
| Example 1 | (A)-1 [100] | (B)-1 [21.3] | (D)-1 [3.8] | (S)-1 [6600] |
| Example 2 | (A)-2 [100] | (B)-1 [21.3] | (D)-1 [3.8] | (S)-1 [6600] |
| Example 3 | (A)-3 [100] | (B)-1 [21.3] | (D)-1 [3.8] | (S)-1 [6600] |
| Example 4 | (A)-4 [100] | (B)-1 [21.3] | (D)-1 [3.8] | (S)-1 [6600] |
| Example 5 | (A)-5 [100] | (B)-1 [21.3] | (D)-1 [3.8] | (S)-1 [6600] |
| Example 6 | (A)-6 [100] | (B)-1 [21.3] | (D)-1 [3.8] | (S)-1 [6600] |
| Example 7 | (A)-7 [100] | (B)-1 [21.3] | (D)-1 [3.8] | (S)-1 [6600] |
| Example 8 | (A)-8 [100] | (B)-1 [21.3] | (D)-1 [3.8] | (S)-1 [6600] |
| Example 9 | (A)-9 [100] | (B)-1 [21.3] | (D)-1 [3.8] | (S)-1 [6600] |

TABLE 4

|  | Component (A) | Component (B) | Component (D) | Component (S) |
|---|---|---|---|---|
| Comparative Example 1 | (A)-10 [100] | (B)-1 [21.3] | (D)-1 [3.8] | (S)-1 [6600] |
| Comparative Example 2 | (A)-11 [100] | (B)-1 [21.3] | (D)-1 [3.8] | (S)-1 [6600] |
| Comparative Example 3 | (A)-12 [100] | (B)-1 [21.3] | (D)-1 [3.8] | (S)-1 [6600] |
| Comparative Example 4 | (A)-13 [100] | (B)-1 [21.3] | (D)-1 [3.8] | (S)-1 [6600] |
| Comparative Example 5 | (A)-14 [100] | (B)-1 [21.3] | (D)-1 [3.8] | (S)-1 [6600] |
| Comparative Example 6 | (A)-15 [100] | (B)-1 [21.3] | (D)-1 [3.8] | (S)-1 [6600] |
| Comparative Example 7 | (A)-16 [100] | (B)-1 [21.3] | (D)-1 [3.8] | (S)-1 [6600] |
| Comparative Example 8 | (A)-17 [100] | (B)-1 [21.3] | (D)-1 [3.8] | (S)-1 [6600] |
| Comparative Example 9 | (A)-18 [100] | (B)-1 [21.3] | (D)-1 [3.8] | (S)-1 [6600] |

In Tables 3 and 4, the reference characters indicate the following. The values in brackets [ ] indicate the amount (in terms of parts by weight) of the component added.

(A)-1: the aforementioned polymeric compound (p1-1-1)
(A)-2: the aforementioned polymeric compound (p1-1-2)
(A)-3: the aforementioned polymeric compound (p1-1-3)
(A)-4: the aforementioned polymeric compound (p1-1-4)
(A)-5: the aforementioned polymeric compound (p1-1-5)
(A)-6: the aforementioned polymeric compound (p2-1-1)
(A)-7: the aforementioned polymeric compound (p1-1-6)
(A)-8: the aforementioned polymeric compound (p1-1-7)
(A)-9: the aforementioned polymeric compound (p1-1-8)
(A)-10 to (A)-18: the aforementioned polymeric compounds (A-10) to (A-18)
(B)-1: an acid generator represented by chemical formula (B-1) shown below.

[Chemical Formula 112]

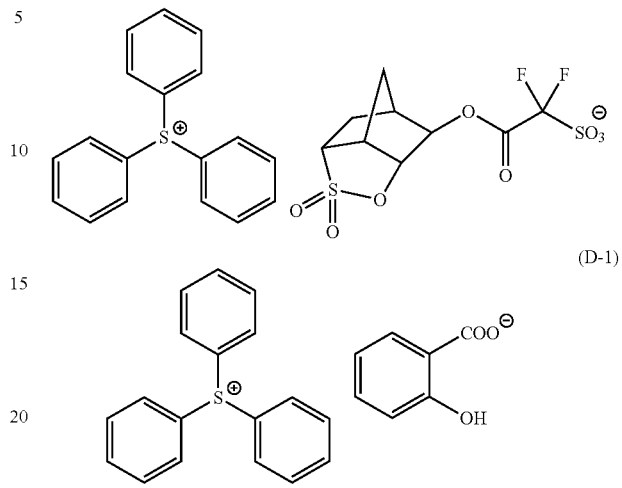

(S)-1: a mixed solvent of propylene glycol monomethyl ether acetate/propylene glycol monomethyl ether=80/20 (weight ratio)

<Formation of Resist Pattern>

Each of the resist compositions of examples and comparative examples was applied to an 8-inch silicon substrate which had been treated with hexamethyldisilazane (HMDS) using a spinner, and was then prebaked (PAB) on a hot plate at 110° C. for 60 seconds and dried, thereby forming a resist film having a film thickness of 50 nm.

Then, a drawing (exposure) was carried out on the resist film using an electron beam lithography system JEOL-JBX-9300FS (manufactured by JEOL Ltd.) with acceleration voltage of 100 kV and a target size of a 1:1 line and space pattern (hereinafter referred to as an "LS pattern") having a line width of 50 nm. Then, a post exposure bake (PEB) treatment was conducted at 90° C. for 60 seconds.

Thereafter, alkali developing was conducted for 60 seconds at 23° C. in a 2.38% by weight aqueous solution of tetramethylammonium hydroxide (TMAH) (product name: NMD-3; manufactured by Tokyo Ohka Kogyo Co., Ltd.). Then, water rinsing was conducted for 15 seconds using pure water. As a result, a 1:1 LS pattern having a line width of 50 nm was formed.

[Evaluation of Optimum Exposure Dose (Eop)]

The optimum exposure dose Eop ($\mu C/cm^2$) with which the LS pattern having the target size was formed in the above "Formation of resist pattern" was determined. The results are indicated under "Eop ($\mu C/cm^2$)" in Tables 5 and 6.

[Evaluation of Line Width Roughness (LWR)]

With respect to the LS pattern formed in the above "formation of resist pattern", 3σ was determined as a yardstick for indicating LWR. The results are indicated under "LWR (nm)" in Tables 5 and 6.

"3σ" indicates a value of 3 times the standard deviation (σ) (i.e., 3σ) (unit: nm) determined by measuring the line positions at 400 points in the lengthwise direction of the line using a scanning electron microscope (product name: S-9380, manufactured by Hitachi High-Technologies Corporation; acceleration voltage: 800V).

The smaller this 3σ value is, the lower the level of roughness on the side walls of the line, indicating that an LS pattern with a uniform width was obtained.

TABLE 5

| | Eop [μC/cm²] | LWR [nm] |
|---|---|---|
| Example 1 | 120 | 6.2 |
| Example 2 | 130 | 5.3 |
| Example 3 | 125 | 5.1 |
| Example 4 | 135 | 6.2 |
| Example 5 | 125 | 5.6 |
| Example 6 | 130 | 7.2 |
| Example 7 | 135 | 5.9 |
| Example 8 | 130 | 5.8 |
| Example 9 | 120 | 5.6 |

TABLE 6

| | Eop [μC/cm²] | LWR [nm] |
|---|---|---|
| Comparative Example 1 | 120 | 6.8 |
| Comparative Example 2 | 130 | 5.9 |
| Comparative Example 3 | 125 | 5.9 |
| Comparative Example 4 | 135 | 6.8 |
| Comparative Example 5 | 125 | 6.3 |
| Comparative Example 6 | 130 | 7.6 |
| Comparative Example 7 | 135 | 6.4 |
| Comparative Example 8 | 130 | 6.4 |
| Comparative Example 9 | 120 | 6.2 |

As seen from the results shown in Tables 5 and 6, by the method of forming a resist pattern according to the examples, roughness could be satisfactorily reduced, as compared to the method of forming a resist pattern according to the comparative examples.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An alternating copolymer comprising:
a structural unit (a0-1) represented by general formula (a0-1) shown below, and
a structural unit (a0-2) represented by general formula (a0-2) shown below:

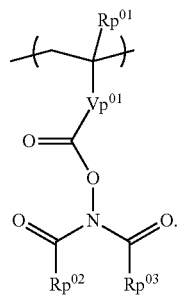

(a0-1)

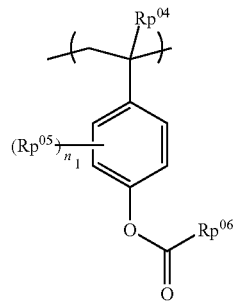

(a0-2)

wherein $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and $n_1$ represents an integer of 0 to 4.

2. A method of producing an alternating copolymer, comprising:
copolymerizing a compound represented by general formula (m0-1) shown below with a compound represented by general formula (m0-2) shown below by living radical polymerization to obtain an alternating copolymer represented by general formula (p0) shown below:

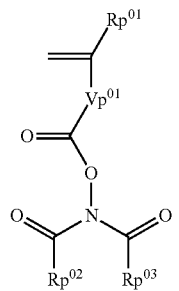

(m0-1)

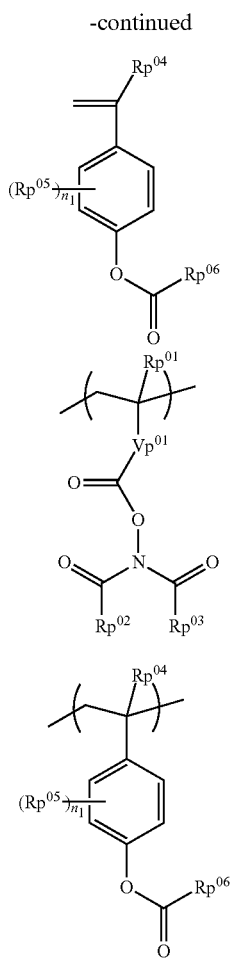

wherein $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and $n_1$ represents an integer of 0 to 4.

3. A method of producing a polymeric compound, comprising:
copolymerizing a compound represented by general formula (m0-1) shown below with a compound represented by general formula (m0-2) shown below by living radical polymerization to obtain an alternating copolymer represented by general formula (p0) shown below;
subjecting the alternating copolymer to hydrolysis to obtain a first polymeric compound precursor represented by general formula (Pre-1a) shown below;
reacting the first polymeric compound precursor with a compound represented by general formula (Add-1) shown below to obtain a second polymeric compound precursor represented by general formula (Pre-1b-1) shown below; and
subjecting the second polymeric compound precursor to hydrolysis to obtain a polymeric compound represented by general formula (p1) shown below:

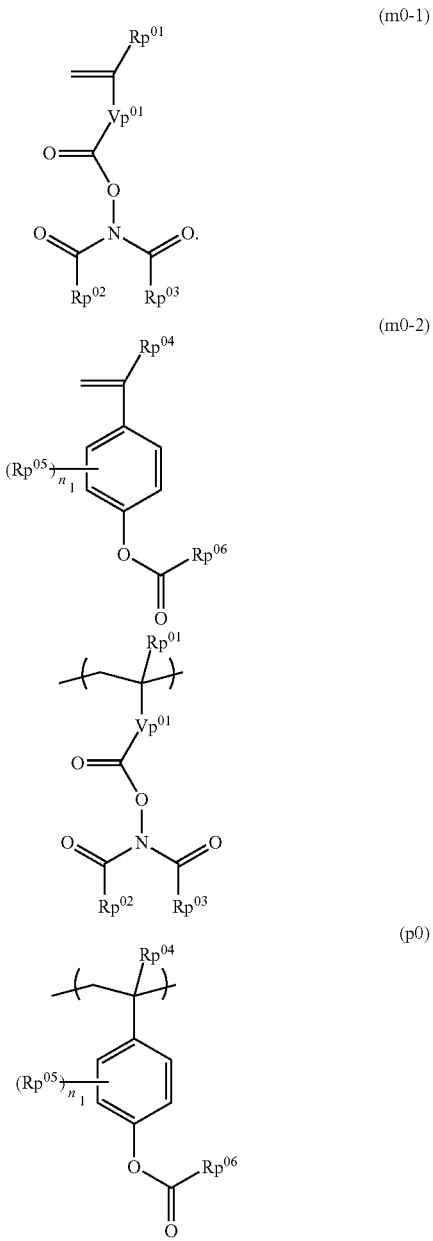

wherein $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and $n_1$ represents an integer of 0 to 4;

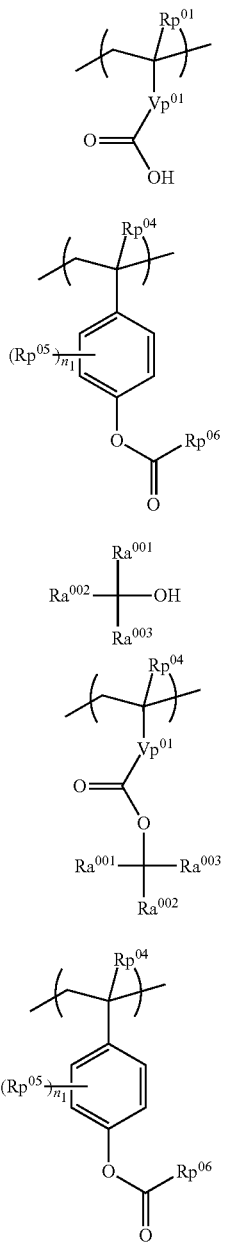

(Pre-1a)

(Add-1)

(Pre-1b-1)

wherein $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; $n_1$ represents an integer of 0 to 4; $Ra^{001}$, $Ra^{002}$ and $Ra^{003}$ each independently represents a hydrocarbon group which may have a substituent; $Ra^{002}$ and $Ra^{003}$ may be mutually bonded to form a ring;

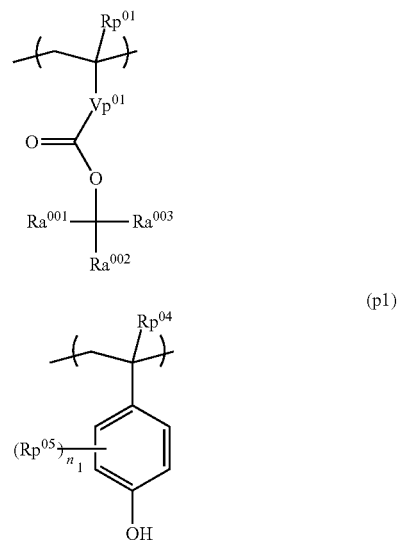

(p1)

wherein $Rp^{01}$ and $Rp^{04}$ each independently represents a hydrogen atom, an alkyl group of 1 to 5 carbon atoms or a halogenated alkyl group of 1 to 5 carbon atoms; $Vp^{01}$ represents a single bond or a divalent linking group; $Ra^{001}$, $Ra^{002}$ and $Ra^{003}$ each independently represents a hydrocarbon group which may have a substituent; $Ra^{002}$ and $Ra^{003}$ may be mutually bonded to form a ring; $Rp^{05}$ represents an alkyl group, an alkoxy group, a halogen atom, a halogenated alkyl group, a cyano group or a hydroxy group; and $n_1$ represents an integer of 0 to 4.

4. A method of forming a resist pattern, comprising:

obtaining a polymeric compound (A01) represented by general formula (p1) by the method of producing a polymeric compound according to claim 3;

mixing the polymeric compound (A01) with an organic solvent to prepare a resist composition;

forming a resist film on a substrate using the resist composition;

exposing the resist film; and developing the exposed resist film to form a resist pattern.

5. A method of producing a polymeric compound, comprising:

copolymerizing a compound represented by general formula (m0-1) shown below with a compound represented by general formula (m0-2) shown below by living radical polymerization to obtain an alternating copolymer represented by general formula (p0) shown below;

subjecting the alternating copolymer to hydrolysis to obtain a polymeric compound precursor represented by general formula (Pre-2a) shown below; and reacting the polymeric compound precursor with a compound represented by general formula (Add-1) shown below to obtain a polymeric compound represented by general formula (p 1) shown below:

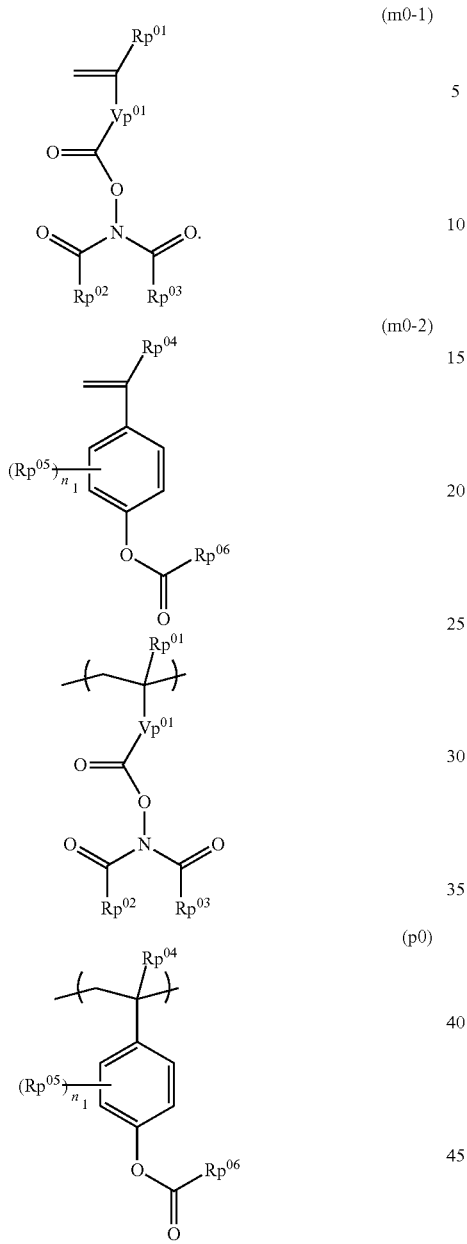

(m0-1)

(m0-2)

(p0)

wherein $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and $n_1$ represents an integer of 0 to 4;

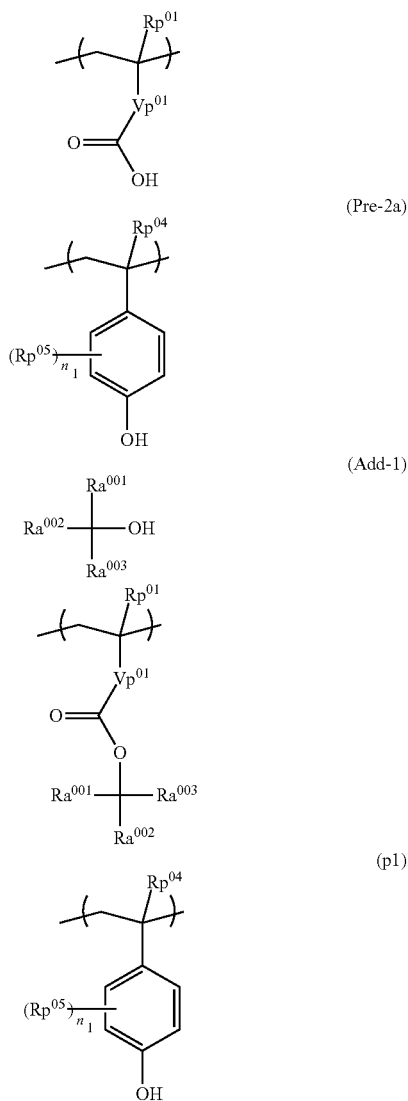

(Pre-2a)

(Add-1)

(p1)

wherein $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $n_1$ represents an integer of 0 to 4; $Ra^{001}$, $Ra^{002}$ and $Ra^{003}$ each independently represents a hydrocarbon group which may have a substituent; $Ra^{002}$ and $Ra^{003}$ may be mutually bonded to form a ring.

6. A method of forming a resist pattern, comprising:
obtaining a polymeric compound (A01) represented by general formula (p1) by the method of producing a polymeric compound according to claim 5;
mixing the polymeric compound (A01) with an organic solvent to prepare a resist composition;
forming a resist film on a substrate using the resist composition;
exposing the resist film; and
developing the exposed resist film to form a resist pattern.

7. A method of producing a polymeric compound, comprising:

copolymerizing a compound represented by general formula (m0-1) shown below with a compound represented by general Formula (m0-2) shown below by living radical polymerization to obtain an alternating copolymer represented by general formula (p0) shown below;

subjecting the alternating copolymer to hydrolysis to obtain a first polymeric compound precursor represented by general formula (Pre-1a) shown below:

reacting the first polymeric compound with a compound represented by general formula (Add-2) shown below to obtain a second polymeric compound precursor represented by general formula (Pre-1b-2) shown below; and subjecting the second polymeric compound precursor to hydrolysis to obtain a polymeric compound represented by general formula (p2) shown below:

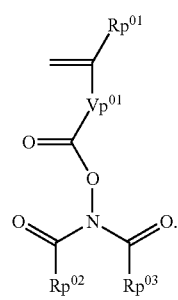
(m0-1)

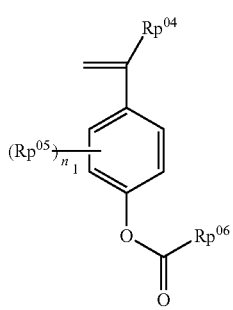
(m0-2)

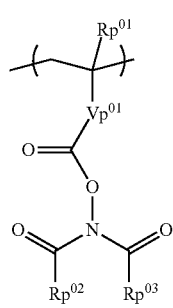

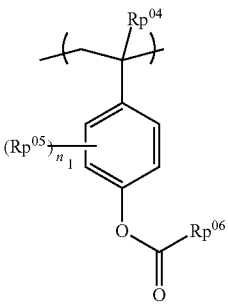
(p0)

wherein $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and $n_1$ represents an integer of 0 to 4;

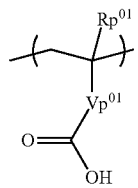

(Pre-1a)

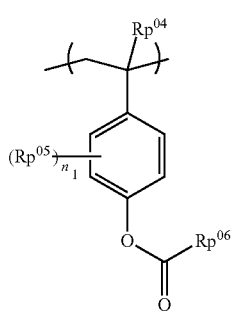

(Add-2)

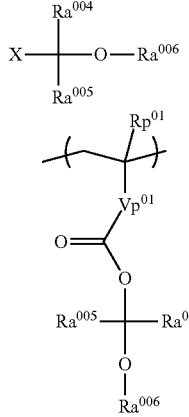

-continued

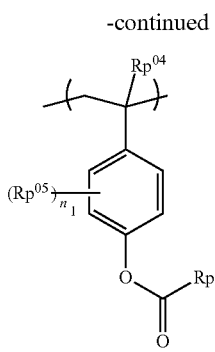
(Pre-1b-2)

wherein $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; $n_1$ represents an integer of 0 to 4; $Ra^{04}$ and $Ra^{05}$ each independently represents a hydrogen atom or an alkyl group; $Ra^{006}$ represents a hydrocarbon group, provided that $Ra^{006}$ may be bonded to $Ra^{004}$ or $Ra^{005}$ to form a ring; and X represents a halogen atom;

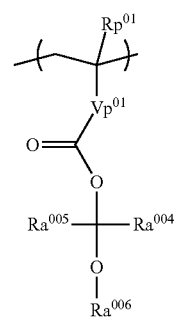

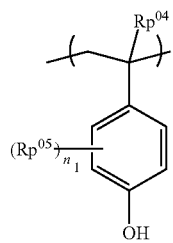
(p2)

wherein $Rp^{01}$ and $Rp^{04}$ each independently represents a hydrogen atom, an alkyl group of 1 to 5 carbon atoms or a halogenated alkyl group of 1 to 5 carbon atoms; $Vp^{01}$ represents a single bond or a divalent linking group; $Ra^{004}$ and $Ra^{005}$ each independently represents a hydrogen atom or an alkyl group; $Ram6$ represents a hydrocarbon group, provided that $Ra^{006}$ may be bonded to $Ra^{004}$ or $Ra^{005}$ to form a ring; $Rp^{05}$ represents an alkyl group, an alkoxy group, a halogen atom, a halogenated alkyl group, a cyano group or a hydroxy group; and $n_1$ represents an integer of 0 to 4.

8. A method of forming a resist pattern, comprising:
   obtaining a polymeric compound (A02) represented by general formula (p2) by the method of producing a polymeric compound according to claim 7;
   mixing the polymeric compound (A02) with an organic solvent to prepare a resist composition;
   forming a resist film on a substrate using the resist composition;
   exposing the resist film; and
   developing the exposed resist film to form a resist pattern.

9. A method of producing a polymeric compound, comprising:
   copolymerizing a compound represented by general formula (m0-1) shown below with a compound represented by general formula (m0-2) shown below by living radical polymerization to obtain an alternating copolymer represented by general formula (p0) shown below;
   subjecting the alternating copolymer to hydrolysis to obtain a polymeric compound precursor represented by general formula (Pre-2a) shown below; and
   reacting the polymeric compound precursor with a compound represented by general formula (Add-2) shown below to obtain a polymeric compound represented by general formula (p2) shown below:

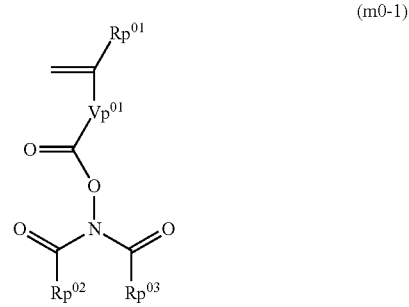
(m0-1)

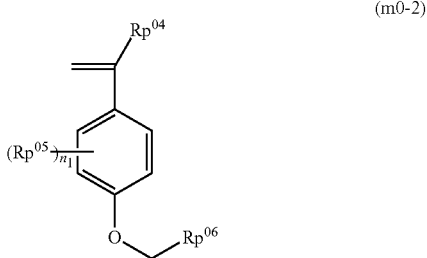
(m0-2)

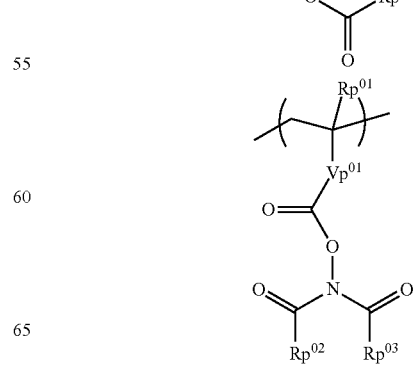

-continued

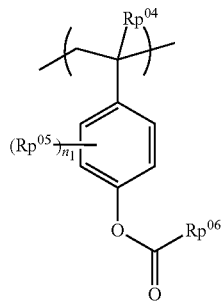

(p0)

wherein $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{02}$ and $Rp^{03}$ each independently represents a hydrocarbon group which may have a substituent; $Rp^{02}$ and $Rp^{03}$ may be mutually bonded to form a ring; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $Rp^{06}$ represents a linear or branched aliphatic hydrocarbon group; and $n_1$ represents an integer of 0 to 4;

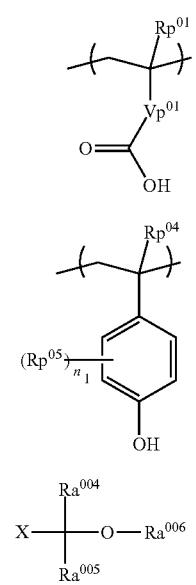

(Pre-2a)

(Add-2)

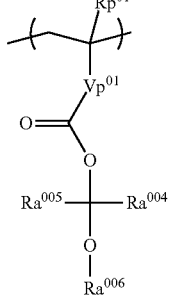

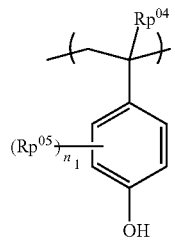

(p2)

wherein $Rp^{01}$ represents a hydrogen atom, an alkyl group of 1 to 5 carbon atoms or a halogenated alkyl group of 1 to 5 carbon atoms; $Vp^{01}$ represents a single bond or a divalent linking group; $Rp^{04}$ represents a hydrogen atom, an alkyl group having 1 to 5 carbon atoms or a halogenated alkyl group having 1 to 5 carbon atoms; $Rp^{05}$ represents an alkyl group, an alkoxy group, a halogen atom, a halogenated alkyl group, a cyano group or a hydroxy group; $n_1$ represents an integer of 0 to 4; $Ra^{004}$ and $Ra^{005}$ each independently represents a hydrogen atom or an alkyl group; $Ra^{006}$ represents a hydrocarbon group, provided that $Ra^{006}$ may be bonded to $Ra^{004}$ or $Ra^{005}$ to form a ring; and X represents a halogen atom.

10. A method of forming a resist pattern, comprising:

obtaining a polymeric compound (A02) represented by general formula (p2) by the method of producing a polymeric compound according to claim 9;

mixing the polymeric compound (A02) with an organic solvent to prepare a resist composition;

forming a resist film on a substrate using the resist composition;

exposing the resist film; and developing the exposed resist film to form a resist pattern.

* * * * *